United States Patent
Gomez et al.

(10) Patent No.: US 11,950,375 B2
(45) Date of Patent: Apr. 2, 2024

(54) PRINTING COMPONENTS TO SUBSTRATE POSTS

(71) Applicant: X Display Company Technology Limited, Dublin (IE)

(72) Inventors: David Gomez, Holly Springs, NC (US); Christopher Andrew Bower, Raleigh, NC (US); Raja Fazan Gul, Cork (IE); António José Marques Trindade, Cork (IE); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 98 days.

(21) Appl. No.: 17/245,986

(22) Filed: Apr. 30, 2021

(65) Prior Publication Data
US 2021/0259114 A1  Aug. 19, 2021

Related U.S. Application Data

(63) Continuation of application No. 16/207,665, filed on Dec. 3, 2018, now Pat. No. 11,528,808.

(51) Int. Cl.
*H05K 3/30* (2006.01)
*B41F 16/00* (2006.01)
(Continued)

(52) U.S. Cl.
CPC ........... *H05K 3/305* (2013.01); *B41F 16/006* (2013.01); *B65G 47/90* (2013.01); *H03H 3/02* (2013.01);
(Continued)

(58) Field of Classification Search
CPC ....... B41F 16/006; B65G 47/90; H01L 41/29; H01L 21/67144; H01L 2933/0066; H03H 3/02; H03H 3/08
See application file for complete search history.

(56) References Cited

U.S. PATENT DOCUMENTS

| 5,313,177 A | 5/1994 | Hickernell et al. |
| 5,328,534 A | 7/1994 | Calhoun et al. |

(Continued)

FOREIGN PATENT DOCUMENTS

| EP | 2352168 A1 * | 8/2011 | ....... H01L 23/49816 |
| GB | 2 496 183 A | 5/2013 | |

(Continued)

OTHER PUBLICATIONS

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

(Continued)

*Primary Examiner* — Jeffrey T Carley
(74) *Attorney, Agent, or Firm* — Choate, Hall & Stewart LLP; Michael D. Schmitt

(57) ABSTRACT

A method of printing comprises providing a component source wafer comprising components, a transfer device, and a patterned substrate. The patterned substrate comprises substrate posts that extend from a surface of the patterned substrate. Components are picked up from the component source wafer by adhering the components to the transfer device. One or more of the picked-up components are printed to the patterned substrate by disposing each of the one or more picked-up components onto one of the substrate posts, thereby providing one or more printed components in a printed structure.

16 Claims, 63 Drawing Sheets

(51) Int. Cl.
  *B65G 47/90* (2006.01)
  *H03H 3/02* (2006.01)
  *H03H 3/08* (2006.01)
  *H05K 3/40* (2006.01)
  *H10N 30/06* (2023.01)
  *H01L 21/67* (2006.01)
  *H10N 30/073* (2023.01)

(52) U.S. Cl.
  CPC .............. *H03H 3/08* (2013.01); *H05K 3/30* (2013.01); *H05K 3/301* (2013.01); *H05K 3/303* (2013.01); *H05K 3/40* (2013.01); *H05K 3/4007* (2013.01); *H05K 3/4092* (2013.01); *H10N 30/06* (2023.02); *H01L 21/67144* (2013.01); *H01L 2933/0066* (2013.01); *H10N 30/073* (2023.02)

(56) References Cited

U.S. PATENT DOCUMENTS

| | | | |
|---|---|---|---|
| 5,872,493 A | 2/1999 | Ella | |
| 6,078,229 A | 6/2000 | Funada et al. | |
| 6,142,358 A | 11/2000 | Cohn et al. | |
| 6,521,513 B1 | 2/2003 | Lebens et al. | |
| 6,566,981 B2 | 5/2003 | Urabe et al. | |
| 6,663,820 B2 | 12/2003 | Arias et al. | |
| 6,911,708 B2 | 6/2005 | Park | |
| 7,109,828 B2 | 9/2006 | Takayama et al. | |
| 7,195,733 B2 | 3/2007 | Rogers et al. | |
| 7,199,683 B2 | 4/2007 | Thalhammer et al. | |
| 7,307,369 B2 | 12/2007 | Yokota et al. | |
| 7,354,801 B2 | 4/2008 | Sugiyama et al. | |
| 7,368,034 B2 | 5/2008 | Ikeda et al. | |
| 7,423,501 B2 | 9/2008 | Kim et al. | |
| 7,463,117 B2 | 12/2008 | Ohara et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,623,007 B2 | 11/2009 | Nakatsuka et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 7,982,364 B2 | 7/2011 | Takayama et al. | |
| 8,039,847 B2 | 10/2011 | Nuzzo et al. | |
| 8,058,768 B2 | 11/2011 | Milsom et al. | |
| 8,198,148 B2 | 6/2012 | Koo et al. | |
| 8,198,621 B2 | 6/2012 | Rogers et al. | |
| 8,261,660 B2 | 9/2012 | Menard | |
| 8,394,706 B2 | 3/2013 | Nuzzo et al. | |
| 8,440,546 B2 | 5/2013 | Nuzzo et al. | |
| 8,470,701 B2 | 6/2013 | Rogers et al. | |
| 8,506,867 B2 | 8/2013 | Menard | |
| 8,558,243 B2 | 10/2013 | Bibl et al. | |
| 8,618,721 B2 | 12/2013 | Ichikawa et al. | |
| 8,664,699 B2 | 3/2014 | Nuzzo et al. | |
| 8,722,458 B2 | 5/2014 | Rogers et al. | |
| 8,754,396 B2 | 6/2014 | Rogers et al. | |
| 8,791,474 B1 * | 7/2014 | Bibl | G09G 3/2003 257/89 |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,895,406 B2 | 11/2014 | Rogers et al. | |
| 8,934,259 B2 | 1/2015 | Bower et al. | |
| 8,941,215 B2 | 1/2015 | Hu et al. | |
| 8,987,765 B2 | 3/2015 | Bibl et al. | |
| 9,049,797 B2 | 6/2015 | Menard et al. | |
| 9,105,714 B2 | 8/2015 | Hu et al. | |
| 9,111,464 B2 | 8/2015 | Bibl et al. | |
| 9,139,425 B2 | 9/2015 | Vestyck | |
| 9,153,171 B2 | 10/2015 | Sakariya et al. | |
| 9,154,103 B2 | 10/2015 | Ruby | |
| 9,161,448 B2 | 10/2015 | Menard et al. | |
| 9,165,989 B2 | 10/2015 | Bower et al. | |
| 9,166,114 B2 | 10/2015 | Hu et al. | |
| 9,178,123 B2 | 11/2015 | Sakariya et al. | |
| 9,217,541 B2 | 12/2015 | Bathurst et al. | |
| 9,240,397 B2 | 1/2016 | Bibl et al. | |
| 9,252,375 B2 | 2/2016 | Bibl et al. | |
| 9,355,854 B2 | 5/2016 | Meitl et al. | |
| 9,358,775 B2 | 6/2016 | Bower et al. | |
| 9,362,887 B2 | 6/2016 | Shealy | |
| 9,367,094 B2 | 6/2016 | Bibl et al. | |
| 9,368,683 B1 * | 6/2016 | Meitl | H01L 33/62 |
| 9,412,727 B2 | 8/2016 | Menard et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,583,533 B2 | 2/2017 | Hu et al. | |
| 9,601,356 B2 | 3/2017 | Bower et al. | |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 10,008,483 B2 * | 6/2018 | Cok | H01L 33/505 |
| 10,103,069 B2 | 10/2018 | Bower et al. | |
| 10,153,256 B2 | 12/2018 | Cok et al. | |
| 10,181,483 B2 * | 1/2019 | Menard | H01L 24/75 |
| 10,200,013 B2 | 2/2019 | Bower et al. | |
| 10,224,460 B2 | 3/2019 | Bower et al. | |
| 10,297,502 B2 | 5/2019 | Bower et al. | |
| 10,777,521 B2 | 9/2020 | Meitl et al. | |
| 10,782,002 B2 | 9/2020 | Bower et al. | |
| 10,790,173 B2 | 9/2020 | Gomez et al. | |
| 10,832,609 B2 | 11/2020 | Rotzoll et al. | |
| 11,062,936 B1 | 7/2021 | Moore et al. | |
| 11,274,035 B2 | 3/2022 | Gul et al. | |
| 11,316,086 B2 | 4/2022 | Bower et al. | |
| 11,482,979 B2 | 10/2022 | Trindade et al. | |
| 11,528,808 B2 | 12/2022 | Gomez et al. | |
| 2001/0000905 A1 * | 5/2001 | Davis | H05K 3/3485 228/56.3 |
| 2001/0037565 A1 | 11/2001 | Prasad et al. | |
| 2002/0145185 A1 | 10/2002 | Shrauger | |
| 2003/0057563 A1 * | 3/2003 | Nathan | H01L 24/82 257/E29.022 |
| 2003/0117369 A1 | 6/2003 | Spitzer et al. | |
| 2003/0141570 A1 | 7/2003 | Chen et al. | |
| 2004/0029356 A1 | 2/2004 | Timme et al. | |
| 2004/0061579 A1 | 4/2004 | Nelson | |
| 2004/0169275 A1 * | 9/2004 | Danvir | H01L 24/81 257/E21.511 |
| 2005/0081363 A1 | 4/2005 | Malshe et al. | |
| 2006/0032670 A1 | 2/2006 | Haba et al. | |
| 2006/0084012 A1 * | 4/2006 | Nuzzo | B82Y 10/00 430/324 |
| 2007/0034323 A1 * | 2/2007 | Hiller | H01L 21/67132 156/543 |
| 2007/0228880 A1 | 10/2007 | Higuchi et al. | |
| 2008/0186682 A1 * | 8/2008 | Sugimura | H05K 3/3485 361/720 |
| 2009/0102060 A1 | 4/2009 | Goida | |
| 2010/0306993 A1 | 12/2010 | Mayyas et al. | |
| 2012/0154503 A1 | 6/2012 | Daniel et al. | |
| 2012/0228669 A1 | 9/2012 | Bower et al. | |
| 2012/0280591 A1 | 11/2012 | Schultz | |
| 2012/0313241 A1 | 12/2012 | Bower | |
| 2012/0314388 A1 | 12/2012 | Bower et al. | |
| 2012/0318060 A1 | 12/2012 | Ruby | |
| 2013/0002363 A1 | 1/2013 | Motiee et al. | |
| 2013/0221355 A1 * | 8/2013 | Bower | H01L 21/308 438/669 |
| 2013/0273695 A1 | 10/2013 | Menard et al. | |

(56) References Cited

U.S. PATENT DOCUMENTS

| | | |
|---|---|---|
| 2013/0309792 A1 | 11/2013 | Tischler et al. |
| 2013/0316487 A1* | 11/2013 | de Graff ............ H01L 27/14636 438/66 |
| 2014/0084240 A1* | 3/2014 | Hu ...................... H01L 33/0093 438/22 |
| 2014/0159043 A1* | 6/2014 | Sakariya ............ H01L 25/0753 438/34 |
| 2014/0260515 A1 | 9/2014 | Hazel et al. |
| 2014/0264763 A1 | 9/2014 | Meitl et al. |
| 2015/0028362 A1* | 1/2015 | Chan ...................... H01L 24/29 438/28 |
| 2015/0135525 A1 | 5/2015 | Bower |
| 2015/0348926 A1 | 12/2015 | Bower |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372393 A1 | 12/2015 | Bower et al. |
| 2016/0005721 A1 | 1/2016 | Bower et al. |
| 2016/0018094 A1 | 1/2016 | Bower et al. |
| 2016/0020131 A1 | 1/2016 | Bower et al. |
| 2016/0093600 A1 | 3/2016 | Bower et al. |
| 2016/0276309 A1* | 9/2016 | Paek .................. H01L 25/0652 |
| 2016/0377648 A1 | 12/2016 | Zhang |
| 2017/0048976 A1 | 2/2017 | Prevatte et al. |
| 2017/0117850 A1 | 4/2017 | Nomura et al. |
| 2017/0141750 A1 | 5/2017 | Pelzel et al. |
| 2017/0148771 A1 | 5/2017 | Cha et al. |
| 2017/0154819 A1 | 6/2017 | Bower et al. |
| 2017/0179366 A1* | 6/2017 | Kobayashi ......... H10N 30/2042 |
| 2017/0207193 A1* | 7/2017 | Bower ................ B41F 16/0073 |
| 2017/0244386 A1 | 8/2017 | Bower et al. |
| 2017/0256521 A1* | 9/2017 | Cok ...................... H01L 25/162 |
| 2017/0256522 A1* | 9/2017 | Cok ........................ H01L 25/50 |
| 2017/0310299 A1 | 10/2017 | Bower et al. |
| 2017/0338374 A1 | 11/2017 | Zou et al. |
| 2018/0031974 A1 | 2/2018 | Prevatte et al. |
| 2018/0138071 A1* | 5/2018 | Bower .................... H01L 33/38 |
| 2018/0174910 A1 | 6/2018 | Bower et al. |
| 2018/0286734 A1* | 10/2018 | Meitl ...................... H01L 24/06 |
| 2018/0323178 A1* | 11/2018 | Meitl ...................... H01L 33/62 |
| 2019/0157532 A1* | 5/2019 | Meitl .................... H01L 33/0095 |
| 2019/0214965 A1 | 7/2019 | Dasgupta et al. |
| 2019/0252350 A1* | 8/2019 | Schwarz ................ H01L 24/75 |
| 2019/0296202 A1* | 9/2019 | Chen ...................... H01L 24/13 |
| 2020/0081028 A1 | 3/2020 | Zhang et al. |
| 2020/0176285 A1 | 6/2020 | Gomez et al. |
| 2020/0176286 A1 | 6/2020 | Rotzoll et al. |
| 2020/0176670 A1 | 6/2020 | Gomez et al. |
| 2020/0176671 A1 | 6/2020 | Cok et al. |
| 2020/0177149 A1 | 6/2020 | Trindade et al. |
| 2020/0408801 A1 | 12/2020 | Vohra et al. |
| 2021/0002128 A1 | 1/2021 | Cok et al. |
| 2021/0039380 A1 | 2/2021 | Cok |
| 2021/0043816 A1 | 2/2021 | Bower et al. |
| 2021/0246018 A1* | 8/2021 | Cok ........................ H10N 30/88 |
| 2022/0181185 A1 | 6/2022 | Loi |
| 2022/0368306 A1* | 11/2022 | Meitl .................... H03H 9/0585 |

FOREIGN PATENT DOCUMENTS

| | | | |
|---|---|---|---|
| JP | 2003256141 A | * 9/2003 | .............. B32B 7/02 |
| JP | 2007-208845 A | 8/2007 | |
| WO | WO-2010/111601 A2 | 9/2010 | |
| WO | WO-2010/132552 A1 | 11/2010 | |

OTHER PUBLICATIONS

Bower, C. A. et al., Transfer Printing: An Approach for Massively Parallel Assembly of Microscale Devices, IEEE, Electronic Components and Technology Conference, (2008).
Cok, R. S. et al., 60.3: AMOLED Displays Using Transfer-Printed Integrated Circuits, Society for Information Display, 10:902-904, (2010).
Cok, R. S. et al., Inorganic light-emitting diode displays using micro-transfer printing, Journal of the SID, 25(10):589-609, (2017).
Cok, R. S. et al., AMOLED displays with transfer-printed integrated circuits, Journal of SID, 19(4):335-341, (2011).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Piazza, G. et al., Piezoelectric Aluminum Nitride Vibrating Contour-Mode MEMS Resonators, Journal of Microelectromechanical Systems, 15(6):1406-1418, (2006).
Roscher, H., VCSEL Arrays with Redundant Pixel Designs for 10Gbits/s 2-D Space-Parallel MMF Transmission, Annual Report, optoelectronics Department, (2005).
Trindade, A.J. et al., Precision transfer printing of ultra-thin AlInGaN micron-size light-emitting diodes, Crown, pp. 217-218, (2012).
Yamashita, T. et al., Piezoelectric Strain Sensor Array Fabricated by Transfer Printing Methods, 2015 IEEE Sensors, 4 pages and 1 page IEEE Xplore abstract, date of conference: Nov. 1-4, 2015.

* cited by examiner

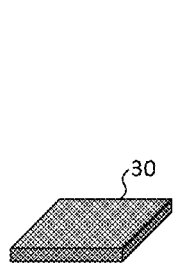 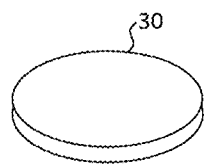 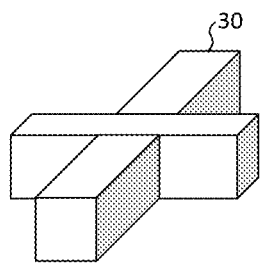
FIG. 24A   FIG. 24B   FIG. 24C

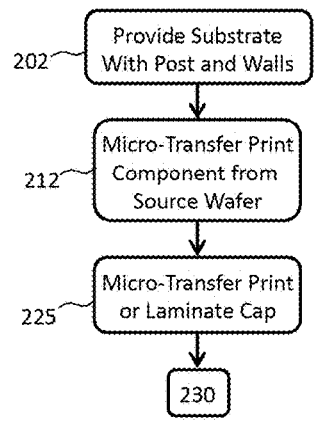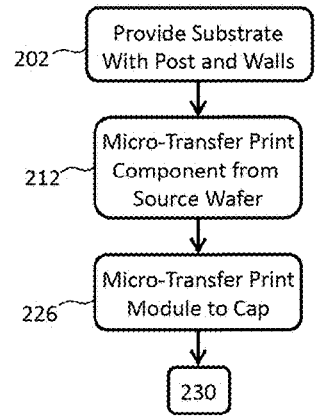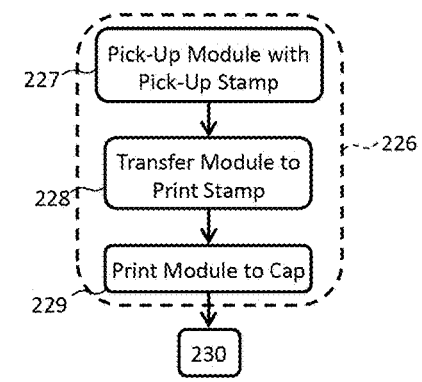
FIG. 33A   FIG. 33B   FIG. 33C

PRINTING COMPONENTS TO SUBSTRATE POSTS

PRIORITY APPLICATION

This application is a continuation of U.S. patent application Ser. No. 16/207,665, filed on Dec. 3, 2018, the disclosure of which is hereby incorporated by reference in its entirety.

CROSS REFERENCE TO RELATED APPLICATIONS

Reference is made to U.S. patent application Ser. No. 16/207,690 filed Dec. 3, 2018, entitled Printed Components on Substrate Posts, by Gomez et al., to U.S. patent application Ser. No. 16/207,738 filed Dec. 3, 2018, entitled Module Structures with Component on Substrate Post, by Rotzoll et al., to U.S. patent application Ser. No. 16/207,774 filed Dec. 3, 2018, entitled Printing Components Over Substrate Post Edges, by Trindade et al., to U.S. patent application Ser. No. 16/207,804 filed Dec. 3, 2018, entitled Device Structures with Acoustic Wave Transducers and Connection Posts, by Cok, to U.S. patent application Ser. No. 15/047,250, filed Feb. 18, 2016, entitled Micro-Transfer-Printed Acoustic Wave Filter Device, by Bower et al., and to U.S. patent application Ser. No. 15/639,495, filed Jun. 30, 2017, entitled Transverse Bulk Acoustic Wave Filter, by Bower et al., the contents of each of which are incorporated by reference herein in their entirety.

TECHNICAL FIELD

The present disclosure relates generally to printed or printable structures including components and methods for disposing components on substrate posts of patterned substrates.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating a layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In some examples of methods, in order to populate a large destination substrate with components from a native source wafer, a stamp repeatedly picks up components from different locations on a native source wafer with stamp posts and prints the components to different locations on a destination substrate. The arrangement of components on the destination substrate is at least partly defined by the arrangement of the components on the native source wafer and the arrangement of posts on the stamp. The location of the stamp with respect to the native source wafer and the destination substrate can be controlled by an opto-electro-mechanical control system. Additional transfers to the destination substrate can be made by picking up additional components from the native source wafer.

SUMMARY

Conventional methods of transfer printing typically involve picking up a new set of components from a source wafer for each area of destination substrate to be populated with the components. The present disclosure includes the recognition that moving a stamp, a native source wafer, or a destination substrate to provide additional components on a destination substrate increases fabrication time thereby reducing manufacturing throughput. There is a need, therefore, for systems, structures, devices, materials, and methods that enable improved throughput and functionality for printed systems having various micro-component structures. In some embodiments, the present disclosure provides a solution to the reduced efficiency of multiple transfers between a native source wafer and a destination substrate by utilizing patterned substrates including substrate posts for selective printing of components.

The present disclosure provides, inter alia, structures, materials, and methods for providing components on posts of a destination substrate. In accordance with certain embodiments, a method of printing (e.g., micro-transfer printing) comprises providing a component source wafer comprising components, a transfer device, and a patterned substrate, wherein the patterned substrate comprises substrate posts that extend from a surface of the patterned substrate, picking up the components from the component source wafer by adhering the components to the stamp, and printing one or more of the picked-up components to the patterned substrate by disposing each of the one or more picked-up components onto one of the substrate posts, thereby providing one or more printed components in a printed structure (e.g., a micro-transfer printed structure). In some embodiments, the transfer device is a stamp, for example comprising a viscoelastic material such as PDMS, or an electro-static transfer device. The components can be adhered to the substrate posts, for example with van der Waals forces or with an adhesive layer.

According to some embodiments, each of the one or more of the picked-up components is a first picked-up component and one or more of the picked-up components other than the one or more first picked-up components is a second picked-up component and the method comprises moving the transfer device relative to the patterned substrate and printing to the patterned substrate by disposing each of the one or more second picked-up components onto one of the substrate posts.

In some embodiments, the method comprises moving the transfer device relative to the patterned substrate after printing the first picked-up components and printing the second picked-up components to the patterned substrate without picking up any components additional to the first and second picked-up components.

In some embodiments, each of the picked-up components comprises a broken (e.g., fractured) component tether.

In some embodiments, the transfer device picks up every component on the component source wafer. In some embodiments, the transfer device picks up a subset of the components on the component source wafer. In some embodiments, the transfer device picks up every component on the component source wafer within a simple closed curve on the component source wafer. The subset of picked-up components can be a regular rectangular array of components. All of the picked-up components can be printed.

In some embodiments, a subset of the picked-up components is printed and no picked-up components that are not in the subset of picked-up components are between the picked-up components that are in the subset of the picked-up components. In some embodiments, a subset of the picked-up components is printed and picked-up components that are not in the subset of picked-up components are between the picked-up components that are in the subset of the picked-up components.

The substrate posts can be disposed in a regular rectangular array and can be enclosed in a simple closed curve, for example a rectangle.

According to some embodiments, the picked-up components are separated by a component separation distance in each of one or two dimensions and the substrate posts are separated by a substrate post distance in each of one or two dimensions. The substrate post separation distance can be greater than the component separation distance.

In some embodiments, for at least one of the one or more printed components, the one printed component does not extend over an edge of the one of the substrate posts. In some embodiments, for at least one of the one or more printed components, the one printed component extends over an edge, multiple edges, opposing edges, or all of the edges of the one of the substrate posts.

Each of the one or more components can be adhered to the one of the substrate posts. In some embodiments, for at least one of the substrate posts, the one substrate post forms a ridge that extends in one direction beyond one of the one or more printed components printed on the substrate post. More than one of the one or more printed components can be printed on a single ridge. Similarly, a printed component can be printed on more than one ridge or substrate post. For each of the one or more printed components, the one of the substrate posts can be disposed between a center of the printed component and the substrate. In some embodiments, the one of the substrate posts on which a component is placed is not disposed between a center of the printed component and the substrate.

According to some embodiments, the transfer device is a stamp comprising a stamp post, one of the picked-up components is disposed on the stamp after being picked up, and the stamp post has a dimension substantially the same as a corresponding dimension of at least one of the substrate posts.

In some embodiments, a method comprises disposing a solder between each of the one or more printed components and the one of the substrate posts and heating the solder to electrically connect a substrate post electrode on the substrate post to a component electrode on the component. Methods can comprise (i) wire bonding a wire to a component electrode on each of the one or more printed components, (ii) wire bonding a wire to a substrate post electrode on the one of the substrate posts, or (iii) both (i) and (ii).

According to some embodiments, a method comprises printing (e.g., micro-transfer printing) the one or more picked-up components on to ones of the substrate posts having locations relatively different from locations of the one or more picked-up components on the component source wafer. The printed structure can be a printable module (e.g., a micro-transfer printable module) comprising at least a portion of a module tether connected to the patterned substrate.

According to some embodiments, a device structure (e.g., a micro-transfer printed structure) comprises a patterned substrate comprising a substrate surface and a substrate post protruding from the substrate surface, the substrate post comprising a substrate post material. A component has a component top side and a component bottom side opposite the component top side, the component bottom side disposed on the substrate post and extending over at least one edge of the substrate post, the component comprising a component material different from the substrate post material, and the component comprising a broken (e.g., fractured) or separated component tether.

In some embodiments, the component is a first component and the printed structure comprises a second component adhered to the substrate post.

In some embodiments, the substrate post is a ridge with a length greater than a width over the substrate and the substrate post has a substrate post top side to which the component bottom side is adhered. In some embodiments, a device structure comprises one or more substrate post electrodes on the substrate post top side and the one or more substrate post electrodes is electrically connected to the component. The substrate post can be electrically conductive and can be electrically connected to the component.

In some embodiments, a device structure comprises one or more component top electrodes disposed on the component top side. In some embodiments, a device structure comprises (i) a wire bond electrically connected to at least one of the one or more component top electrodes, (ii) a substrate post electrode disposed on the substrate post and comprising a wire bond electrically connected to the substrate post electrode, or (iii) both (i) and (ii). The substrate post can be electrically conductive or can comprise one or more substrate post electrodes that are each electrically connected to at least one of the one or more component top electrodes.

In some embodiments, a device structure comprises one or more component bottom electrodes disposed on the component bottom side. The substrate post can be electrically conductive or can comprise one or more substrate post electrodes that are each electrically connected to at least one of the one or more component bottom electrodes.

In some embodiments, the component has at least one of a length and a width less than or equal to 200 microns, less than or equal to 100 microns, less than or equal to 50 microns, less than or equal to 20 microns, less than or equal to 10 microns, or less than or equal to 5 microns. The substrate post can be electrically conductive or comprises one or more substrate post electrodes. The component material can be a semiconductor, the substrate post material can be a dielectric, or the substrate post material can be an electrical conductor.

In some embodiments, the component extends over at least two, three, or four sides of the substrate post. The component can extend over opposing sides of the substrate post. The component can be rectangular, can be plus sign shaped, or can be disc shaped.

The component can be adhered or attached to the patterned substrate only by the component bottom side. The component can be an electronic or an opto-electronic component and can comprise an electronic circuit. The component can be responsive to at least one of electrical energy, optical energy, electromagnetic energy, and mechanical energy. The component can comprise electrically conductive connection posts.

In some embodiments, the patterned substrate is a semiconductor substrate comprising an electronic circuit.

In some embodiments, the device structure is a printable module (e.g., a micro-transfer printable module) and comprises at least a portion of a module tether connected to the patterned substrate.

In some embodiments, a module structure comprises a patterned substrate having a substrate surface and a substrate post protruding from the substrate surface. A component is disposed on the substrate post. The component has a component top side and a component bottom side opposite the component top side. The component bottom side is disposed on the substrate post. The component extends over at least one edge of the substrate post and one or more component electrodes are disposed on the component. The one or more component electrodes can comprise (i) a component top electrode disposed on the component top side, (ii) a component bottom electrode disposed on the component bottom side, or (iii) both (i) and (ii).

The module structure can comprise a cavity formed or disposed in or on the patterned substrate. The cavity can have a cavity floor and one or more cavity walls and can contain, enclose, or surround one or more components. The substrate post can be disposed on the cavity floor. One or more cavity walls can be formed on the patterned substrate. In some embodiments, a cap is disposed over the cavity. The cavity walls can be formed on the patterned substrate and adhered to the cap with adhesive. The cavity walls can be formed on or as part of the cap and adhered to the patterned substrate with adhesive. Thus, in some embodiments, a cap comprises cavity walls, the cap is adhered to the cavity floor with adhesive, and the cap defines a cavity around, enclosing, or surrounding the component. The cap can comprise a broken (e.g., fractured) or separated cap tether.

In some embodiments, the module structure comprises two or more substrate posts disposed within the cavity. Two or more components can be disposed within the cavity. The one or more component electrodes of each of the two or more components disposed within the cavity can be electrically connected.

In some embodiments, a module structure can comprise two or more substrate posts disposed within the cavity and can comprise two or more components disposed within the cavity.

In some embodiments, the one or more component electrodes of each of the two or more components disposed within the cavity are electrically connected.

In some embodiments of the module structure, the component comprises a broken (e.g., fractured) or separated component tether. The component can be adhered or attached to the substrate or substrate post only on the component bottom side. The component can be adhered to the substrate post with adhesive. The component can comprise a piezo-electric material. The substrate can comprise a semiconductor substrate comprising a component electronic or electrical circuit. The component can comprise a component material different from a substrate post material.

According to some embodiments, module source wafer comprising a patterned sacrificial layer comprising one or more sacrificial portions each adjacent to one or more anchors, wherein the one or more sacrificial portions are differentially etchable from the module source wafer and the patterned substrate is disposed at least partially on or over one of the one or more sacrificial portions. The sacrificial portions can comprise a material different from a module source wafer material. The sacrificial portions can comprise an anisotropically etchable material.

According to some embodiments, a module structure comprises a module source wafer comprising a patterned sacrificial layer comprising an anchor. The patterned substrate can be connected to the anchor by a tether and disposed such that a gap exists between the patterned substrate and a surface of the module source wafer. The module structure can comprise a broken (e.g., fractured) or separated module tether connected to the patterned substrate. The component can comprise electrically conductive connection posts.

According to some embodiments, a method of making a micro-module structure comprises providing a substrate. The substrate has a substrate surface and the substrate comprises a substrate post protruding from the substrate surface. A component is disposed on the substrate post, the component having a component top side and a component bottom side opposite the component top side. The component bottom side is disposed on the substrate post and the component extends over at least one edge of the substrate post. The method further comprises providing one or more component electrodes disposed on the component. The one or more component electrodes can comprise (i) a component top electrode disposed on the component top side, (ii) a component bottom electrode disposed on the component bottom side, or (iii) both (i) and (ii).

In some embodiments, the substrate is patterned to form a patterned substrate and to form the substrate post. The component can be printed (e.g., micro-transfer printed) from a component source wafer to the substrate post. The component can be formed on the substrate.

In some embodiments, methods can comprise providing a cavity in or on the substrate, the cavity having a cavity floor and one or more cavity walls. The substrate can be etched to form the one or more cavity walls and the cavity floor. The substrate post can be formed on the cavity floor.

In some embodiments, methods can comprise disposing a cap over the cavity, laminating the cap over the cavity, or printing (e.g., micro-transfer printing) the cap to dispose the cap over the cavity.

In some embodiments, methods can comprise etching the substrate to form a cavity with one or more side walls and a substrate post layer, depositing component material over the substrate, patterning the component material to form the component, and etching the substrate post layer to form the substrate post. In some embodiments, methods can comprise providing a cap with one or more walls and printing (e.g., micro-transfer printing) the cap with walls over the component and substrate post, thereby defining a cavity having one or more cavity walls. The one or more component electrodes can be formed on the component.

In some embodiments, methods can comprise providing a module source wafer comprising a patterned sacrificial layer comprising one or more sacrificial portions each adjacent to one or more anchors, wherein the one or more sacrificial portions are differentially etchable from the wafer and the substrate is disposed at least partially on one of the one or more sacrificial portions. The sacrificial portions can be anisotropically etchable.

In some embodiments, methods can comprise etching one of the one or more sacrificial portions, picking up the module structure with a pick-up transfer device, transferring the module structure to a printing transfer device, and printing the module structure to a cap with the printing transfer device.

One of the one or more sacrificial portions can be etched, and the substrate transferred to a destination substrate. The pick-up transfer device and the printing transfer device can each be a stamp, for example an electro-static or viscoelastic stamp.

In some embodiments, providing the component comprises providing a component source substrate, disposing the component over or on the component source substrate, providing a sacrificial layer over at least a portion of the component, adhering the sacrificial layer to a carrier substrate with an adhesive, and removing the component source substrate and exposing at least a portion of the sacrificial layer. Providing the sacrificial layer can comprise forming the sacrificial layer. Embodiments can comprise forming at least one of the one or more component electrodes on the component before forming the sacrificial layer, forming a component electrode on the component after removing the component source substrate, etching the sacrificial layer to form a component tether attaching the component to an anchor portion of the adhesive, or printing (e.g., micro-transfer printing) the component.

In some embodiments, the component comprises a piezo-electric material.

In some embodiments of the present invention, a device structure comprises an acoustic wave transducer comprising a component comprising a piezo-electric material, component electrodes disposed on the component, and connection posts extending away from the component, each of the connection posts electrically connected to one of the component electrodes. The component has a center and a length greater than a width and, for each of the connection posts, a distance between the connection post and the center is no more than one quarter of the length (e.g., is less than one quarter of the length, is no more than one eighth of the length, is no more than one tenth of the length, is no more than one twentieth of the length). The component posts can be at the center of the component in one dimension, for example a length dimension (e.g., that is greater than a width dimension). In some embodiments, each of the connection posts is closer to the component center than an end of the component.

In some embodiments, the component has a component top side and a component bottom side opposite the component top side and at least one of the component electrodes is a component top electrode disposed on the component top side. In some embodiments, the component has a component top side and a component bottom side opposite the component top side and at least one of the component electrodes is a component bottom electrode disposed on the component bottom side.

In some embodiments, the acoustic wave transducer is a surface acoustic wave transducer or filter, or the component is a bulk acoustic wave transducer or filter.

In some embodiments, a device structure comprises a dielectric layer disposed at least partially between the component and a distal end of a connection post. The connection posts can have a distal end and a proximal end, the distal end having an area smaller than an area of the proximal end, wherein the distal end forms a sharp point. The connection posts can comprise planar edges or a pyramidal structure.

In some embodiments, a device structure comprises a component source wafer comprising a sacrificial layer comprising sacrificial portions, wherein each sacrificial portion is adjacent to one or more anchors. The component can be disposed entirely, completely, or exclusively over one of the sacrificial portions. In some embodiments, the components can comprise portions that extend over or form part of a tether or anchor.

In some embodiments, a device structure comprises a dielectric layer disposed between the one of the sacrificial portions and the component, wherein each of the connection posts is electrically connected to one of the component electrodes through the dielectric layer. One of the sacrificial portions can be differentially etchable from the anchors or can comprise different materials, for example differentially etchable materials. In some embodiments, one of the sacrificial portions comprises an anisotropically etchable material. The connection posts can extend into the one of the sacrificial portions.

In some embodiments, a device structure comprises a component source wafer comprising a patterned sacrificial layer comprising an anchor, wherein the component is connected to the anchor by a tether and disposed such that a gap exists between the component and a surface of the module source wafer.

In some embodiments, a device structure comprises a substrate having a substrate surface and electrodes disposed on the substrate surface, and the component disposed on the substrate surface. Each of the connection posts can be in electrical contact with one of the electrodes.

In some embodiments, a device structure comprises a patterned layer of adhesive adhering the connection posts to the substrate surface. The patterned layer of adhesive can contact only a portion of a bottom surface of the component to the substrate surface. The component can have at least one of a length and width less than or equal to 200 microns. The patterned substrate can comprise a semiconductor comprising an electronic substrate circuit.

In some embodiments, a device structure comprises three or at least four connection posts. The component can comprise at least a portion of a component tether.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A-12 are successive illustrations of structures formed during a method according to illustrative embodiments of the present disclosure;

FIG. 1A is a perspective and FIG. 1B is a cross section taken along cross section line A of FIG. 1A of a stamp and component source wafer according to illustrative embodiments of the present disclosure;

FIG. 2 is a cross section of a stamp in contact with components on a component source wafer according to illustrative embodiments of the present disclosure;

FIG. 5 is a cross section of a stamp micro-transfer printing a first subset of components to a patterned substrate according to illustrative embodiments of the present disclosure;

FIG. 7 is a cross section of a stamp micro-transfer printing a second subset of components to a patterned substrate according to illustrative embodiments of the present disclosure;

FIGS. 9-12 are successive perspectives of structures following FIGS. 8A and 8B of a stamp and patterned substrate before and after micro-transfer printing successive subsets of components from the stamp to the patterned substrate according to illustrative embodiments of the present disclosure;

FIGS. 24A-24C are perspectives of components having different shapes according to illustrative embodiments of the present disclosure;

FIGS. 31-35 are flow diagrams of construction methods according to illustrative embodiments of the present disclosure;

Figure 1A:
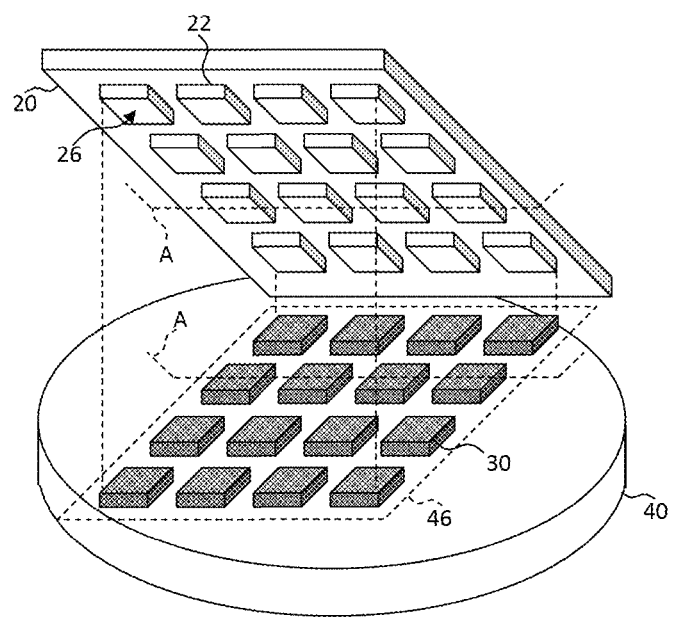

The perspectives shown in FIGS. 1A, 3A, 4A, 6A, 8A, 9-12, 19, 20, 25A and 25B are exploded illustrations with exaggerated viewing angles. The two cross section lines A indicated in some of the perspective Figures are actually congruent and illustrate the same cross section line for different elements of the figure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward methods of printing (e.g., micro-transfer printing) arrays of components from a component source wafer to a patterned substrate using a transfer device (e.g., stamp), where the patterned substrate comprises structures that extend from a surface of the patterned substrate. Each such structure is referred to herein as a substrate post and the substrate post serves to contact and adhere a picked-up component disposed (temporarily) on the transfer device. Thus, in some embodiments, only those components present on a stamp that contact a substrate post are printed (e.g., transfer printed) to the patterned substrate so that the arrangement of printed (e.g., micro-transfer printed) components on the patterned substrate is at least partially defined by the arrangement of substrate posts on the patterned substrate, and not solely by the arrangement of components on the stamp. According to some embodiments, a device structure comprises an acoustic wave transducer comprising a component (e.g., and one or more component electrodes). An acoustic wave transducer (e.g., a bulk or surface acoustic wave transducer) can be a portion of an acoustic wave filter or sensor.

Figure 1B:
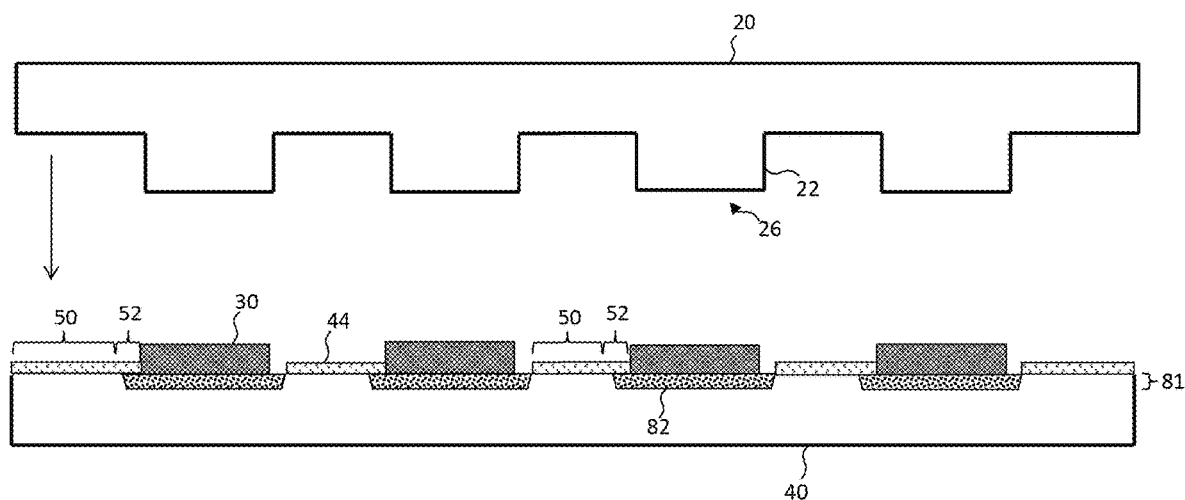
Figure 12:
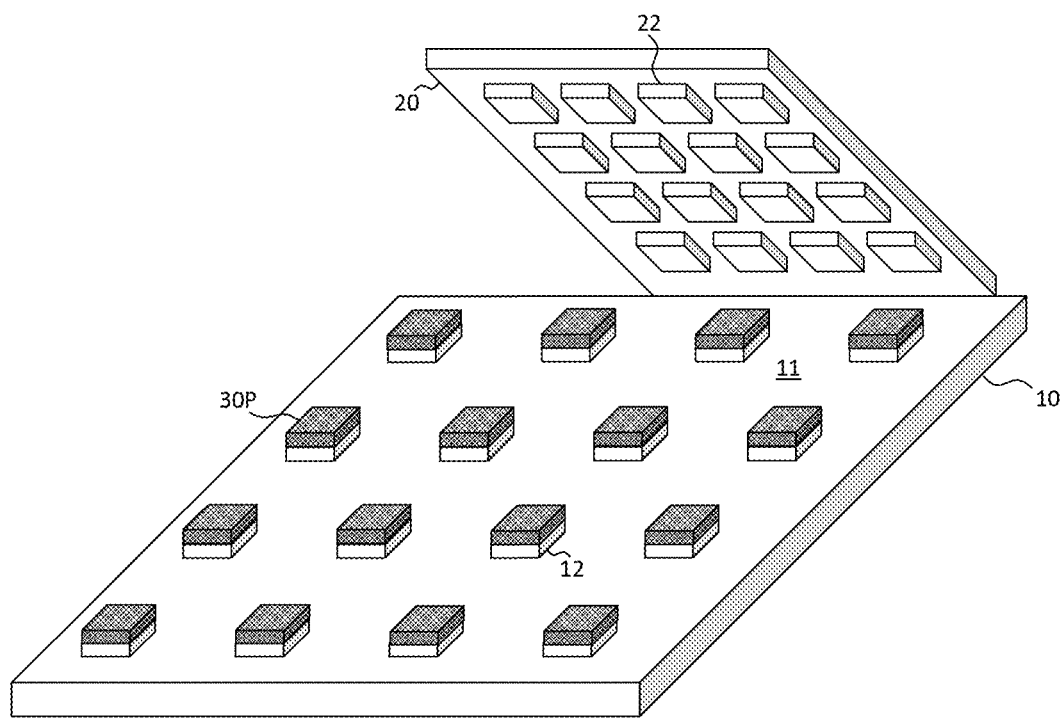
Figure 13:
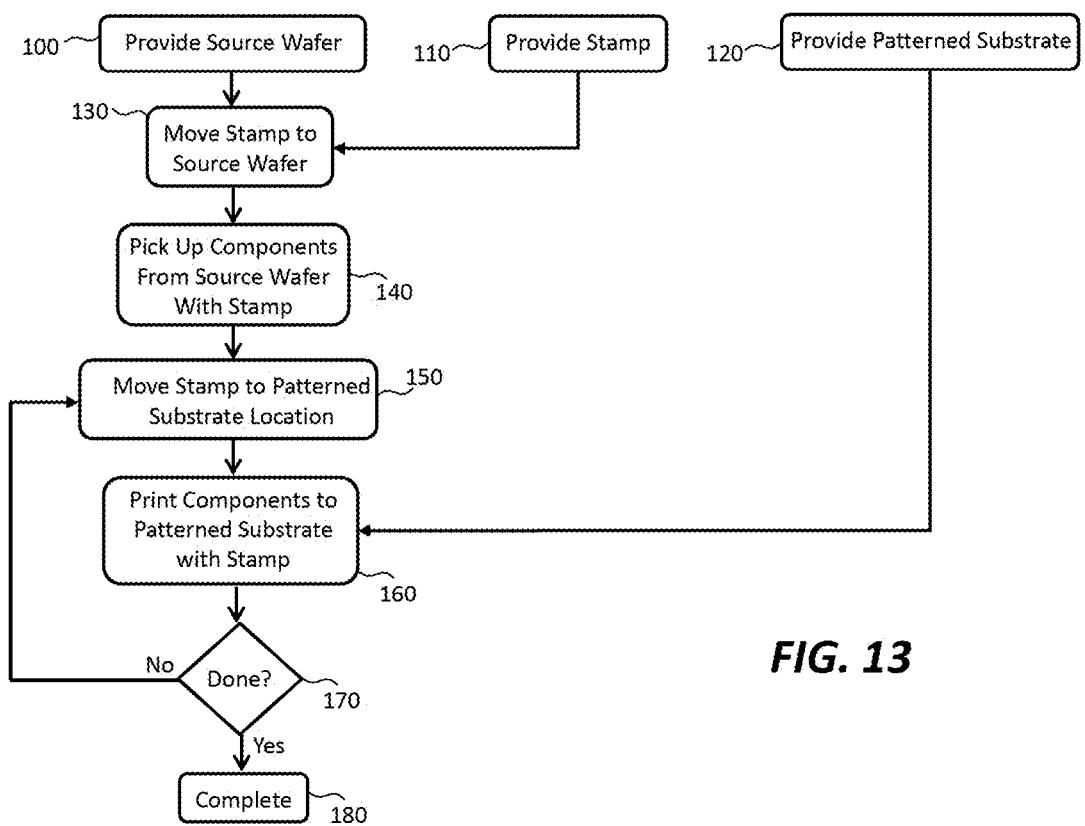
FIG. 13 is a flow diagram of a micro-transfer printing and construction process corresponding to FIGS. 1A to 12 according to illustrative methods of the present disclosure.

Referring to the sequential cross sections and perspectives of FIGS. 1A-12 and the flow diagram of FIG. 13, according to some embodiments, a method of micro-transfer printing comprises providing a component source wafer 40 comprising components 30 in step 100 and providing a transfer device 20 (e.g., a stamp 20) in step 110 (as shown in the exploded FIG. 1A perspective and corresponding cross section FIG. 1B taken along cross section line A of FIG. 1A). Stamp 20 can, but does not necessarily, comprise stamp posts 22, each with a stamp post area 26, that protrude from stamp 20 to contact components 30 when stamp 20 is pressed against components 30. As shown in FIG. 1B, components 30 are entirely disposed over, and can be formed on, sacrificial portions 82 spatially separated by anchors 50 in sacrificial layer 81 of component source wafer 40. Components 30 can be, but are not necessarily, arranged in a rectangular array of components 30, for example in a regular two-dimensional arrangement within a rectangular simple closed curve 46. A dielectric layer 44 disposed over patterned substrate 10 and sacrificial portions 82 connects each component 30 with a component tether 52 to an anchor 50. Component tethers 52 can be laterally connected to anchors 50 (as shown) or disposed in other locations, for example beneath components 30 (shown in FIGS. 39D-39H discussed below).

Reference is made throughout the present description to examples of micro-transfer printing with stamp 20 when describing certain examples of printing components 30 (e.g., in describing FIGS. 1A-12). Similar other embodiments are expressly contemplated where a transfer device 20 that is not a stamp 20 is used to similarly print components 30. For example, in some embodiments, a transfer device 20 that is a vacuum-based or electrostatic transfer device 20 can be used to print components 30. A vacuum-based or electrostatic transfer device 20 can comprise a plurality of transfer posts, each transfer post being constructed and arranged to pick up a single component 30 (similarly to stamp posts 22 in stamp 20).

Figure 2:
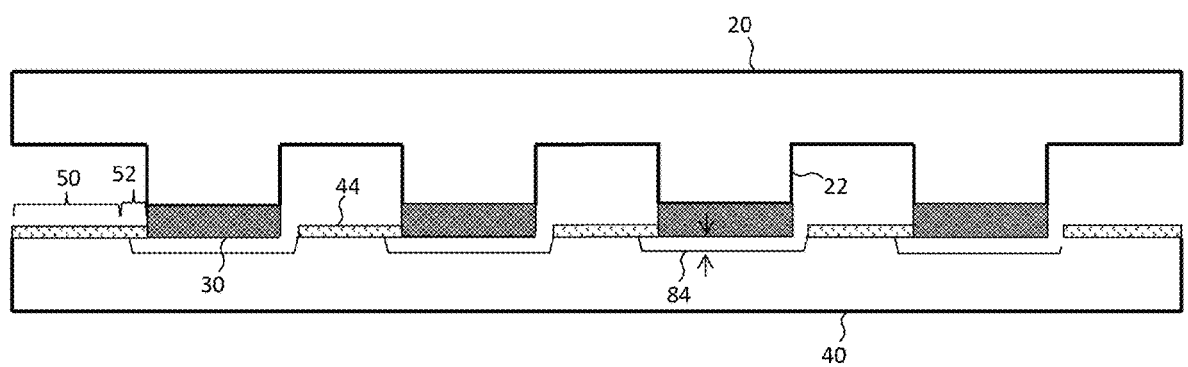

Referring to FIG. 2, sacrificial portions 82 (shown in FIG. 1B) are sacrificed, for example by etching sacrificial portions 82 to form gaps 84 (indicated by arrows), so that components 30 are suspended over gaps 84 and attached to anchors 50 of component source wafer 40 by component tethers 52 that maintain the physical position of components 30 relative to (e.g., with respect to) component source wafer 40 after sacrificial portions 82 are etched. (Components 30 shown in FIG. 2 are said to comprise at least a portion of a component tether 52, which may break or separate during a pick-up portion of a printing.) Stamp 20 is moved into position relative to component source wafer 40, for example by an opto-mechatronic motion platform, in step 130 and components 30 are picked up from component source wafer 40 by adhering components 30 to stamp 20, for example by pressing stamp 20 against components 30 on component source wafer 40 with the motion platform and adhering components 30 to the distal ends of stamp posts 22, for example with van der Waals or electrostatic forces.

Figure 3A:
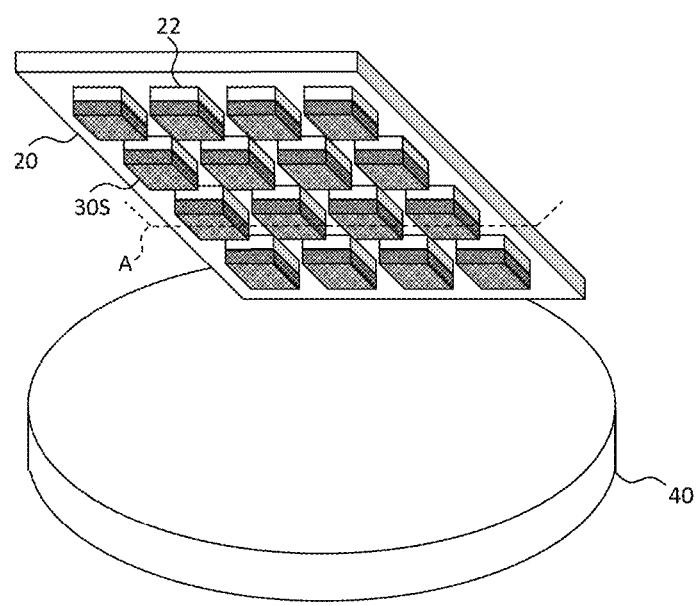
FIG. 3A is a perspective and FIG. 3B is a cross section taken along cross section line A of FIG. 3A of a stamp with components removed from a component source wafer according to illustrative embodiments of the present disclosure.
Figure 3B:
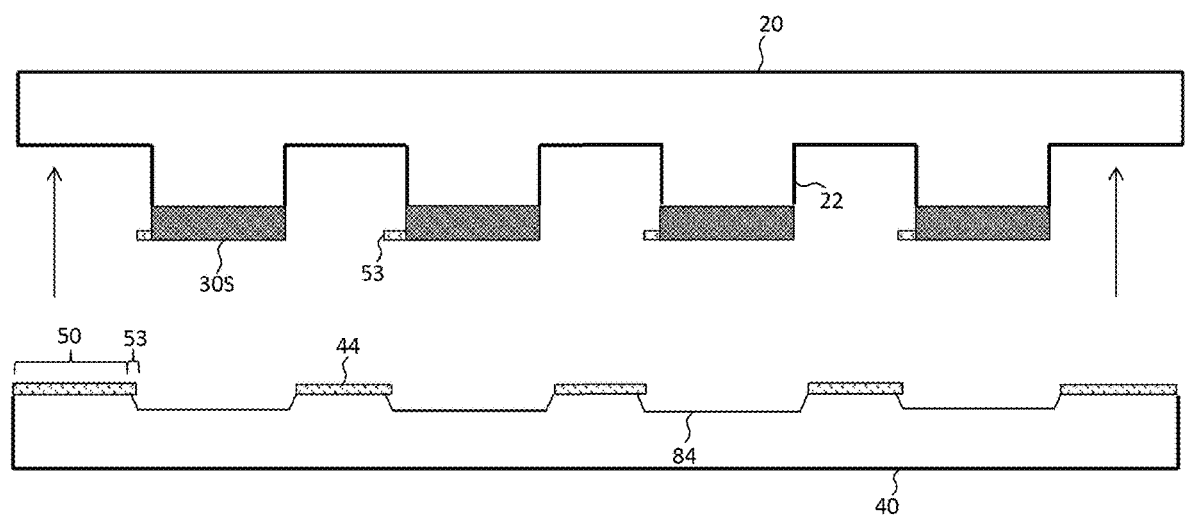

Referring to the FIG. 3A perspective and FIG. 3B cross section taken along cross section line A of FIG. 3A, stamp 20 in contact with components 30 suspended over gaps 84 is then removed from component source wafer 40 by the motion platform, fracturing dielectric layer 44 component tethers 52 from anchors 50 to form fractured component tethers 53 and picking up components 30 from component source wafer 40 with stamp 20 in step 140. (Fractured component tethers 53 are said to each be at least a portion of a component tether 53.) For clarity, components 30 adhered to stamp 20 or stamp posts 22 of stamp 20 are also referred to as stamp components 30S. Thus, picked-up stamp components 30S can comprise a separated or broken (e.g., fractured) component tether 53.

Figure 4A:
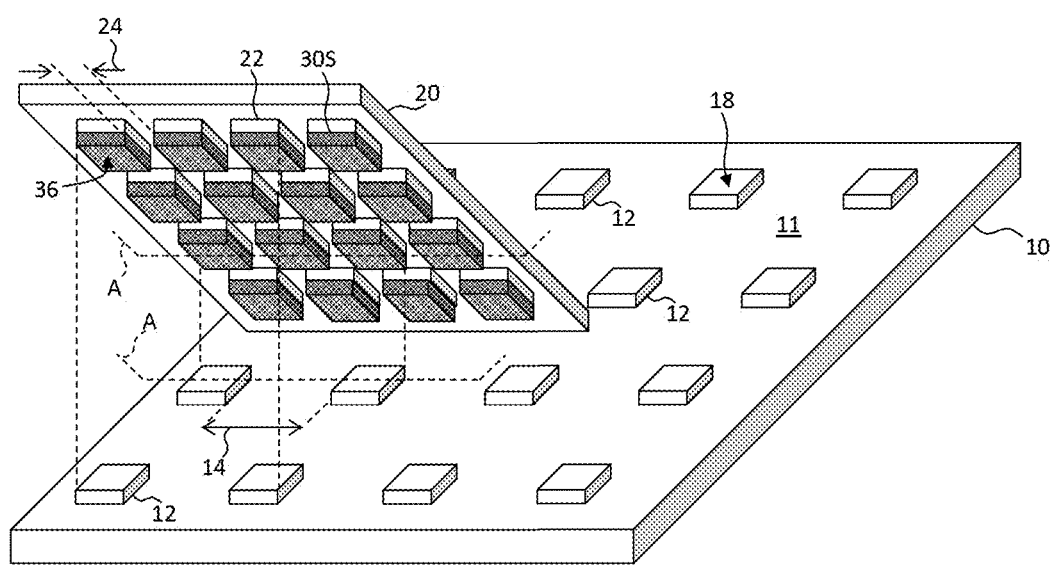
FIG. 4A is a perspective and FIG. 4B is a cross section taken along cross section line A of FIG. 4A of a stamp and patterned substrate before micro-transfer printing from the stamp to the patterned substrate according to illustrative embodiments of the present disclosure.
Figure 4B:
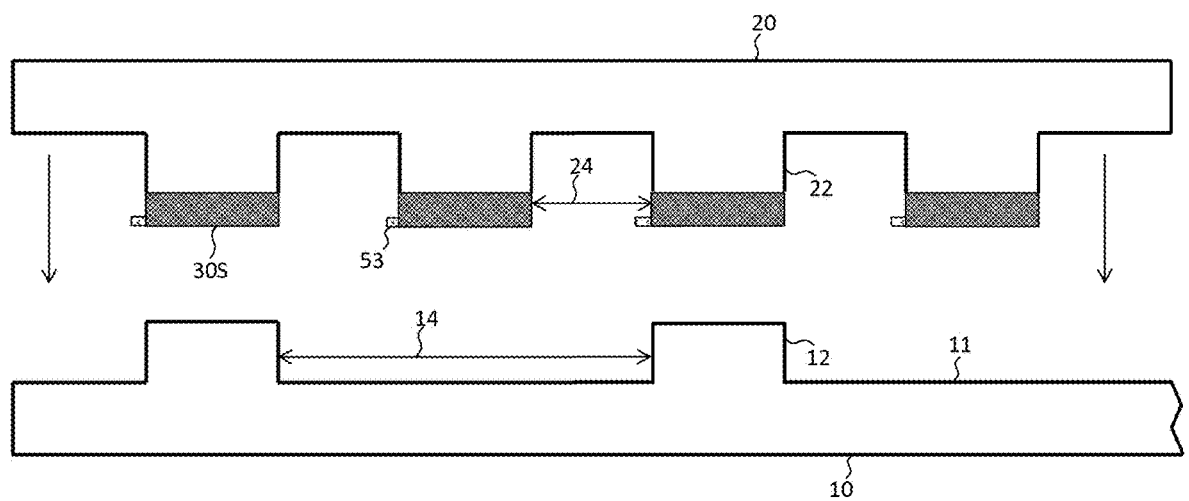

Referring to the perspective of FIG. 4A and cross section of FIG. 4B taken along cross section line A of FIG. 4A, a patterned substrate 10 comprising substrate posts 12 that extend from a substrate surface 11 of patterned substrate 10 is provided in step 120. Patterned substrate 10 is patterned at least because of substrate posts 12 formed on or in patterned substrate 10. Substrate posts 12 can comprise the same material as patterned substrate 10 or can be a patterned structure formed by processing a substrate, for example a structured substrate. Substrate posts 12 are spatially separated over patterned substrate 10 by a substrate post separation distance 14 in each of one or two dimensions. In step 150, stamp 20 and stamp components 30S with fractured component tethers 53 are moved into position relative to (e.g., with respect to) patterned substrate 10 and substrate posts 12. Stamp components 30S can be spatially separated by a stamp component separation distance 24 in each of one or two dimensions that is different from substrate post separation distance 14, for example smaller, and an extent of stamp 20 (e.g., a convex hull of stamp posts 22) can be different from an extent of patterned substrate 10 (e.g., a convex hull of substrate posts 12). Hence, substrate post separation distance 14 can be greater than component separation distance 24. Thus, in some embodiments, a subset of stamp components 30S are selected by substrate posts 12 to micro-transfer print the subset of stamp components 30S to the selecting substrate posts 12. In the example of FIGS. 4A and 4B, every other stamp component 30S in two dimensions positioned on the front left of stamp 20 is transfer printed to corresponding adjacent substrate posts 12 on the front left of patterned substrate 10 so that components 30 micro-transfer-printed to substrate posts 12 (referred to herein as substrate post components 30P) are spatially separated by twice the substrate post separation distance 14 in each of the two dimensions over patterned substrate 10 as component 30S separated by stamp component separation distance 24. In some embodiments, as shown in FIG. 4A, components 30 have a component area 36 that is substantially equal to a substrate post area 18 of substrate posts 12.

Figure 5:
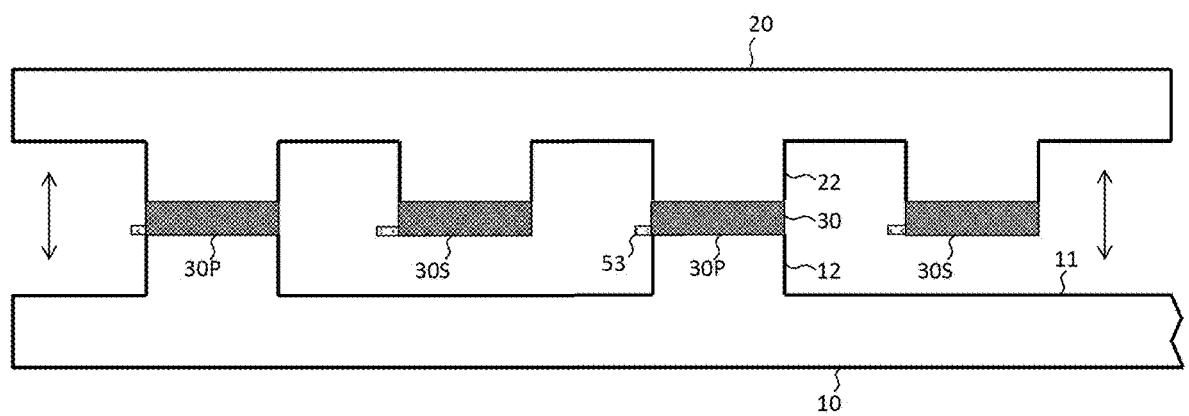

Referring to FIG. 5, in step 160 one or more of picked-up stamp components 30S with fractured component tethers 53 are printed to patterned substrate 10 by disposing each of one or more picked-up stamp components 30S onto a substrate post 12 protruding from substrate surface 11 of patterned substrate 10 to provide micro-transfer-printed components 30 on substrate posts 12, referred to as substrate post components 30P. Not all of stamp components 30S need contact a substrate post 12, so that substrate posts 12 can effectively select a subset of stamp components 30S from stamp posts 22 of stamp 20. Stamp components 30S that contact a substrate post 12 are adhered to substrate post 12 and those stamp components 30S that do not contact a substrate post 12 remain adhered to stamp 20, for example to a stamp post 22.

Figure 6A:
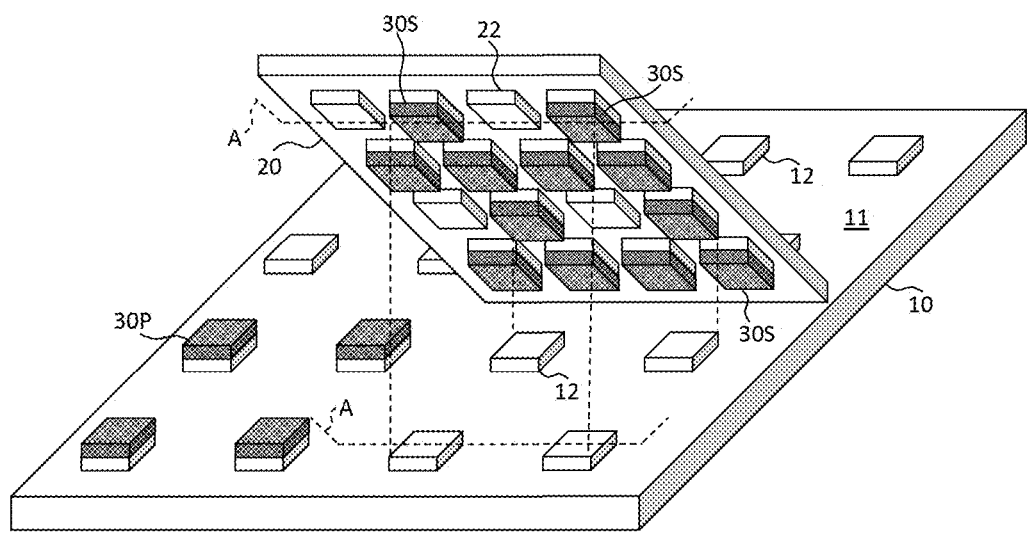
FIG. 6A is a perspective and FIG. 6B is a cross section taken along cross section line A of FIG. 6A of a stamp and patterned substrate before micro-transfer printing a second subset of components from the stamp to the patterned substrate according to illustrative embodiments of the present disclosure.
Figure 6B:
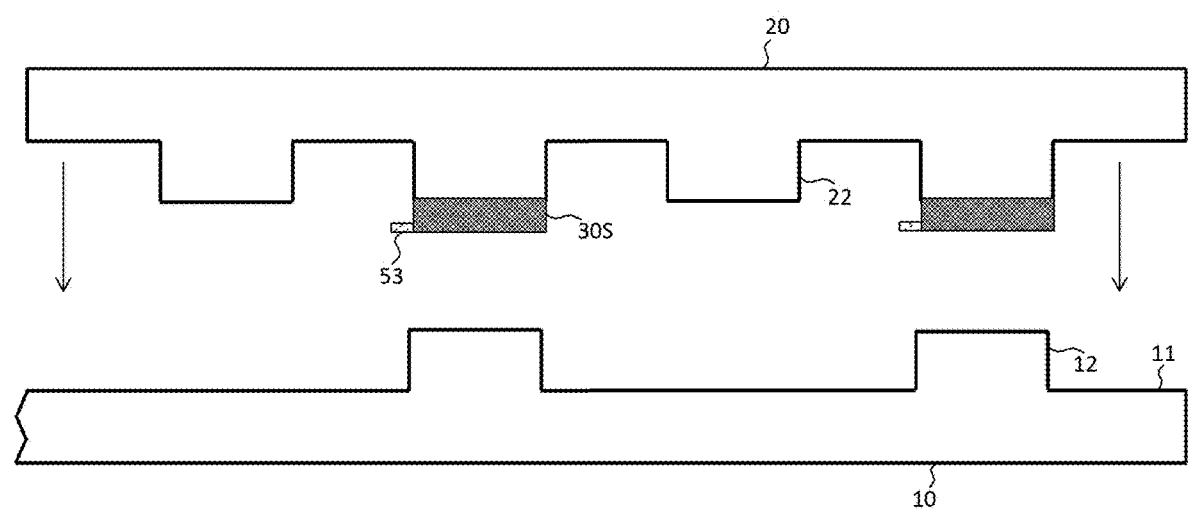
Figure 7:
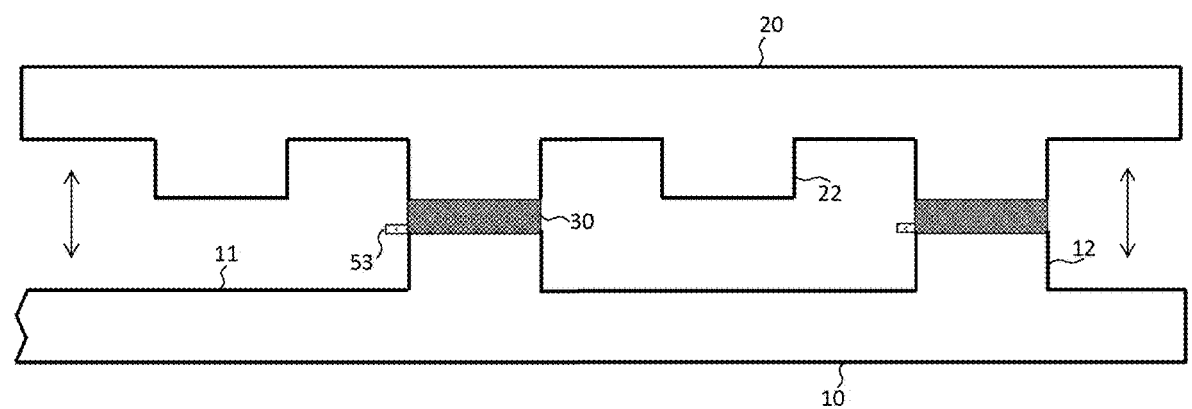
Figure 8A:
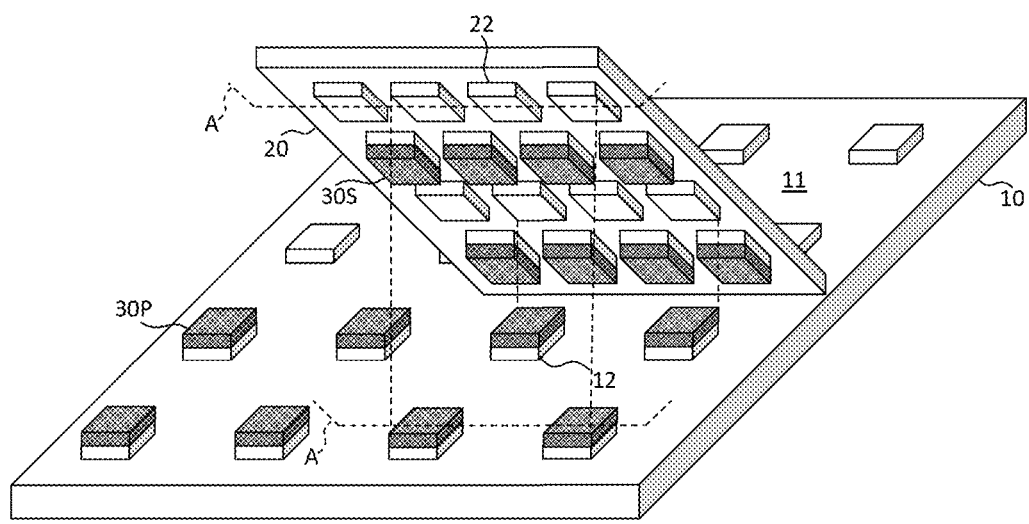
FIG. 8A is a perspective and FIG. 8B is a cross section taken along cross section line A of FIG. 8A of a stamp and patterned substrate after micro-transfer printing a second subset of components from the stamp to the patterned substrate according to illustrative embodiments of the present disclosure.
Figure 8B:
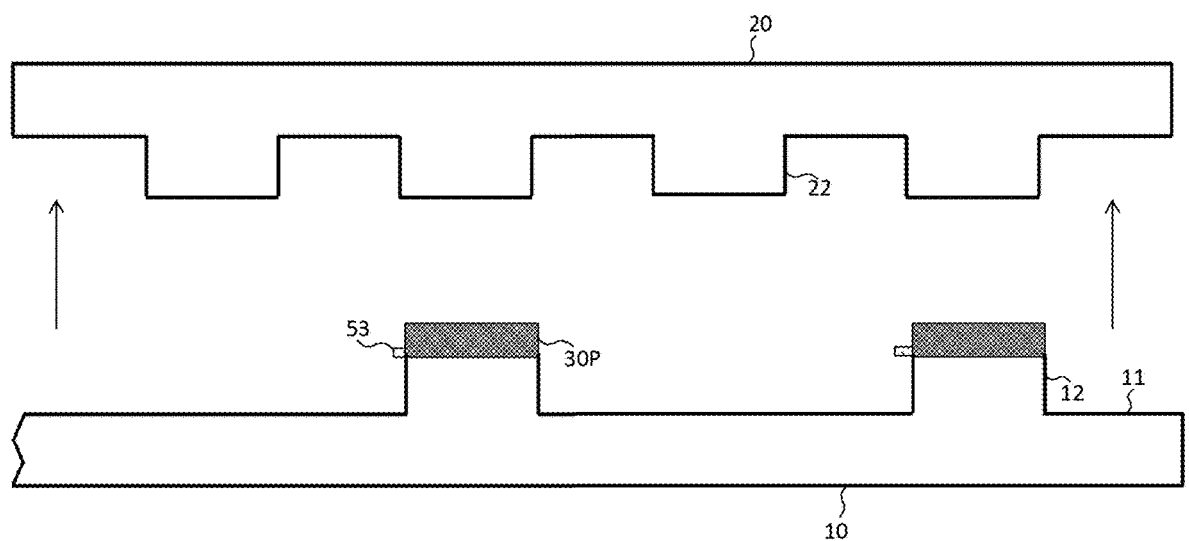
Figure 9:
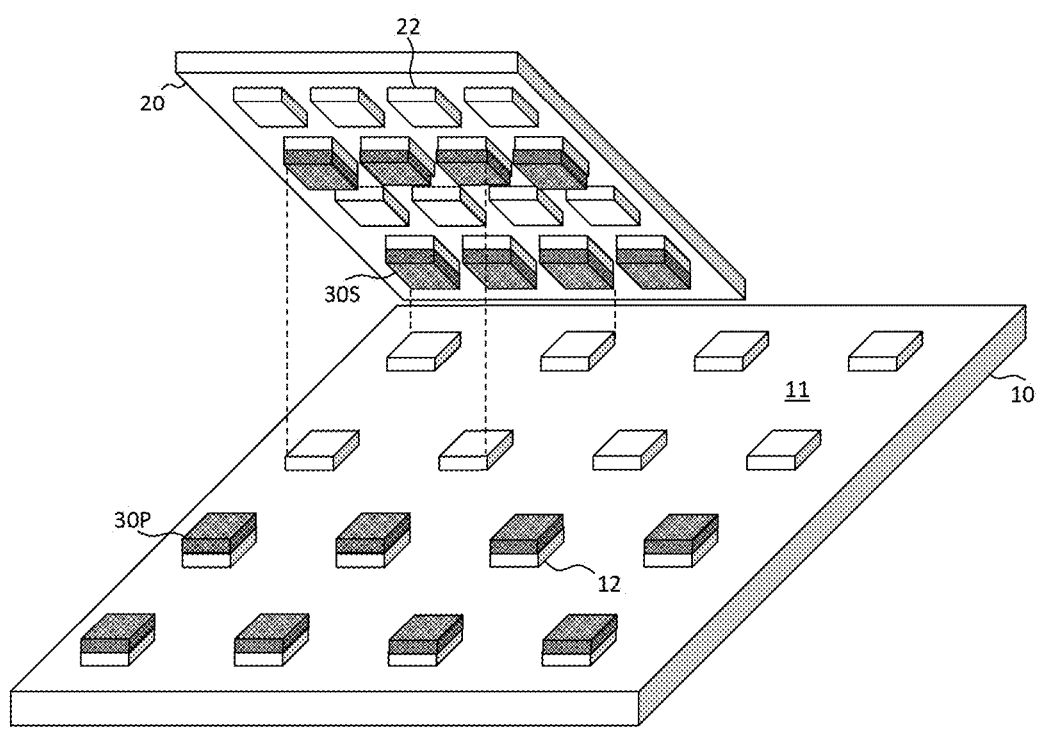

Once substrate post components 30P contacting substrate posts 12 are adhered to substrate posts 12, stamp 20 can be removed and, if all of component 30 are not yet micro-transfer printed from stamp 20 (step 170), stamp 20 is repositioned with respect to patterned substrate 10 (repeating step 150 and as shown in the perspective of FIG. 6A and cross section of FIG. 6B taken along cross section line A of FIG. 6A) to micro-transfer print a different subset of stamp components 30S with fractured component tethers 53 from stamp posts 22 to a different subset of substrate posts 12 on substrate surface 11 of patterned substrate 10 (repeating step 160 and as shown in the cross section of FIG. 7). In the example of FIG. 6B, every other stamp component 30S in two dimensions positioned on the front right of stamp 20 is micro-transfer printed to corresponding adjacent substrate posts 12 on the front right of patterned substrate 10 so that micro-transfer printed substrate post components 30P are spatially separated by twice substrate post separation distance 14 in each of the two dimensions over patterned substrate 10 compared to stamp component separation distance 24. Stamp 20 is removed as shown in the perspective of FIG. 8A and cross section of FIG. 8B taken along cross section line A of FIG. 8A, leaving substrate post components 30P adhered to front right substrate posts 12 of patterned substrate 10.

Figure 10:
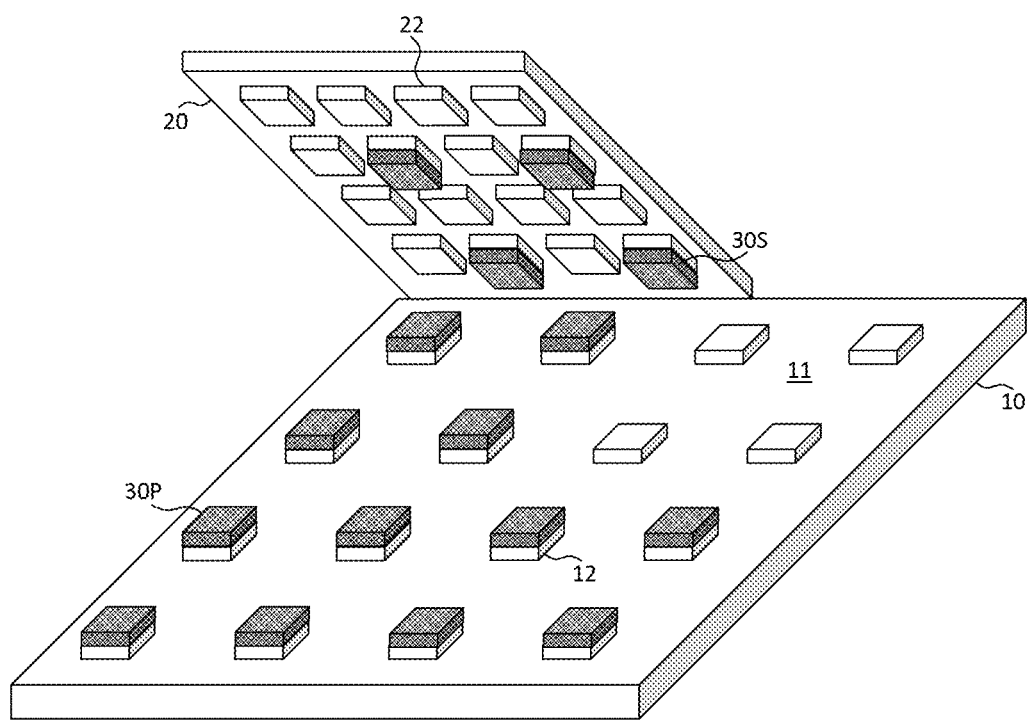
Figure 11:
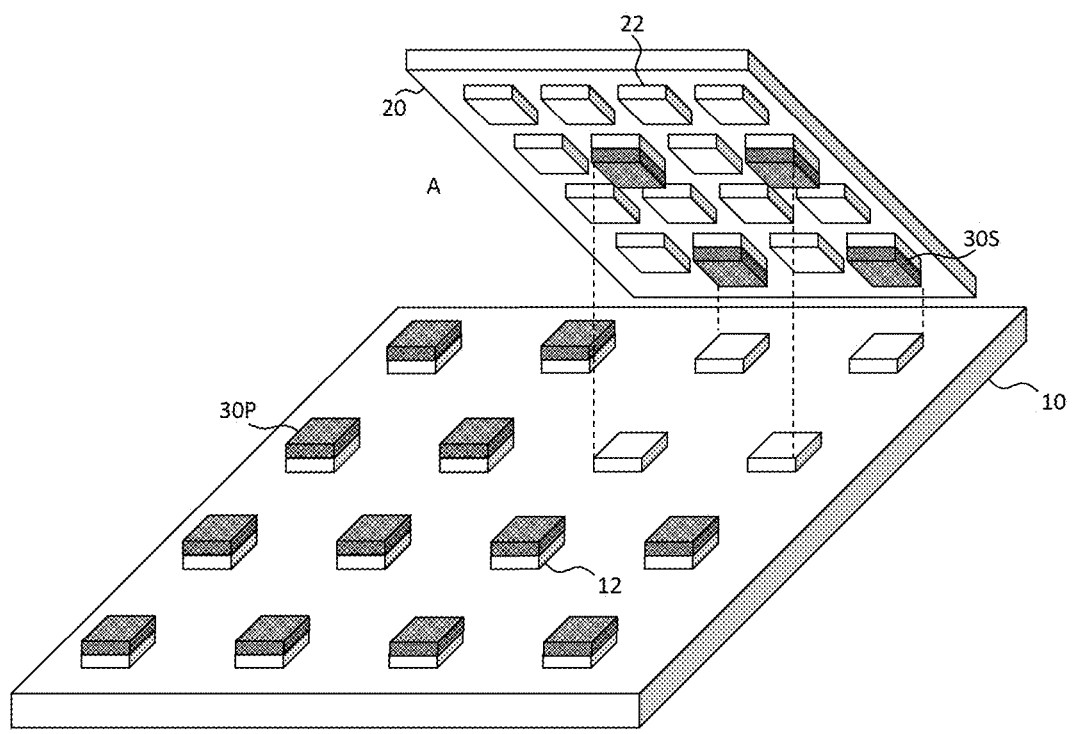

If components 30 are not all transferred the process is not done (step 170) and the same process steps 150 and 160 are repeated again to select and transfer back left stamp components 30S with fractured component tethers 53 on stamp posts 22 of stamp 20 to back left substrate posts 12 on substrate surface 11 of patterned substrate 10 (shown in the perspective of FIG. 9 before micro-transfer printing and the perspective of FIG. 10, after micro-transfer printing) and then transfer back right stamp components 30S to back right substrate posts 12 of patterned substrate 10 (shown in the perspective of FIG. 11 before transfer printing and the perspective of FIG. 12, after transfer printing). When all of components 30 are micro-transfer printed to substrate posts 12, the process is complete (step 180), as shown in FIG. 12.

Thus, methods according to certain embodiments can comprise micro-transfer printing components 30 onto substrate posts 12 having locations relatively different from the locations of components 30 on component source wafer 40, so that the extent of micro-transfer printed components 30 over patterned substrate 10 is larger than the extent of components 30 over component source wafer 40.

In some embodiments, one or more of picked-up stamp components 30S are first picked-up stamp components 30S and one or more of picked-up stamp components 30S other than first picked-up stamp components 30S that are not printed are second picked-up stamp components 30S so that first and second stamp components 30S are disjoint subsets of stamp components 30S on stamp 20. Methods according to certain embodiments can comprise moving stamp 20 with respect to patterned substrate 10 and printing to patterned substrate 10 by disposing each first picked-up stamp component 30S onto a substrate post 12 and the disposing each second picked-up stamp component 30S onto a substrate post 12 without picking up any more components 30 from component source wafer 40. Stamp 20 can be moved relative (e.g., with respect to) patterned substrate 10 by moving stamp 20 with a fixed location of patterned substrate 10, by moving patterned substrate 10 with a fixed location of stamp 20 or moving both stamp 20 and patterned substrate 10 (e.g., in opposing directions), for example.

In some embodiments, the order in which stamp components 30S are printed (e.g., front right stamp components 30S versus back left stamp components 30S) is arbitrary. Likewise, the order in which substrate posts 12 are selected for printing can be arbitrary. For example, the front right stamp components 30S could be printed to back left substrate posts 12 as a first printing step in certain embodiments.

Figure 14:
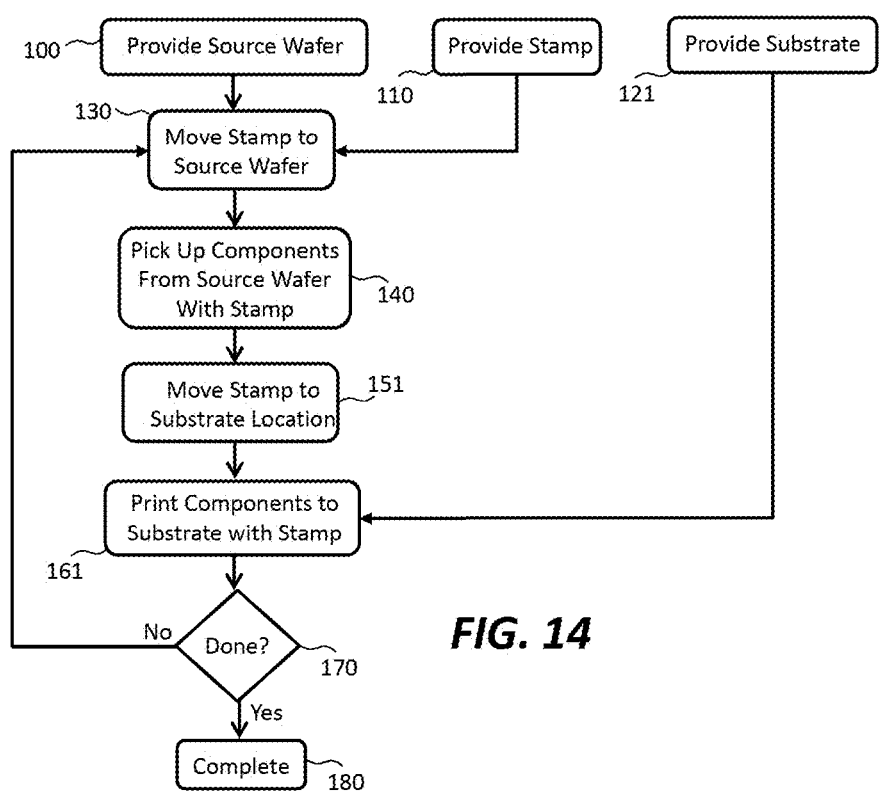
FIG. 14 is a flow diagram illustrating a construction method.

Certain embodiments provide an advantage in enabling multiple component 30 print steps to a substrate without intervening pickup steps from a component source wafer 40 with a stamp 20. In some embodiments, elimination of intervening pickup steps improves manufacturing throughput. Referring to FIG. 14 and in contrast to the steps illustrated in FIG. 13, after providing a component source wafer 40 in step 100, a stamp 20 in step 110, and an unpatterned substrate in step 121, stamp 20 is aligned with component source wafer 40 in step 130, stamp components 30S are picked up from component source wafer 40 in step 140, and stamp 20 is aligned with the unpatterned substrate in step 151. In the absence of substrate posts 12 as on the unpatterned substrate, all of stamp components 30S on stamp 20 transfer to the unpatterned substrate in print step 161, because all of stamp components 30S are in contact with a surface of the unpatterned substrate, and the pick-up and print processes are both repeated, necessitating a pickup step 140 for every print step 161 until all of components 30 are micro-transfer printed (step 170) and the process completed (step 180). In contrast, as shown in FIG. 13, some embodiments enable a single pickup step 140 followed by multiple print steps 160, thus improving printing throughput. For example, FIGS. 1A-12 illustrate a single pickup step 140 followed by four print steps 160. In some embodiments, the relative number of pickup and print steps are at least partly specified by the number and arrangement of stamp components 30S on stamp 20 and the number and arrangement of substrate posts 12 on patterned substrate 10.

Thus, according to some embodiments, the printed substrate post components 30P of one or more picked-up stamp components 30S are first components 30 (e.g., first picked-up components) and one or more of picked-up stamp components 30S other than the first components 30 are second components 30 (e.g., second picked-up components) and methods comprise moving stamp 20 with relative to (e.g., with respect to) patterned substrate 10 after printing first component 30 and printing second components 30 to patterned substrate 10 without picking up any components 30 additional to first and second components 30.

According to some embodiments, micro-transfer printing can include any method of transferring components 30 from a source substrate (e.g., component source wafer 40) to a destination substrate (e.g., patterned substrate 10) by contacting components 30 on the source substrate with a patterned or unpatterned stamp surface of a stamp 20 to remove components 30 from the source substrate, transferring stamp 20 and contacted components 30 to the destination substrate, and contacting components 30 to a surface of the destination substrate. Components 30 can be adhered to stamp 20 or the destination substrate by, for example, van der Waals forces, electrostatic forces, magnetic forces, chemical forces, adhesives, or any combination of the above. In some embodiments, components 30 are adhered to stamp 20 with separation-rate-dependent adhesion, for example kinetic control of viscoelastic stamp materials such as can be found in elastomeric transfer devices such as a PDMS stamp 20. Stamps 20 can be patterned or unpatterned and can comprise stamp posts 22 having a stamp post area 26 on the distal end of stamp posts 22. Stamp posts 22 can have a length, a width, or both a length and a width, similar or substantially equal to a length, a width, or both a length and a width of component 30. In some embodiments, as discussed further below, stamp posts 22 can be smaller than components 30 or have a dimension, such as a length and/or a width, substantially equal to or smaller than a length or a width of substrate posts 12 in one or two orthogonal directions. In some embodiments, stamp posts 22 each have a contact surface of substantially identical area.

In exemplary methods, a viscoelastic elastomer (e.g., PDMS) stamp 20 (e.g., comprising a plurality of stamp posts 22) is constructed and arranged to retrieve and transfer arrays of components 30 from their native component source wafer 40 onto non-native patterned substrates 10. In some embodiments, stamp 20 mounts onto motion-plus-optics machinery (e.g., an opto-mechatronic motion platform) that can precisely control stamp 20 alignment and kinetics with respect to both component source wafers 40 and patterned substrates 10 with substrate posts 12. During micro-transfer printing, the motion platform brings stamp 20 into contact with components 30 on component source wafer 40, with optical alignment performed before contact. Rapid upward movement of the print-head (or, in some embodiments, downward movement of component source wafer 40) breaks (e.g., fractures) or separates component tether(s) 52 forming broken (e.g., fractured) or separated component tethers 53, transferring component(s) 30 to stamp 20 or stamp posts 22. The populated stamp 20 then travels to patterned substrate 10 (or vice versa) and one or more components 30 are then aligned to substrate posts 12 and printed.

A component source wafer 40 can be any source wafer or substrate with transfer printable components 30 that can be transferred with a transfer device 20 (e.g., a stamp 20). For example, a component source wafer 40 can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions 82 can be formed of a patterned oxide (e.g., silicon dioxide) or nitride (e.g., silicon nitride) layer or can be an anisotropically etchable portion of sacrificial layer 81 of component source wafer 40. Typically, component source wafers 40 are smaller than patterned substrates 10.

Components 30 can be any transfer printable structure, for example including any one or more of a wide variety of active or passive (or active and passive) components 30. Components can be any one or more of integrated devices, integrated circuits (such as CMOS circuits), light-emitting diodes, photodiodes, sensors, electrical or electronic devices, optical devices, opto-electronic devices, magnetic devices, magneto-optic devices, magneto-electronic devices, and piezo-electric device, materials or structures. Components 30 can comprise electronic component circuits 34 that operate component 30. Component 30 can be responsive to electrical energy, to optical energy, to electromagnetic energy, or to mechanical energy, for example. In some embodiments, an acoustic wave transducer 94 comprises component 30. In some embodiments, two acoustic wave transducers 94 both comprise component 30, for example when used in an acoustic wave filter or sensor.

Components 30 formed or disposed in or on component source wafers 40 can be constructed using integrated circuit, micro-electro-mechanical, or photolithographic methods for example. Components 30 can comprise one or more different component materials, for example non-crystalline (e.g., amorphous), polycrystalline, or crystalline semiconductor materials such as silicon or compound semiconductor materials or non-crystalline or crystalline piezo-electric materials. In some embodiments, component 30 comprises a layer of piezo-electric material disposed over or on a layer of dielectric material, for example an oxide or nitride such as silicon dioxide or silicon nitride.

In certain embodiments, components 30 can be native to and formed on sacrificial portions 82 of component source wafers 40 and can include seed layers for constructing crystalline layers on or in component source wafers 40. Components 30, sacrificial portions 82, anchors 50, and component tethers 52 can be constructed, for example using photolithographic processes. Components 30 can be micro-devices having at least one of a length and a width less than or equal to 200 microns, less than or equal to 100 microns, less than or equal to 50 microns, less than or equal to 25 microns, less than or equal to 15 microns, less than or equal to 10 microns, or less than or equal to five microns, and alternatively or additionally a thickness of less than or equal to 50 microns, less than or equal to 25 microns, less than or equal to 15 microns, less than or equal to 10 microns, less than or equal to five microns, less than or equal to two microns, or less than or equal to one micron. Components 30 can be unpackaged dice (each an unpackaged die) transferred directly from native component source wafers 40 on or in which components 30 are constructed to patterned substrate 10.

Anchors 50 and component tethers 52 can each be or can comprise portions of component source wafer 40 that are not sacrificial portions 82 and can include layers formed on component source wafers 40, for example dielectric or metal layers and for example layers formed as a part of photolithographic processes used to construct or encapsulate components 30.

Patterned substrate 10 can be any destination substrate or target substrate with substrate posts 12 to which components 30 are transferred (e.g., micro-transfer printed), for example flat-panel display substrates, printed circuit boards, or similar substrates can be used in various embodiments. Patterned substrates 10 can be, for example substrates comprising one or more of glass, polymer, quartz, ceramics, metal, and sapphire. Patterned substrates 10 can be semiconductor substrates (for example silicon) or compound semiconductor substrates.

Figure 17A:
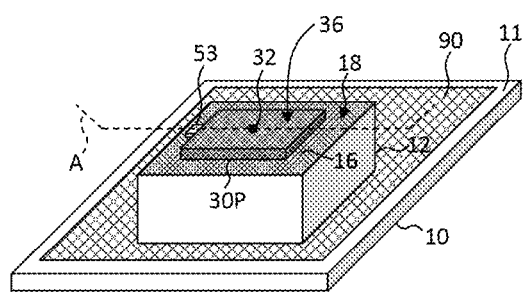
FIG. 17A is a perspective and FIG. 17B is a corresponding cross section taken along cross section line A of FIG. 17A of a component micro-transfer printed to a patterned substrate where the component does not extend over an edge of a substrate post according to illustrative embodiments of the present disclosure.
Figure 17B:
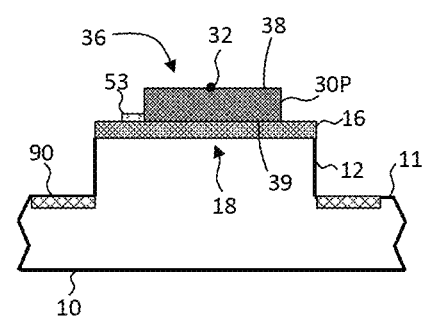

In some embodiments, a layer of adhesive 16, such as a layer of resin, polymer, or epoxy, either curable or non-curable, adheres components 30 onto substrate posts 12 of patterned substrate 10 and can be disposed, for example by coating or lamination (e.g., as shown in FIGS. 17A and 17B discussed below). In some embodiments, a layer of adhesive 16 is disposed in a pattern, for example between electrical substrate post electrodes 64 on a substrate post 12 or component electrodes 61 on a component 30. In some embodiments, a layer of adhesive 12 is disposed in a pattern, for example over substrate post electrodes 64 to improve contact between connection posts 67 extending from a component 30 and substrate posts electrodes 64. A layer of adhesive can be disposed using inkjet, screening, or photolithographic techniques, for example. In some embodiments, a layer of adhesive 16 is coated, for example with a spray or slot coater, and then patterned, for example using photolithographic techniques. A patterned layer of adhesive can provide substrate posts 12, for example by coating and imprinting or photolithographic processing or by inkjet deposition. In some embodiments, solder 68 (e.g., as shown in FIGS. 22C and 22D and discussed below) is pattern-wise coated and disposed on substrate post 12 or component electrodes 61, for example by screen printing, and improves an electrical connection between a component 30 and an electrical conductor on a substrate post 12.

In some embodiments, a substrate post 12 is any protuberance or protrusion extending from a substrate surface 11 of patterned substrate 10. In some embodiments, substrate posts 12 have a substantially rectangular cross section. In some embodiments, substrate posts 12 have non-rectangular cross sections, such as circular or polygonal cross sections for example. In some embodiments, substrate posts 12 have a flat surface on a distal end of each substrate post 12 in a direction parallel to the patterned substrate 10 surface, e.g., can be a mesa. In some embodiments, substrate posts 12 can comprise any material to which components 30 can be adhered. A substrate post 12 can be a pedestal or post and can comprise the same material as patterned substrate 10 or can comprise a different material from patterned substrate 10 or component 30. For example, in some embodiments, substrate posts 12 comprise the same material (e.g., silicon or other semiconductor materials) as patterned substrate 10 and are patterned in substrate 10, for example by patterned etching using photoresists and other photolithographic processes, stamping, or molding. In some embodiments, substrate posts 12 are formed on patterned substrate 10 (e.g., by coating). In some embodiments, substrate posts 12 comprise different materials from substrate 10, for example by coating a material in a layer on substrate 10 and pattern-wise etching the coated layer to form substrate posts 12.

For example, a substrate post 12 can be or comprise a dielectric material, such as an oxide (e.g., silicon dioxide) or nitride (e.g., silicon nitride) or polymer, resin, or epoxy and can be organic or inorganic. Substrate posts 12 can be a cured resin and can be deposited in an uncured state and cured or patterned before components 30 are micro-transfer printed to substrate posts 12 or cured after components 30 are micro-transfer printed to substrate posts 12. Substrate posts 12 can be electrically conductive and comprise, for example, metals or metallic materials or particles. Substrate posts 12 can be formed using photolithographic processes, for example substrate posts 12 can be formed by coating a resin over a substrate and then patterning and curing the resin using photolithographic processes (e.g., coating a photoresist, exposing the photoresist to patterned radiation, curing the photoresist, etching the pattern to form substrate posts 12 and patterned substrate 10, and stripping the photoresist). Substrate posts 12 can be constructed by inkjet deposition or imprinting methods, for example using a mold, and can be imprinted structures.

Patterned electrical conductors (e.g., wires, traces, or electrodes (e.g., electrical contact pads) such as those found on printed circuit boards, flat-panel display substrates, and in thin-film circuits) can be formed on any combination of components 30, substrate posts 12, and patterned substrate 10, and any one can comprise electrodes (e.g., electrical contact pads) that electrically connect to components 30, for example as described further below with respect to FIGS. 21-23. Such patterned electrical conductors and electrodes (e.g., contact pads) can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on patterned substrate 10 or substrate posts 12, or both.

According to some embodiments, stamp 20 can pick up every component 30 on component source wafer 40, as shown in FIG. 3A. In some embodiments, stamp 20 picks up a subset of components 30 on component source wafer 40. In some embodiments, stamp 20 picks up every component 30 on component source wafer 40 within a simple closed curve 46 (shown in FIG. 1A) on component source wafer 40, for example every component 30 within a rectangle on component source wafer 40. In some embodiments, stamp 20 picks up a subset of components 30 on component source wafer 40 within a simple closed curve 46, for example every other component 30 within a rectangle on component source wafer 40. Thus, in some embodiments, the subset of picked-up stamp components 30S forms a regular rectangular array, for example matching an array or sub-array of components 30 on component source wafer 40 or a subset of such components 30.

Figure 15:
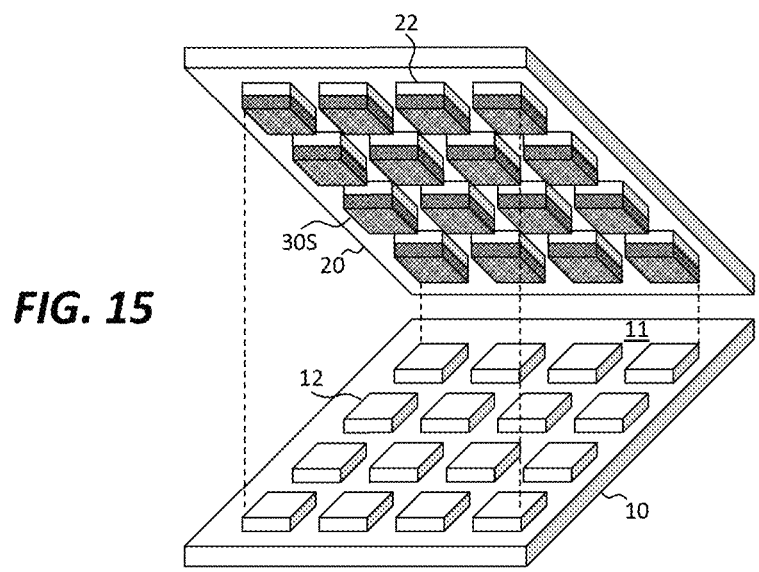
FIGS. 15-16 are perspectives of a stamp populated with components before micro-transfer printing the components to a patterned substrate according to illustrative embodiments of the present disclosure.
Figure 16:
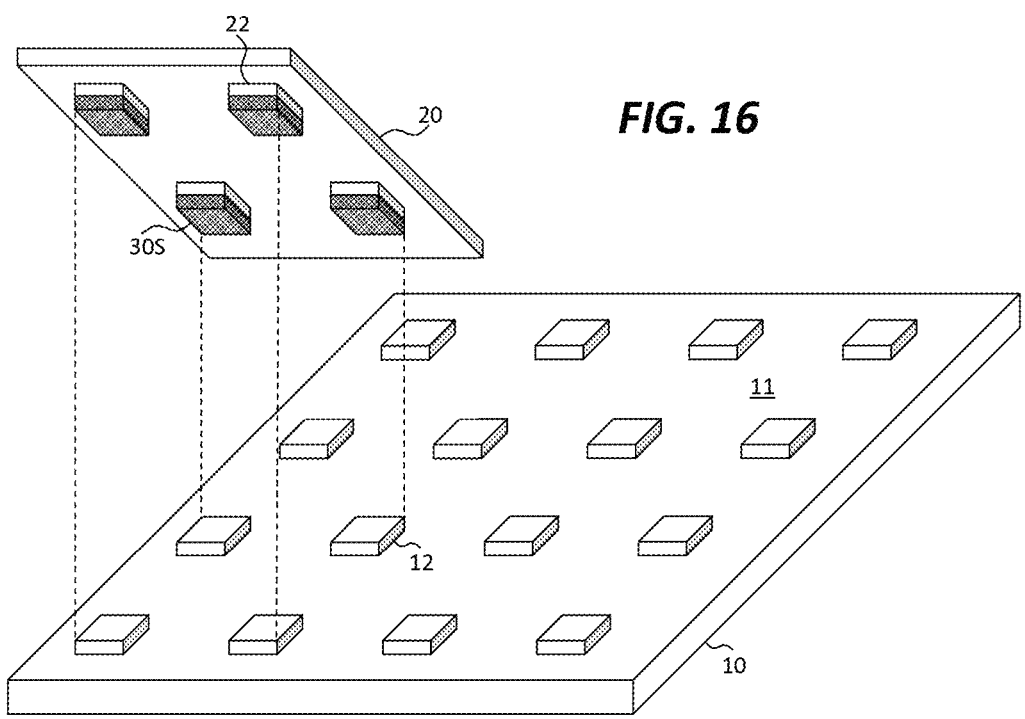

In some embodiments, referring to FIGS. 15 and 16, all of picked-up stamp components 30S are micro-transfer printed so that, after a single micro-transfer printing, no stamp components 30S are adhered to stamp 20, for example to stamp posts 22. As shown in FIG. 15, a stamp component 30S is transfer printed to each of substrate posts 12 on patterned substrate 10 and all of stamp components 30S on stamp posts 22 of stamp 20 are micro-transfer printed. As shown in FIG. 16, only a subset of substrate posts 12 on patterned substrate 10 receive a stamp component 30S from stamp posts 22 of stamp 20 although all of stamp components 30S are micro-transfer printed. The subset of substrate posts 12 can be adjacent neighbors to each other, for example as shown in FIGS. 6B, 8B, 10, 12, 18 and 19, or the subset of substrate posts 12 can be sampled within a patterned substrate 10 area.

In some embodiments, only a subset of components 30 adhered to stamp 20 are transferred to substrate posts 12 in a micro-transfer print step so that stamp components 30S not in the subset remain adhered to stamp posts 22 of stamp 20 (e.g., as shown in FIGS. 4A-12). The subset of components 30 that are micro-transfer printed can be adjacent to each other on stamp 20 and substrate posts 12 so that no components 30 not in the subset are between micro-transfer printed components 30. In some embodiments, the subset of components 30 that are micro-transfer printed are not all adjacent to each other on stamp 20 so that components 30 not in the subset are between the micro-transfer printed components 30, for example as illustrated in FIGS. 6B, 10, and 11, in which every other component 30 on stamp 20 is transferred to substrate posts 12 in each micro-transfer print step. Micro-transfer printed components 30 on substrate posts 12 can be adjacent even if they are not adjacent on stamp 20, as illustrated in FIGS. 6B, 10, and 11 for example, so that components 30 on substrate posts 12 and patterned substrate 10 extend over a greater area than components 30 did on component source wafer 40 (where the area can be the convex hull of components 30 over the respective surface). Thus, in some such embodiments, picked-up stamp components 30S on stamp 20 are separated by a distance in one or two dimensions by a stamp component separation distance 24 and substrate posts 12 are separated by a distance in one or two dimensions by a substrate post separation distance 14 that is greater than stamp component separation distance 24, for example as shown in FIGS. 4A and 4B.

As shown, substrate posts 12 can form a regular rectangular array of substrate posts 12 on patterned substrate 10, but can, in general, be arranged in any desired pattern, including, for example, polygons curves, circles, or a random arrangement.

In some embodiments, for example as shown in FIGS. 17A and 17B (and FIGS. 6B, 8B, 10, and 12), a micro-transfer printed substrate post component 30P does not extend over an edge of a substrate post 12 on substrate surface 11 of patterned substrate 10. For example, a substrate post component 30P can have a component area 36 over the extent of substrate post 12 equal to or smaller than a substrate post area 18 of a surface of substrate post 12 on which substrate post component 30P is micro-transfer printed. An edge of substrate post component 30P can be aligned with an edge of a substrate post 12 on which substrate post component 30P is micro-transfer printed, as shown in FIGS. 6B, 8B, 10, and 12, or can be spatially set back from a substrate post 12 edge, as shown in FIGS. 17A and 17B.

Referring to FIGS. 17A and 17B, substrate post components 30P can be adhered to substrate posts 12 with a patterned layer of adhesive 16, for example coated on substrate post 12, or provided as a lamination, or by van der Waals forces. As noted above, components 30 can comprise active component circuits 34. Patterned substrate 10 can comprise substrate circuits 90 formed in, on, or disposed on patterned substrate 10 that are electrically connected to the active circuits in components 30, as described further below.

In some embodiments, any one or all of a component center, centroid, or center of mass (any one or more of which is referred to as component center 32) of component 30 can be disposed over substrate post 12 so that substrate post 12 is between component center, component centroid, or component center of mass 32 and patterned substrate 10. As used herein, component center 32 refers to any one or more of a component center, component centroid, and component center of mass. It is understood that in a given arrangement, a component center of mass may not be in the same location as a center or centroid of the component. In some embodiments, this arrangement can provide a robust mechanical structure that can help keep component 30 adhered to substrate post 12, especially when exposed to mechanical stress, such as vibration.

FIGS. 17A and 17B illustrate a substrate post component 30P that is disposed completely within a substrate post area 18 of a surface of a substrate post 12. In some embodiments, referring to FIGS. 18A and 18B, a micro-transfer printed substrate post component 30P on a substrate post 12 on substrate surface 11 of patterned substrate 10 extends over an edge of substrate post 12 in two dimensions. Printed structure 99 comprises a patterned substrate 10 comprising a substrate surface 11 and a substrate post 12 protruding from substrate surface 11. Substrate post 12 comprises a substrate post material. Component 30 has a component top side 38 and a component bottom side 39 opposite component top side 38. Component bottom side 39 is adhered to substrate post 12 and extends over at least one edge of substrate post 12. In some embodiments, a component 30 comprises a component material different from a substrate post material. Component 30 can comprise a separated or broken (e.g., fractured) component tether 53. In some embodiments, a component 30 is adhered or attached to a patterned substrate 10 and substrate post 12 only by component bottom side 39.

Figure 19A:
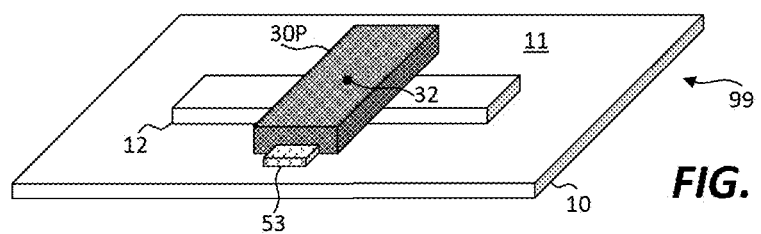
FIG. 19A is a perspective and FIGS. 19B and 19C are corresponding micrographs of a component micro-transfer printed to a patterned substrate where the component extends over the edges of a substrate post in one direction but not in an orthogonal direction according to illustrative embodiments of the present disclosure.
Figure 19B:
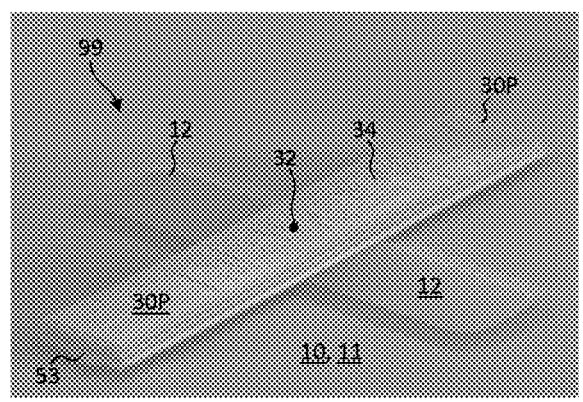
Figure 19C:
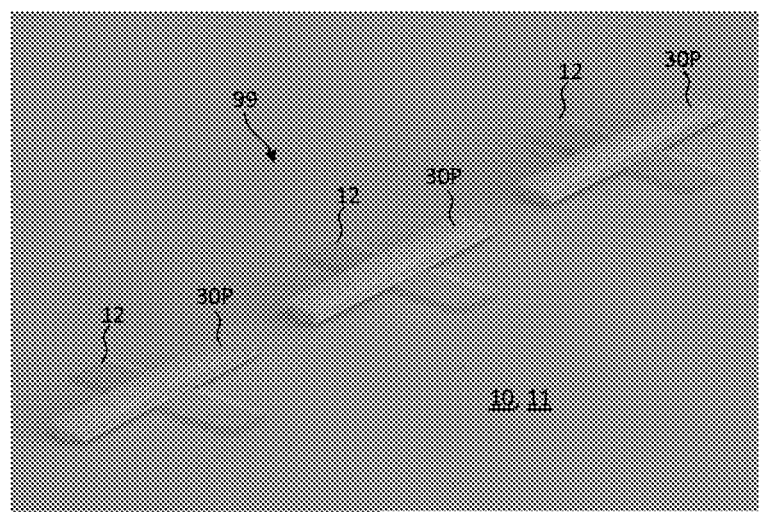

In some embodiments, referring to FIGS. 19A-19C, a micro-transfer printed substrate post component 30P on a substrate post 12 extends over an edge of substrate post 12 in one dimension or direction and does not extend over an edge of substrate post 12 in an orthogonal dimension or direction. In such embodiments, for example, a substrate post 12 can form a ridge with a length greater than a width that extends in a length direction beyond a substrate post component 30P micro-transfer printed on substrate post 12 with component center 32 disposed over substrate post 12. Thus, according to some micro-transfer printed structure embodiments, substrate post component 30P extends over one side of substrate post 12, extends over two sides of substrate post 12, extends over four sides of substrate post 12, or extends over opposing sides of substrate post 12.

As shown in FIGS. 19B and 19C, a component 30 (substrate post component 30P) having a component circuit 34 has been micro-transfer printed onto a substrate post 12 on substrate surface 11 of patterned substrate 10 with component center 32 disposed over substrate post 12. The component 30 has been electrically operated. In some embodiments, referring still to FIGS. 19B and 19C, by disposing a substrate post component 30P with an edge extending over an edge of substrate post 12, the extending portion of substrate post component 30P can vibrate, for example operating in an acoustic wave transducer 94, for example in a bulk or surface acoustic wave filter or sensor, while a center portion of substrate post component 30P is adhered to substrate post 12 to support substrate post component 30P. In some embodiments, component 30 can comprise acoustic mirrors having a speed of sound transmission different from the speed of sound transmission in other component 30 material. Acoustic mirrors can be, for example, disposed on component top side 38, component bottom side 39, or both. In some embodiments, such acoustic wave mirrors are unnecessary, since the length-wise ends of component 30 are not adhered to any structure and are free to vibrate without disturbing other structures, for example without disturbing patterned substrate 10, thereby providing a simpler and more efficient acoustic wave transducer 94 structure (e.g., in an acoustic wave filter or sensor) that is easier and less expensive to construct.

Figure 20A:
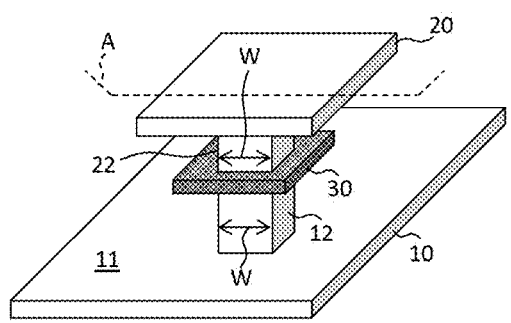
FIG. 20A is a perspective and FIG. 20B is a corresponding cross section taken along cross section line A of FIG. 20A of a stamp micro-transfer printing a component to a patterned substrate where a stamp post has an area substantially equal to an area of a substrate post to which the component is micro-transfer printed according to illustrative embodiments of the present disclosure.
Figure 20B:
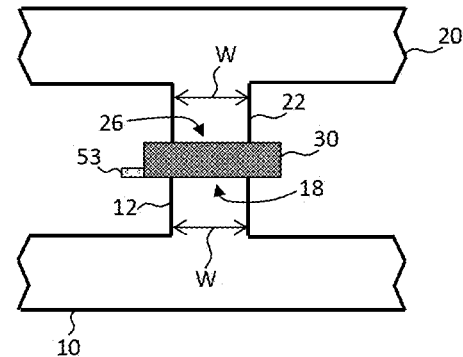

In some embodiments, components 30 are adhered to a stamp post 22 of a stamp 20 and transferred to a substrate post 12, for example by van der Waals forces. The adhesion between a component 30 and a surface of stamp post 22 can be dependent, at least in part, on the area of component 30 that is in contact with stamp post 22, for example a distal end of stamp post 22. Similarly, the adhesion between a surface of a substrate post 12 and a component 30 micro-transfer printed to substrate post 12 can be dependent, at least in part, on the area of component 30 that is in contact with substrate post 12, for example a distal end of substrate post 12. In some embodiments, in order to micro-transfer print a component 30 from a stamp post 22 to a substrate post 12, an adhesion between component 30 and substrate post 12 must be greater than an adhesion between component 30 and stamp post 22. Thus, it can be helpful if the area of substrate post 12 surface to which component 30 is micro-transfer printed is at least as large, or larger than, the area of stamp post 22 from which component 30 is micro-transfer printed. In some embodiments, in which substrate post area 18 of substrate post 12 is larger than component area 36 of component 30, the difference in stamp post area 26 and substrate post area 18 is not necessarily significant, since an adhesion area for each can be the same (component area 36 of component 30), for example as shown in FIGS. 17A, 17B. However, in a case in which component 30 extends over an edge of substrate post 12 and is likely to have a component area 36 greater than substrate post area 18, it can be helpful to employ a stamp post 22 with a stamp post area 26 in contact with component 30 that is equal to or less than substrate post area 18 that is in contact with component 30 during micro-transfer printing, so that a stamp 20 adhesion area in contact with component 30 is equal to or less than substrate post 12 adhesion area in contact with component 30. Moreover, if component 30 extends over an edge of substrate post 12 and a stamp post 22 likewise extends over substrate post 12 edge, when component 30 is transfer printed to substrate post 12, stamp 20 can press against component 30 on a portion of component 30 that is not supported by substrate post 12, possibly bending or breaking component 30. Referring to FIGS. 20A and 20B, stamp 20 has a stamp post 22 with a stamp post area 26 on the distal end of stamp post 22 that is substantially equal (at least within manufacturing tolerances) to substrate post area 18 of substrate post 12. Thus, the area of component 30 in contact with stamp post 22 is equal to the area of component 30 in contact with during micro-transfer printing substrate post 12 (substrate post area 18). Accordingly, in some embodiments, stamp 20 comprises a stamp post 22 and stamp post 22 has a dimension W (e.g., a width) substantially the same as a corresponding dimension W of substrate post 12.

Figure 21:
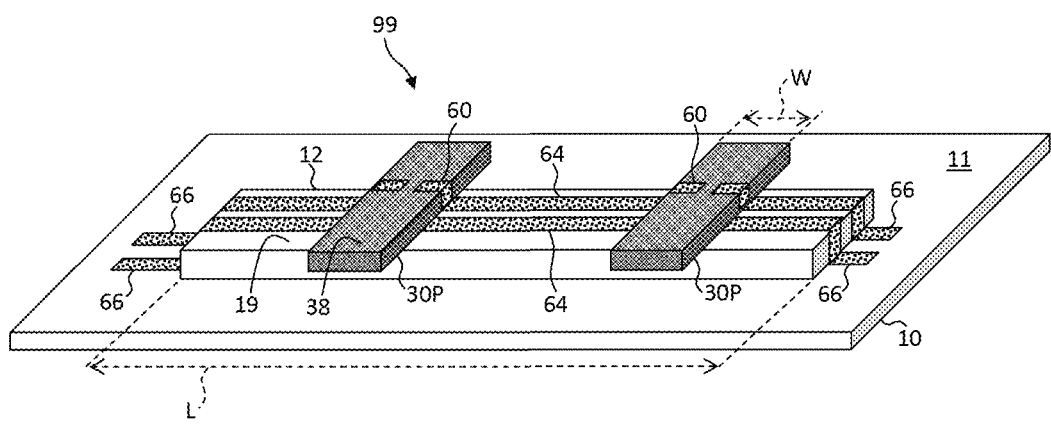
FIG. 21 is a perspective of two components micro-transfer printed to a common substrate post according to illustrative embodiments of the present disclosure.

In some embodiments, a substrate post 12 extends over substrate surface 11 of patterned substrate 10 to form a ridge that has a length greater than a dimension of component 30, for example a substrate post length along substrate surface 11 greater than a width W of component 30, as shown in FIG. 21, in which the length L of component 30 is oriented orthogonally to the length of substrate post 12. In some such embodiments, more than one component 30 can be printed on a single ridge or substrate post 12. Thus, if a component 30 is a first component 30 adhered to a substrate post 12, printed structure 99 can comprise a second component 30 adhered to substrate post 12. The ridge (substrate post 12) can have a substrate post top side 19 opposite patterned substrate 10 to which a component bottom side 39 of a component 30 is adhered. In some embodiments, a substrate post 12 extends in a straight line and has a rectangular cross section parallel to surface 11 of patterned substrate 10. In some embodiments, a substrate post 12 extends in one or more directions and can form a square, rectangle, curve, circle, ellipse, polygon, U-shape, X-shape, or other arbitrary collection of connected line segments or curved segments over substrate surface 11. In some embodiments, a component 30 is micro-transfer printed to two or more substrate posts 12.

Referring further to FIG. 21, a printed structure 99 in accordance with some embodiments can comprise electrical conductors disposed on substrate surface 11 of patterned substrate 10, forming a substrate electrode 66. In some embodiments, electrical conductors can be disposed on substrate post 12, forming a substrate post electrode 64. In some embodiments, substrate post 12 can be electrically conductive and can conduct one or more of electrical power, ground, and signals. Substrate electrodes 66 can be electrically connected to substrate post electrodes 64 and substrate post electrodes 64 can be electrically connected to components 30, for example through component electrodes 61 on components 30, to provide electrical power and control signals to operate components 30. Thus, a printed structure 99 according to some embodiments, can comprise one or more substrate post electrodes 64 on substrate post top side 19. A component 30 can be electrically connected to the one or more substrate post electrodes 64.

Figure 18A:
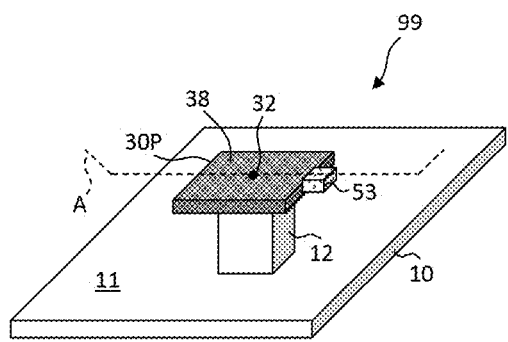
FIG. 18A is a perspective and FIG. 18B is a corresponding cross section taken along cross section line A of FIG. 18A of a component micro-transfer printed to a patterned substrate where the component extends over the edges of a substrate post according to illustrative embodiments of the present disclosure.
Figure 18B:
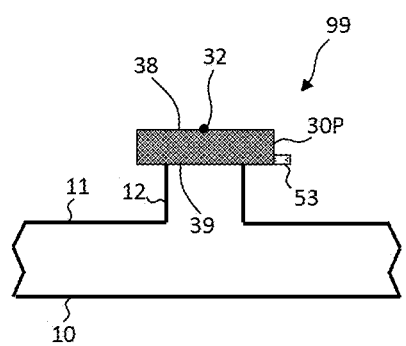
Figure 22A:
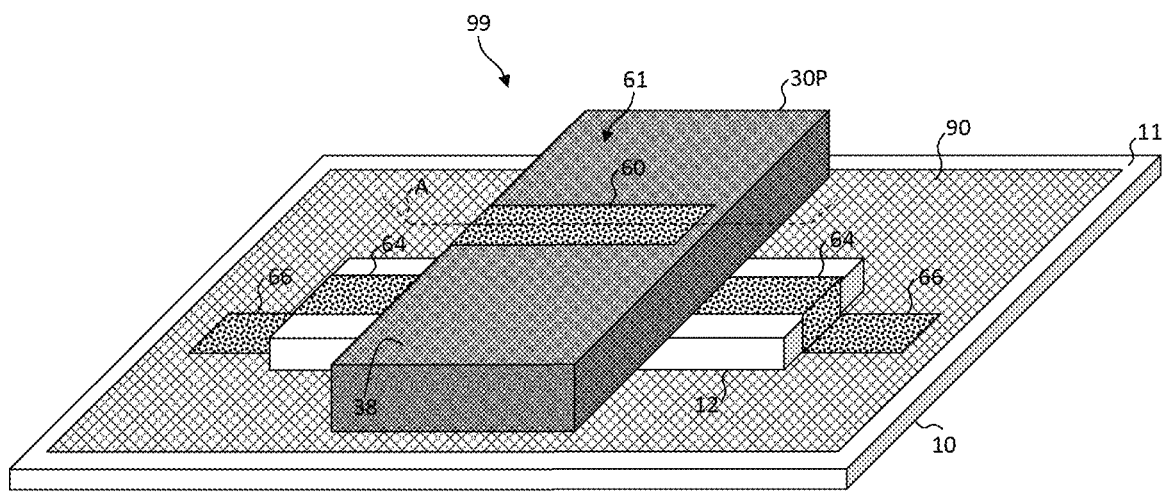
FIG. 22A is a perspective and FIG. 22B is a corresponding cross section taken along cross section line A of FIG. 22A of a component, substrate post, substrate circuit, and patterned substrate electrodes according to illustrative embodiments of the present disclosure.
Figure 22B:
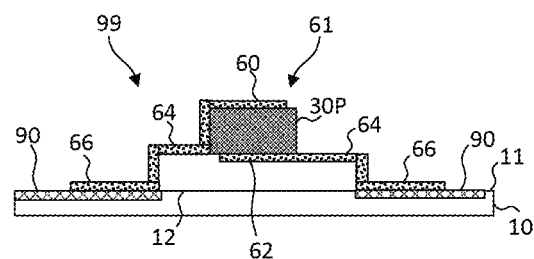
Figure 22C:
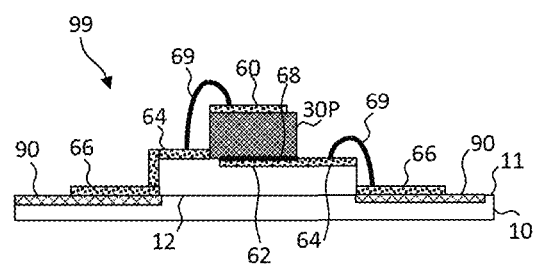
FIGS. 22C-22D are cross sections of a component, substrate post, substrate circuit, and patterned substrate wire bonds according to illustrative embodiments of the present disclosure.
Figure 22D:
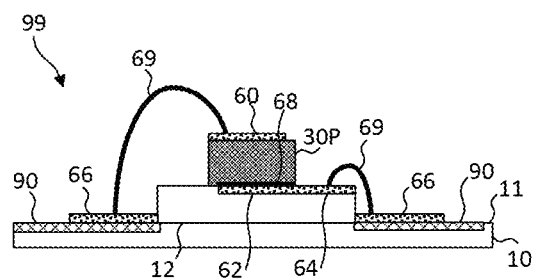

In some embodiments of the present invention, components 30 can have one or more component electrodes 61 on a component top side 38 of components 30 opposite substrate post 12 (component top electrodes 60) or components 30 can have one or more component electrodes 61 on a component bottom side 39 of components 30 (e.g., as shown in FIG. 18B) adjacent to substrate post 12 (component bottom electrodes 62), as shown in FIGS. 22A and 22B, or both. Component top and bottom electrodes 60, 62 can be electrically connected to substrate post electrodes 64 and then to substrate electrodes 66. In some embodiments of the present invention, component bottom electrodes 62 can be congruent with substrate post electrodes 64. Component top and bottom electrodes 60, 62 can be referred to collectively or individually as component electrodes 61.

Referring to FIG. 21, two components 30 each having two component top electrodes 60 electrically connected to substrate post electrodes 64 are disposed on substrate post 12. Components 30 are electrically connected in series through component top electrodes 60 but can be connected in any desired fashion or combination of series and parallel electrical connections in various embodiments. Each component 30 is also electrically connected through a component bottom electrode 62 (not visible in FIG. 21) to a substrate post electrode 64. Substrate post electrodes 64 are electrically connected to substrate electrodes 66 on patterned substrate 10.

Figure 23A:
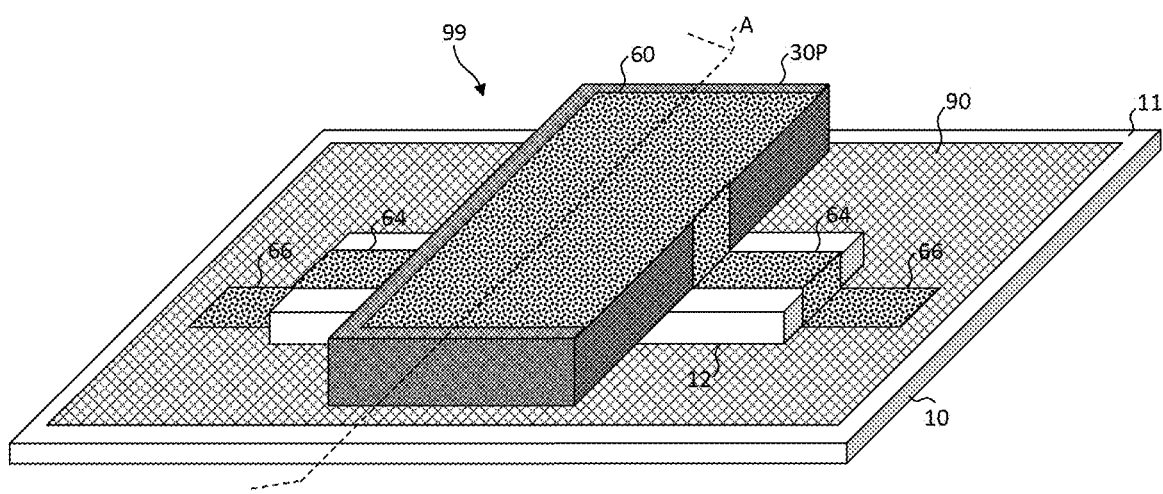
FIG. 23A is a perspective and FIG. 23B is a corresponding cross section taken along cross section line A of FIG. 23A of extensive component electrodes with a substrate post, substrate circuit, and patterned substrate electrodes according to illustrative embodiments of the present disclosure.
Figure 23B:
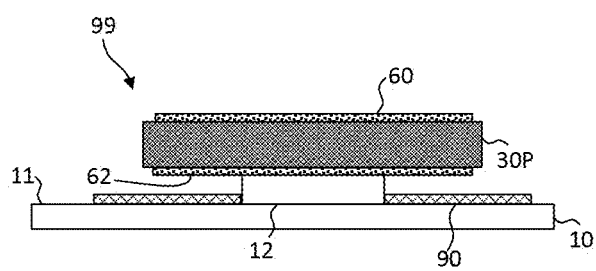

In some embodiments illustrated with the perspectives of FIGS. 22A, 23A and cross sections of FIGS. 22B, 23B taken along cross section lines A, a component 30 disposed on substrate post 12 has a single component top electrode 60 and a single component bottom electrode 62, each electrically connected on opposite sides of substrate post 12 to a substrate post electrode 64. Substrate post electrodes 64 are electrically connected to substrate electrodes 66. In FIGS. 22A and 22B, substrate electrodes 66 are electrically connected to a substrate circuit 90 on patterned substrate 10. Substrate circuit 90 can be an electronic circuit that electrically controls, operates, provides signals to, or receives signals from component 30 through substrate electrodes 66, substrate post electrodes 64, and component top and bottom electrodes 60, 62.

The embodiments illustrated in FIGS. 21, 22A, and 22B have component top electrodes 60 electrically connected to component 30 through a component electrode 61 or other electrical connection that is relatively small compared to a component surface extent of component 30 (component area 36, for example as shown in FIGS. 17A, 17B). Such embodiments can be useful in applications in which component 30 is responsive to electrical currents provided by component top and bottom electrodes 60, 62, for example when components 30 comprise electronic or opto-electronic devices or circuits. In the embodiments illustrated in FIGS. 23A, 23B, component top and bottom electrodes 60, 62, extend over much or substantially all of the top and bottom surfaces of component 30, respectively (e.g., component top side and component bottom side 38, 39, for example as shown in FIG. 18B). Such embodiments can be useful in applications in which component 30 is responsive to an electrical field provided by component top and bottom electrodes 60, 62, for example when components 30 comprise piezo-electric material. Structures in accordance with FIGS. 23A and 23B have been constructed and demonstrated to have resonant modes at desirable frequencies.

Figure 25A:
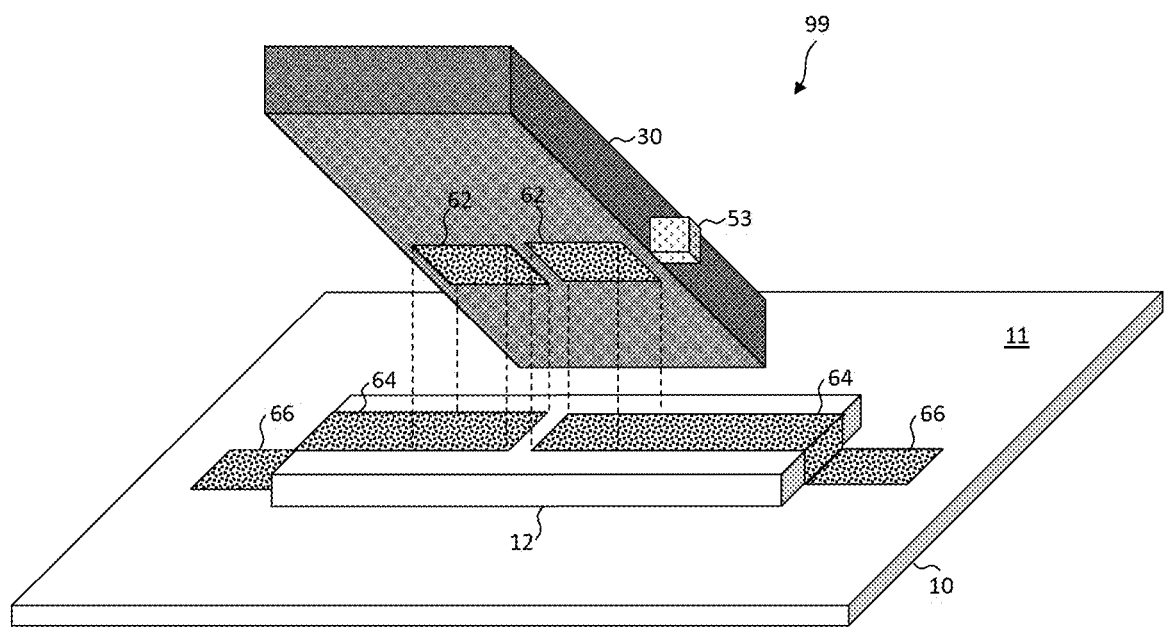
FIGS. 25A, 25B and 26 are perspectives of a component, substrate post(s), and electrodes according to illustrative embodiments of the present disclosure.
Figure 25B:
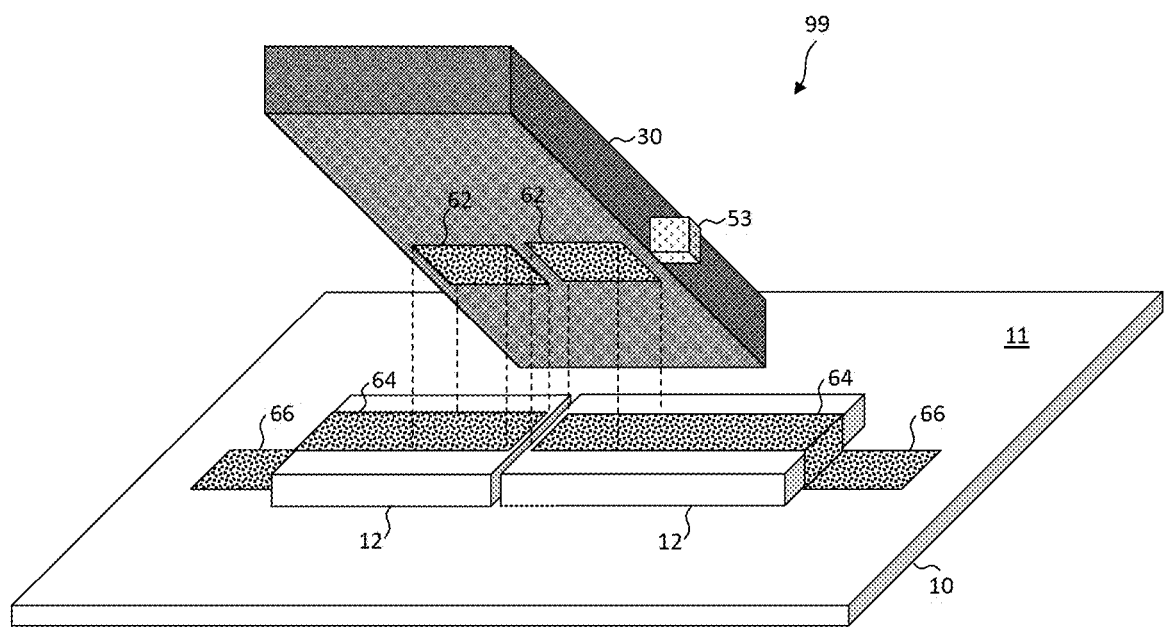
Figure 26:
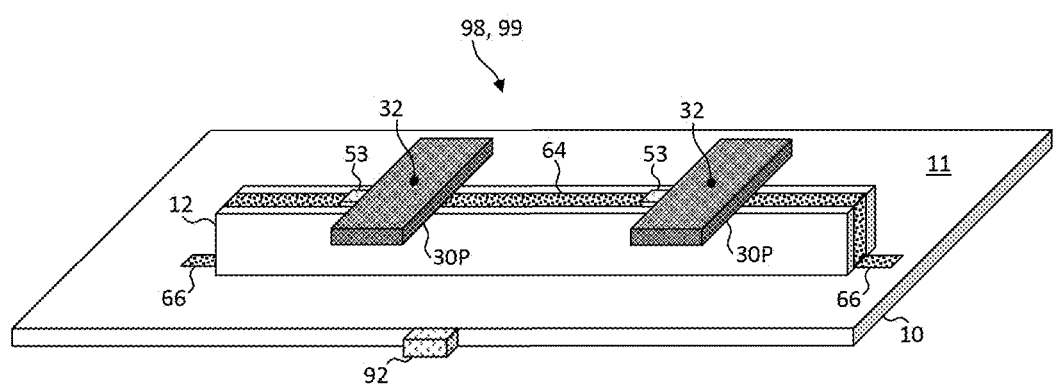

FIGS. 21, 22A and 22B, 23A and 23B, 25A and 25B, and 26, illustrate a variety of embodiments in which any combination of one, two, or more component top electrodes 60, component bottom electrodes 62, substrate post electrodes 64, and substrate electrodes 66 are used to provide power and/or ground connections and/or provide and receive electrical signals to operate, control, or respond to components 30. Components 30 can each be disposed on a single substrate post 12 (e.g., as shown in FIGS. 19A-19C), multiple components 30 can be disposed on a single substrate post 12 (e.g., as shown in FIGS. 21 and 26), or a component 30 can be disposed on multiple substrate posts 12 (not shown). In any case, components 30 can operate individually or can be electrically connected to form a circuit.

In some embodiments, referring to FIG. 22C, printed structures 99 comprise solder 68 disposed between a substrate post 12 and a component 30 to improve an electrical connection between a component bottom electrode 62 and a substrate post electrode 64. In a method in accordance with certain embodiments, solder 68 is heated and cooled to electrically connect a substrate post electrode 64 on substrate post 12 to a component bottom electrode 62 on a component 30.

As also shown in FIG. 22C, in some embodiments, a component top electrode 60 is wire bonded to a substrate post electrode 64 or a substrate electrode 66 with a wire bond 69 wire and a method comprises wire bonding a wire to electrically connect a component top electrode 60 on component 30 to a substrate post electrode 64 or to a substrate electrode 66 (e.g., as shown in FIG. 22D). A wire bond 69 can also electrically connect a substrate post electrode 64 to a substrate electrode 66. Thus, printed structures 99, according to some embodiments, comprise a wire bond 69 electrically connected to at least one of the one or more component top electrodes 60 or comprise a substrate post electrode 64 disposed on a substrate post 12 and a wire bond 69 electrically connected to substrate post electrode 64, or both.

Figure 23C:
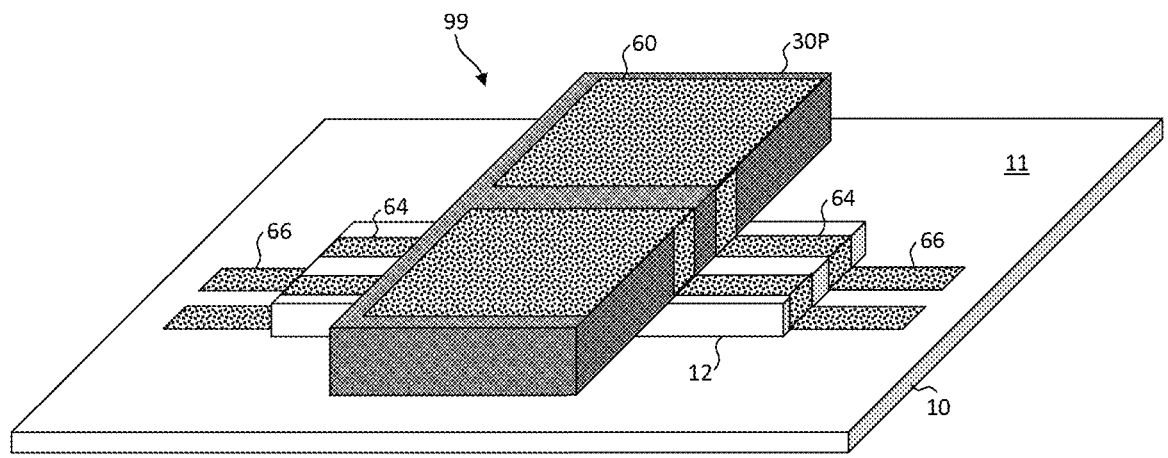
FIGS. 23C-23E are perspectives of extensive component electrodes with a substrate post and patterned substrate electrodes according to illustrative embodiments of the present disclosure.
Figure 23D:
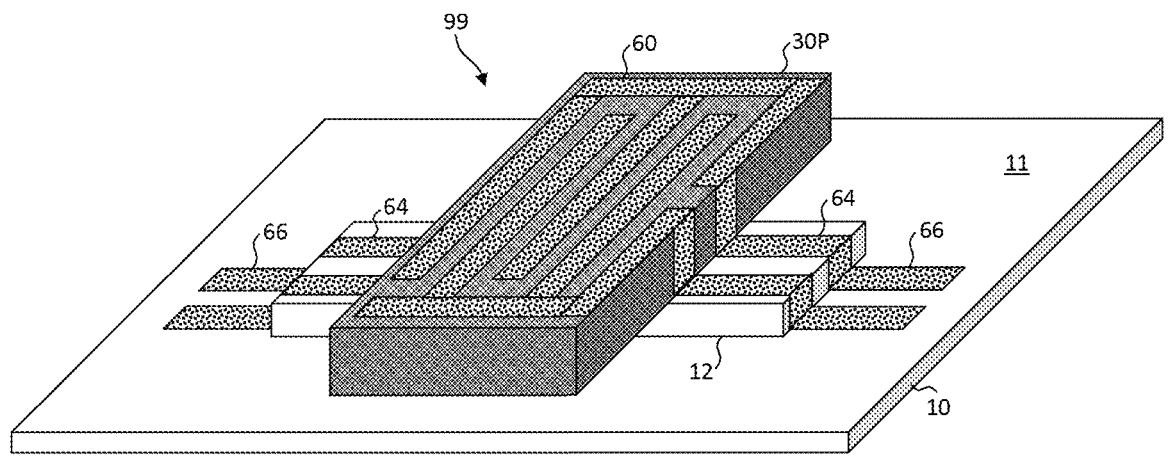
Figure 23E:
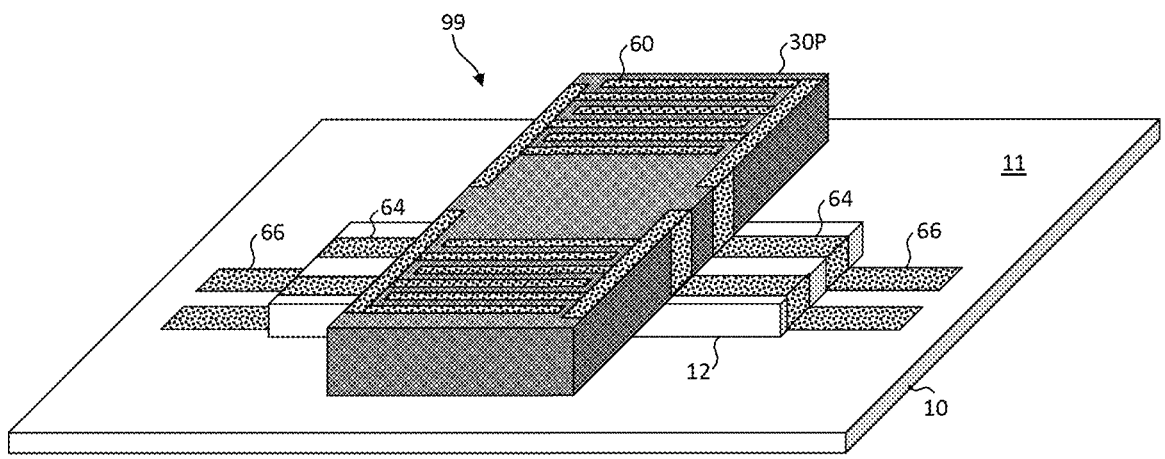

In some embodiments, component 30 comprises a piezo-electric material. Component 30 can be at least a portion of a piezo-electric transducer or piezo-electric resonator. For example, component 30 can be used in an acoustic wave filter or sensor, such as a bulk acoustic wave filter or sensor or a surface acoustic wave filter or sensor. For example, in some embodiments in which component top and bottom electrodes 60, 62 extend over a substantial portion of component top and bottom sides 38, 39 of component 30, respectively, component top and bottom electrodes 60, 62 can provide an electrical field in component 30 that, when controlled at a suitable frequency can cause resonant mechanical vibrations in component 30 such that the component and electrodes serve as an acoustic wave transducer 94. In some embodiments, a component top electrode 60 and a component bottom electrode 62 are provided on component top and bottom sides 38, 39, respectively, to form a two-electrode acoustic wave filter (e.g., as shown in the perspective of FIG. 23A and corresponding cross section of FIG. 23B taken across cross section line A of FIG. 23A). In some embodiments, two component top electrodes 60 and two component bottom electrodes 62 are provided on component top and bottom sides 38, 39, respectively, to form a four-electrode acoustic wave filter, for example as shown in FIG. 23C. Two component top electrodes 60 can be interdigitated, for example as shown in FIG. 23D, or two component bottom electrodes 62 can be interdigitated, or both. FIG. 23E illustrates another arrangement of component top and bottom electrodes 60, 62. In some embodiments, because one or more ends of component 30 are not adhered to a surface and are free to move, resonant frequencies of mechanical vibration in component 30 can be controlled and a high quality (high Q) acoustic wave transducer 94 (or filter) is provided. Various arrangements and patterns of component top and bottom electrodes 60, 62 can be used in various embodiments and can implement bulk or surface acoustic wave transducers 94 (e.g., in bulk or surface acoustic wave filters, respectively) with a corresponding variety of resonant modes in component 30 using two, three, four or more component electrodes 61. A printed structure 99 corresponding to FIGS. 19A-19C and 22A-22B has been constructed and operated.

Referring to FIGS. 24A-24C, in some embodiments according to the present invention, components 30 can have a variety of shapes and form factors, for example a rectangular form factor commonly used for integrated circuits, as shown in FIG. 24A. In some embodiments, for example where components 30 are used in acoustic transducers, various component 30 shapes can be useful, for example circular or disc-shaped (FIG. 24B) or x-shaped, cross-shaped, or the shape of a plus sign (FIG. 24C). In general, according to some embodiments, components 30 can have any useful shape in either two dimensions or three dimensions. Such shapes can be useful, for example in enabling vibrational resonance modes for acoustic devices.

Referring to FIGS. 25A and 25B, an exploded view of a single micro-transfer printed component 30 with a separated or broken (e.g., fractured) component tether 53 illustrates component bottom electrodes 62 aligned with substrate post electrodes 64 on substrate post 12 (shown in FIG. 25A) or multiple substrate posts 12 (shown in FIG. 25B). Substrate post electrodes 64 are electrically connected to substrate electrodes 66 on substrate surface 11 of patterned substrate 10. FIG. 26 illustrates two of the micro-transfer printed components 30 with separated or broken (e.g., fractured) component tethers 53 shown in FIGS. 25A, 25B disposed on a single substrate post 12 with a single substrate post electrode 64 electrically connected to a substrate electrode 66 on substrate surface 11 on patterned substrate 10.

Referring to FIG. 26, in some embodiments, a printed structure 99 includes a micro-transfer printable module structure 98 (also referred to as module 98) that can be printed or placed on a destination substrate such as a printed circuit board (PCB). Such a module 98 can be constructed on, for example, a semiconductor wafer with sacrificial portions 82 and anchors 50 and module tethers 92 connecting modules to anchors 50 (e.g., similar to FIG. 1B with component tethers 52). (Module tethers 92 connecting modules 98 to a wafer are said to each be at least a portion of a module tether 92). A method can comprise printing (e.g., micro-transfer printing) a module 98 to a destination substrate. (Module tethers 92 that are broken or separated as a result of printing are said to each be at least a portion of a module tether 92.)

Figure 27:
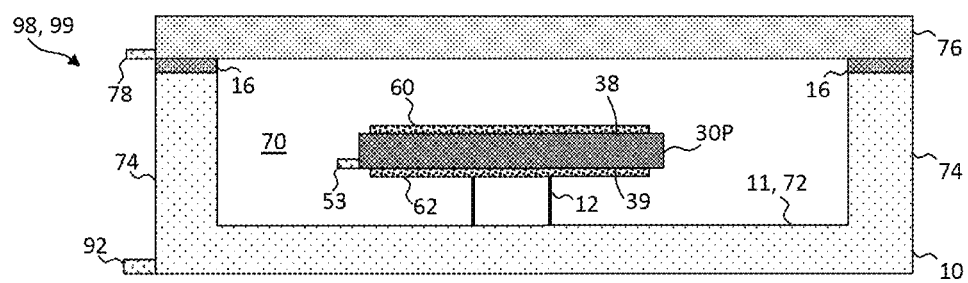
FIGS. 27-30 are cross sections of a component within a cavity according to illustrative embodiments of the present disclosure.
Figure 28:
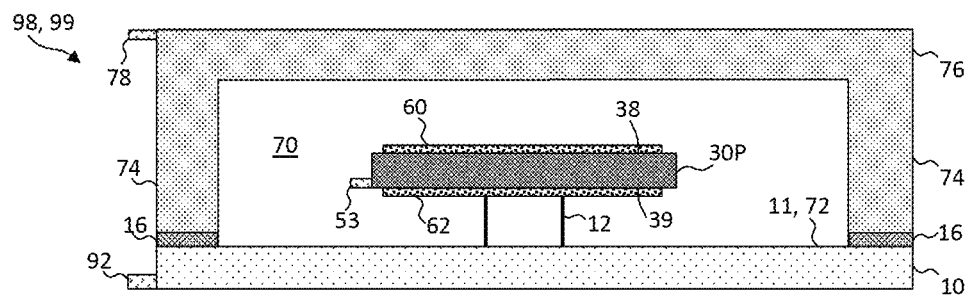

According to some embodiments and referring to FIGS. 27 and 28, a module structure 98 comprises a patterned substrate 10 having a substrate surface 11 and a substrate post 12 protruding from the substrate surface 11 or a layer provided on substrate surface 11. A component 30 is disposed on the substrate post 12. Component 30 has a component top side 38 and a component bottom side 39 opposite component top side 38. Component bottom side 39 is adhered to substrate post 12 and component 30 extends over at least one edge of substrate post 12. Component 30 can be adhered or attached to patterned substrate 10 or substrate post 12 only on component bottom side 39.

Referring still to FIGS. 27 and 28, one or more component electrodes 61 are disposed on component 30 (e.g., as shown in FIG. 22B). The one or more component electrodes 61 can comprise a component top electrode 60 disposed on component top side 38, a component bottom electrode 62 disposed on component bottom side 39, or both. Component top electrodes 60 and component bottom electrodes 62 are generically referred to as component electrodes 61.

In some embodiments, module structure 98 comprises a cavity 70 formed or disposed in or on substrate surface 11 of patterned substrate 10. Cavity 70 can have a cavity floor 72 (for example, congruent with substrate surface 11 in cavity 70) and cavity walls 74. Substrate post 12 can be disposed on cavity floor 72. In some embodiments, module structure 98 comprises a cap 76 disposed over cavity 70 to substantially or completely surround or enclose cavity 70. In some embodiments, cap 76 can have a small opening through cap 76 so that cavity 70 is not completely sealed. In some embodiments, cavity walls 74 are formed on substrate surface 11 of patterned substrate 10 and cap 76 is adhered to cavity walls 74, for example with a patterned layer of adhesive 16 (e.g., as shown in FIG. 27). In some embodiments, cavity walls 74 are formed on cap 76 and adhered to substrate surface 11 of patterned substrate 10, for example with a patterned layer of adhesive 16 (e.g., as shown in FIG. 28).

Figure 29:
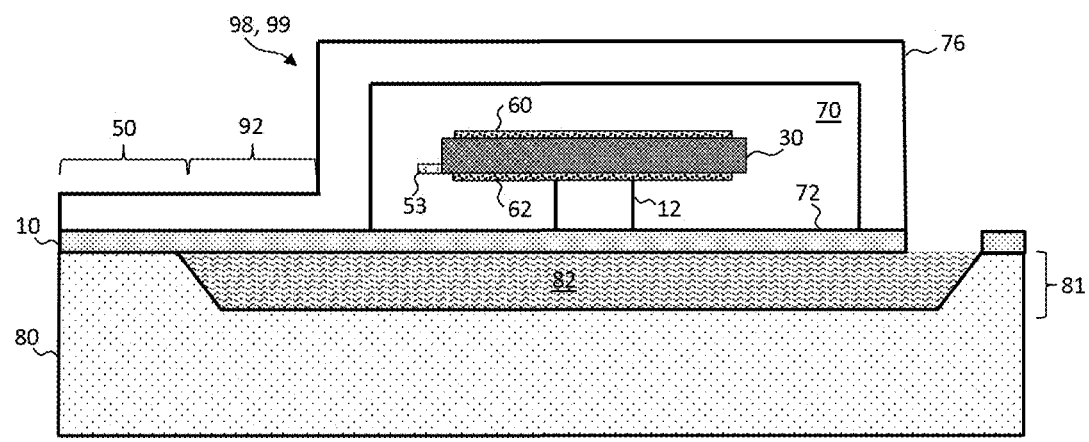
Figure 30:
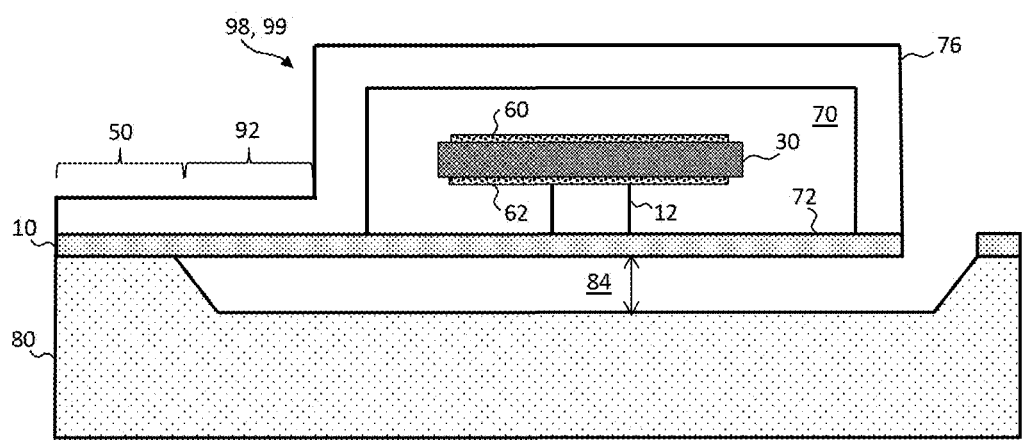

In some embodiments, component 30 is micro-transfer printed from a component source wafer 40 and includes a separated or broken (e.g., fractured) component tether 53. In some such embodiments, component 30 can be adhered to substrate post 12, for example with a patterned layer of adhesive 16 (e.g., as shown in FIGS. 17A, 17B where adhesive 16 is patterned to be disposed only on substrate posts 12). In some embodiments, component 30 is not micro-transfer printed and can be, for example, constructed in place using photolithographic techniques. Similarly, in some embodiments, cap 76 is micro-transfer printed from a cap source wafer and includes a separated or broken (e.g., fractured) cap tether 78. In some embodiments, cap 76 is not micro-transfer printed and can be, for example, laminated over cavity 70. According to some embodiments, a printed structure 99 includes a module 98 that can be or is printed or placed on a destination substrate, such as a printed circuit board (PCB) for example. In some embodiments, a module 98 can be constructed on, for example, a semiconductor wafer with sacrificial portions 82 and anchors 50 and module tethers 92 connecting modules to anchors 50 (as shown in FIGS. 29 and 30, discussed below). A method can comprise micro-transfer printing such a module structure 98 module to a destination substrate. In some embodiments, module structure 98 is not micro-transfer printable or micro-transfer printed and can be, for example, constructed in place using photolithographic techniques.

According to some embodiments, two or more substrate posts 12 are disposed within cavity 70 or two or more components 30 are disposed within cavity 70, or both. In some embodiments, a substrate post 12 within cavity 70 can have two or components 30 disposed on each substrate post 12, for example as discussed above with respect to FIG. 26. According to some embodiments, one or more component electrodes 61 of the two or more components 30 disposed within cavity 70 are electrically connected, for example a component top or bottom electrode 60, 62 of a first component 30 is electrically connected to a component top or bottom electrode 60, 62 of a second component 30, where first and second components 30 are both disposed within a common cavity 70 and can be, but are not necessarily, disposed on a common substrate post 12, e.g., to form a common circuit.

Module structure 98 can comprise component top and bottom electrodes 60, 62 on opposing component top and bottom sides 38, 39 of component 30, for example as shown in FIGS. 27 and 28 or in FIGS. 23A-23D. As described with respect to FIGS. 23A-23D, component top and bottom electrodes 60, 62 can be electrically connected to respective substrate post electrodes 64 and substrate electrodes 66 to receive or provide an electrical power or ground or control or information signals. Substrate electrodes 66 can extend beyond cavity 70 and can be controlled by devices external to cavity 70, for example be extending along substrate surface 11.

In some embodiments, patterned substrate 10 is a semiconductor substrate and comprises an electronic substrate circuit 90 (FIGS. 17A-17B, 22A-22D). Electronic substrate circuit 90 can be electrically connected through substrate electrodes 66, substrate post electrodes 64, and component top and bottom electrodes 60, 62 to control, provide signals to, or respond to component 30. Substrate circuit 90 can extend beyond cavity 70 and can interface with devices external to cavity 70, for example be extending along substrate surface 11.

In some embodiments, component 30 comprises a component material different from the substrate post material. In some embodiments, the component material can be the same as or substantially similar to the substrate post material. A substrate post material can be a dielectric, can comprise conductors (e.g., substrate post electrodes 64), or can be a conductor (e.g., a metal). A component material can be or include one or more of a semiconductor, a compound semiconductor, a III-V semiconductor, a II-VI semiconductor, or a ceramic (e.g., a synthetic ceramic). For example, a component material can be or include one or more of GaN, AlGaN, AlN, gallium orthophosphate ($GaPO_4$), Langasite ($La_3Ga_5SiO_{14}$), lead titanate, barium titanate ($BaTiO_3$), lead zirconate titanate ($Pb[Zr_xTi_{1-x}]O_3$ $0 \leq x \leq 1$), potassium niobate ($KNbO_3$), lithium niobate ($LiNbO_3$), lithium tantalate ($LiTaO_3$), sodium tungstate ($Na_2WO_3$), $Ba_2NaNb_5O_5$, $Pb_2KNb_5O_{15}$, zinc oxide (ZnO), Sodium potassium niobate ($(K,Na)NbO_3$) (NKN), bismuth ferrite ($BiFeO_3$), Sodium niobate ($NaNbO_3$), bismuth titanate ($Bi_4Ti_3O_{12}$), sodium bismuth titanate ($Na_{0.5}Bi_{0.5}TiO_3$), wurtzite, and polyvinylidene fluoride. A component material can be or include a piezo-electric material that exhibits a piezo-electric effect. In some embodiments, component 30 can be processed or formed using photolithographic methods. Photolithographic methods and materials are also useful to form component top and bottom electrodes 60, 62 (component electrodes 61) and any component circuit 34.

Referring to FIGS. 29 and 30, some embodiments can comprise a module source wafer 80 comprising a sacrificial layer 81 having one or more sacrificial portions 82 separated by anchors 50. The sacrificial layer 81 can be patterned. One or more sacrificial portions 82 are differentially etchable from module source wafer 80 and patterned substrate 10 is disposed at least partially on one of the one or more sacrificial portions 82. Substrate 10 can extend beyond sacrificial portion 82 to form a portion of anchor 50 and can also form at least a part of module tether 92 (and in some embodiments with a micro-transfer printable component 30, a component substrate can similarly form a part of a component tether 52). In some embodiments, a material of sacrificial portion 82 is a material different from module source wafer 80 or is an anisotropically etchable material. Sacrificial layer 81 can comprise a same anisotropically etchable material as module source wafer 80. As shown in FIG. 30, once sacrificial portion 82 is etched, a gap 84 (indicated by a double-ended arrow) is defined. Once module structure 98 is removed from module source wafer 80 (for example with transfer device 20 such as a viscoelastic stamp), module tether 92 is broken (e.g., fractured) or separated (e.g., is at least a portion of a module tether 92).

Figure 31:
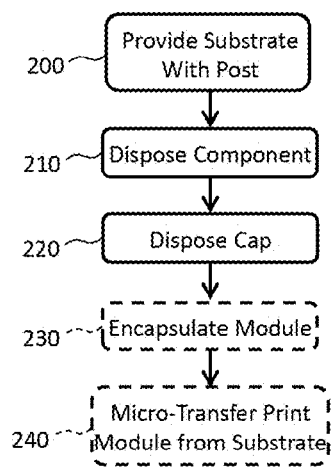

According to some embodiments and referring to FIG. 31, a method of making a module structure 98 comprises providing a patterned substrate 10 having a substrate surface 11 and a substrate post 12 protruding from substrate surface 11 or a layer disposed on substrate surface 11 in step 200. In step 210, a component 30 is disposed on substrate post 12, component 30 having a component top side 38 and a component bottom side 39 opposite component top side 38. Component bottom side 39 is disposed on substrate post 12 and component 30 extends over at least one edge of substrate post 12, forming a module structure 98. One or more component electrodes 61 are disposed on component 30. In step 220, a cap 76 is disposed over component 30 and patterned substrate 10 to enclose component 30 in a cavity 70. In optional step 230, module structure 98 is encapsulated and in an optional step 240, module structure 98 is micro-transfer printed.

In some embodiments, providing component electrodes 61 can comprise providing a component top electrode 60 disposed on component top side 38, providing a component bottom electrode 62 disposed on component bottom side 39, or both.

In some embodiments, a substrate is patterned to form a patterned substrate 10 and substrate post 12, for example a glass or polymer substrate patterned using photolithographic methods and materials.

Figure 32:
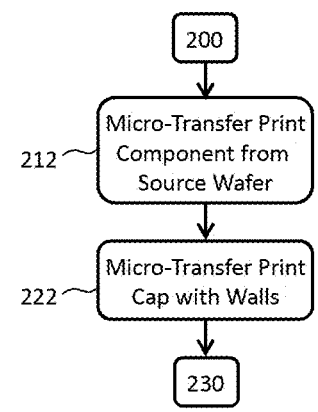

In some embodiments and referring to FIG. 32, component 30 is provided in step 210 by micro-transfer printing component 30 from component source wafer 40 to substrate post 12 (step 212). In some embodiments, a cavity 70 is provided in or on a substrate (e.g., patterned substrate 10), cavity 70 having a cavity floor 72 and cavity walls 74. In some embodiments, cavity 70 is provided by micro-transfer printing a cap 76 comprising cavity walls 74 from a cap source wafer to substrate surface 11 or a layer on substrate surface 11 of patterned substrate 10 as shown in FIG. 28) in step 222.

Figure 34:
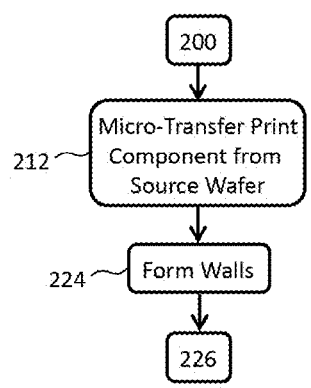

In some embodiments and referring to FIG. 33A, cavity 70 is provided by forming cavity walls 74 on substrate surface 11 or a layer on substrate surface 11 of patterned substrate 10 in step 202 as part of forming patterned substrate 10, for example using photolithographic materials and processes (e.g., as shown in FIG. 27). Component 30 can then be provided in step 212, for example by micro-transfer printing component 30 from component source wafer 40 to substrate post 12 and cap 76 by micro-transfer printing or laminating cap 76 to cavity walls 74 in step 225. In some embodiments, referring to FIG. 33B, a component 30 with patterned substrate 10 and substrate post 12 is micro-transfer printed to a substrate post 12 to form a module 98. Side walls that serve as cavity walls 74 can be provided either with cap 76 or with patterned substrate 10. In either case, module 98 can be micro-transfer printed to a cap 76 in step 226. As illustrated in FIG. 33C, a sacrificial portion 82 on which a module 98 is disposed can be etched so that module 98 can be picked up by a pick-up stamp 20 in step 227, transferred to a print stamp 20 in step 228, and printed to a cap 76 in step 229. A similar process can be used to micro-transfer print a cap 76. Referring to FIG. 34, in some embodiments, cavity walls 74 are formed in step 224 after component 30 is provided in step 212 by micro-transfer printing component 30 from component source wafer 40 to substrate post 12, for example using photolithographic techniques.

Figure 35:
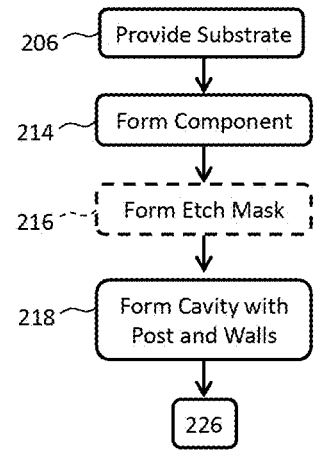

As described with respect to FIGS. 31-34, in some embodiments, component 30 can be provided by micro-transfer printing. In some embodiments, component 30 is constructed or formed on or over a substrate 10 or layer disposed on substrate 10. Referring to FIG. 35, a substrate 10 can be provided in step 206, a component 30 formed over, on, or in substrate 10 in step 214, and an optional etch-mask layer provided and patterned in step 216. In step 218, substrate 10 is etched to form patterned substrate 10 with cavity walls 74 and substrate post 12, providing module structure 98.

Figure 36A:
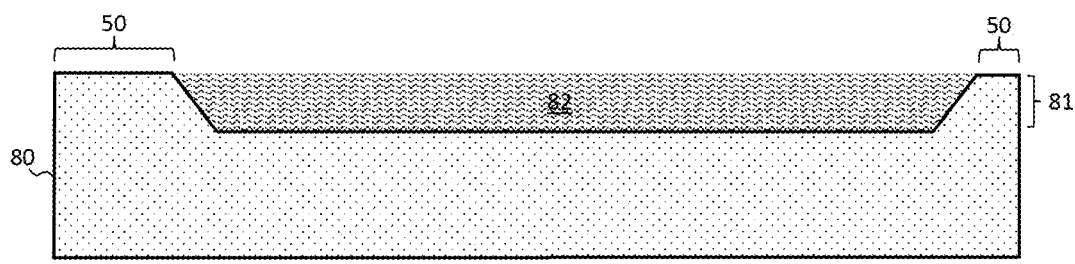
FIGS. 36A-36L are successive cross sections of structures formed during a method according to illustrative embodiments of the present disclosure.
Figure 36B:
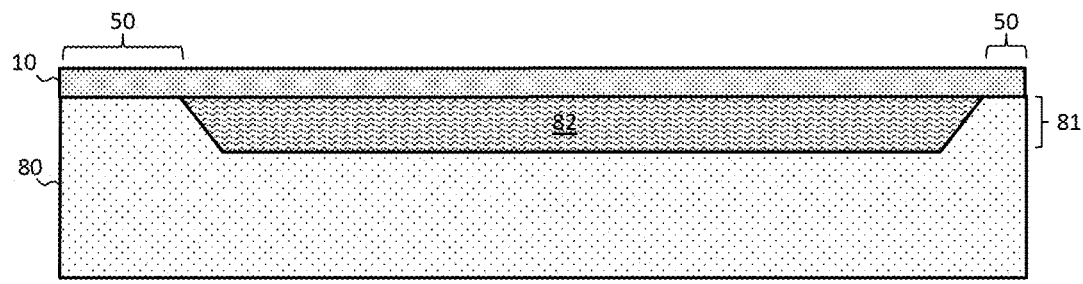

Methods according to certain embodiments are described in more detail in FIGS. 36A-36L. Referring to FIG. 36A, a substrate, for example a module source wafer 80, is provided with a sacrificial layer 81 defining sacrificial portions 82 laterally separated by anchors 50. A substrate 10 is disposed over sacrificial portions 82 and optionally over anchors 50. Substrate 10 is differentially etchable from sacrificial portions 82. The portions of substrate 10 between sacrificial portions 82 can be considered a part of anchors 50 (as shown in FIG. 36B). Substrate 10 can comprise any of a wide variety of materials suitable as a lithographic substrate, for example including one or more of glass, polymer, and a semiconductor.

Figure 36C:
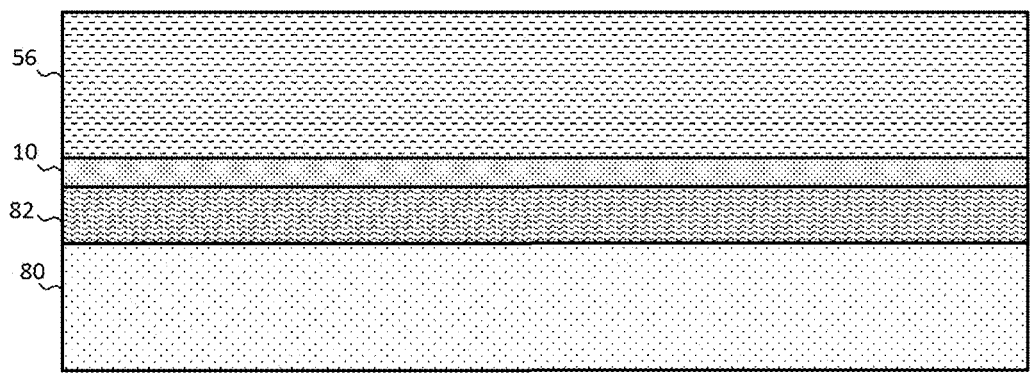
Figure 36D:
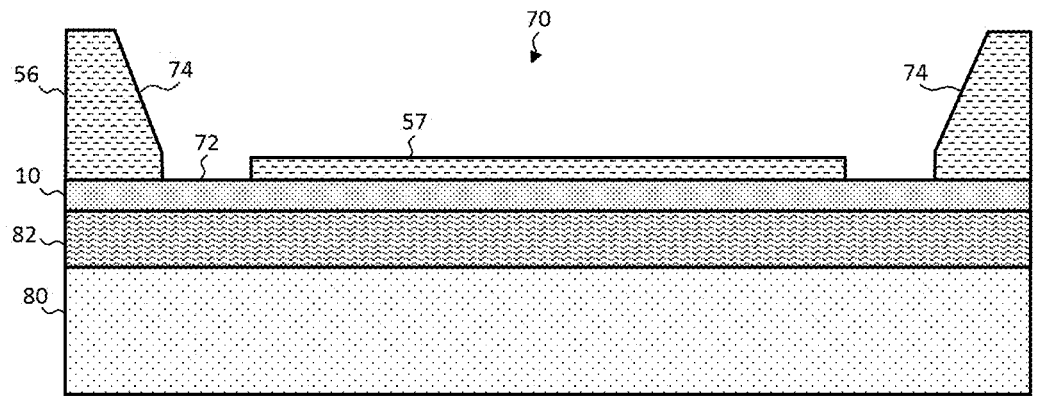

For clarity, FIGS. 36C-36J are details of an individual sacrificial portion 82 (with anchors 50 not shown for simplicity). Referring to FIG. 36C, cavity layer 56 is disposed over substrate 10 and patterned (as shown in FIG. 36D), for example by etching, to form a cavity 70 with cavity walls 74 and a cavity floor 72 with a post layer 57 of material (from cavity layer 56) on patterned substrate 10. Cavity layer 56 can be or comprise, for example, a resin, oxide, or nitride, for example that can be patterned using photolithographic methods. Optional electrodes can be deposited and patterned, and an optional seed layer can be provided on post layer 57 in cavity 70.

Figure 36E:
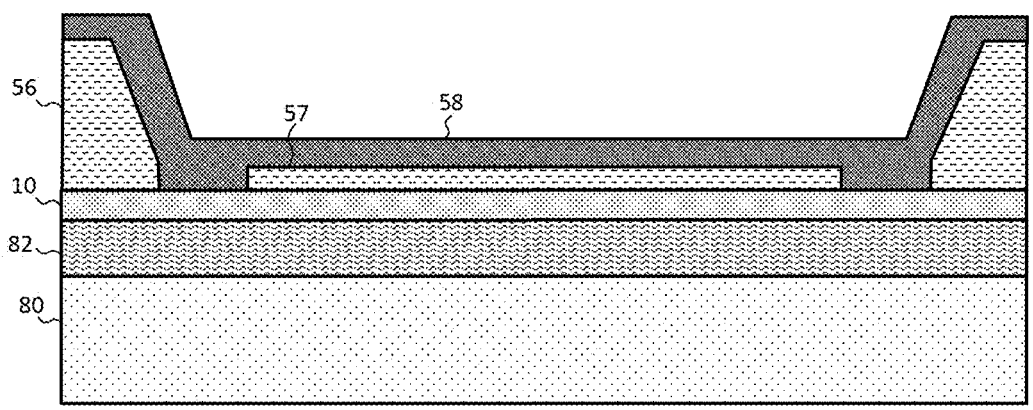
Figure 36F:
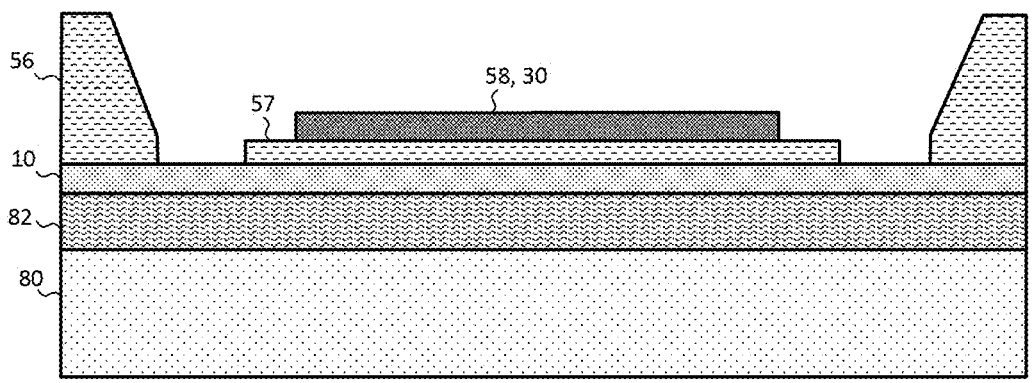
Figure 36G:
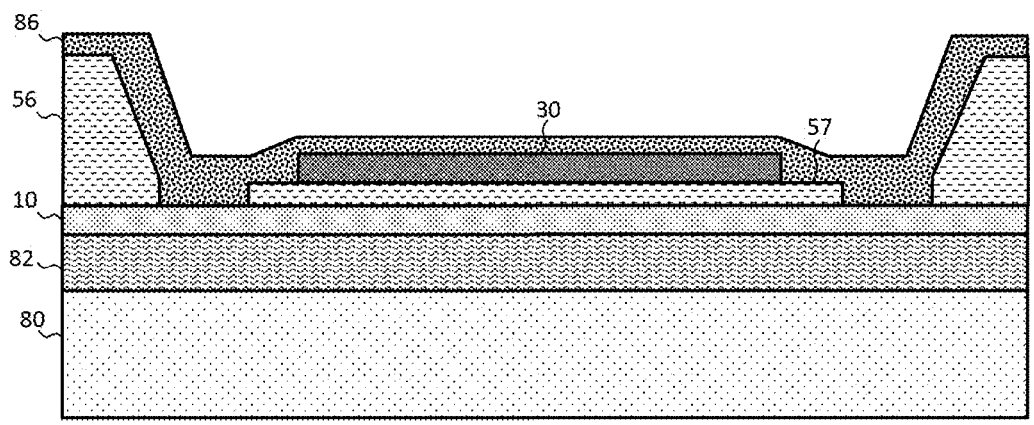
Figure 36H:
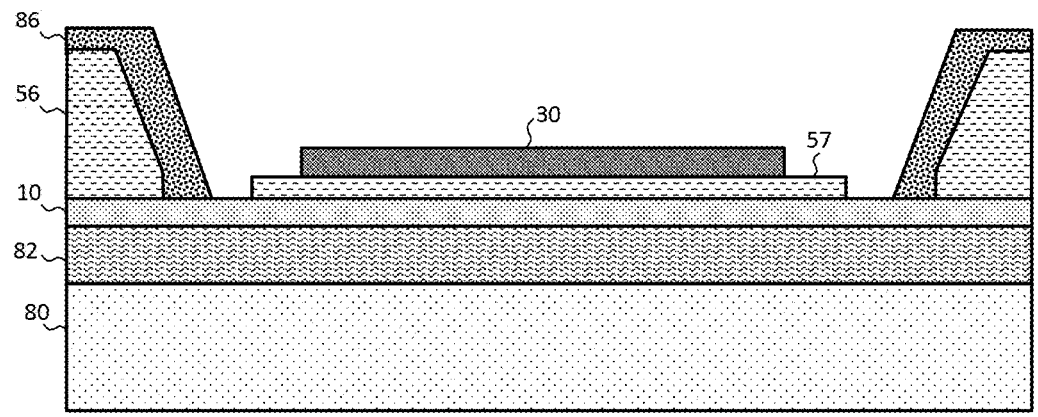
Figure 36I:
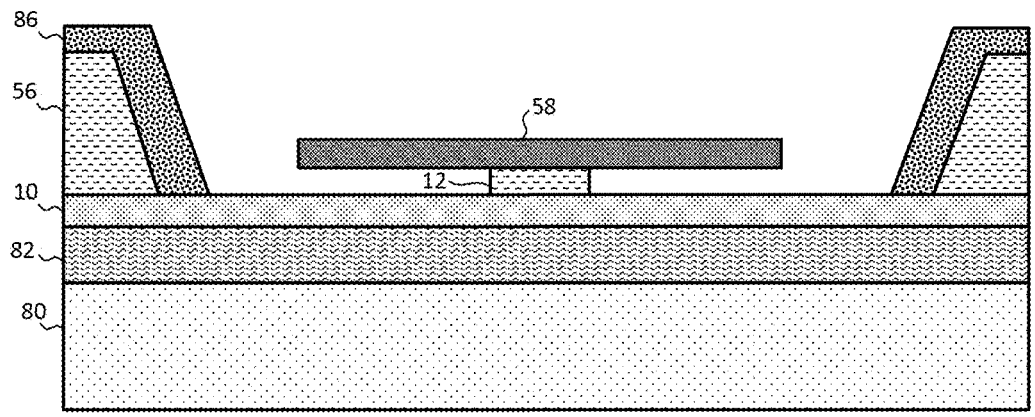
Figure 36J:
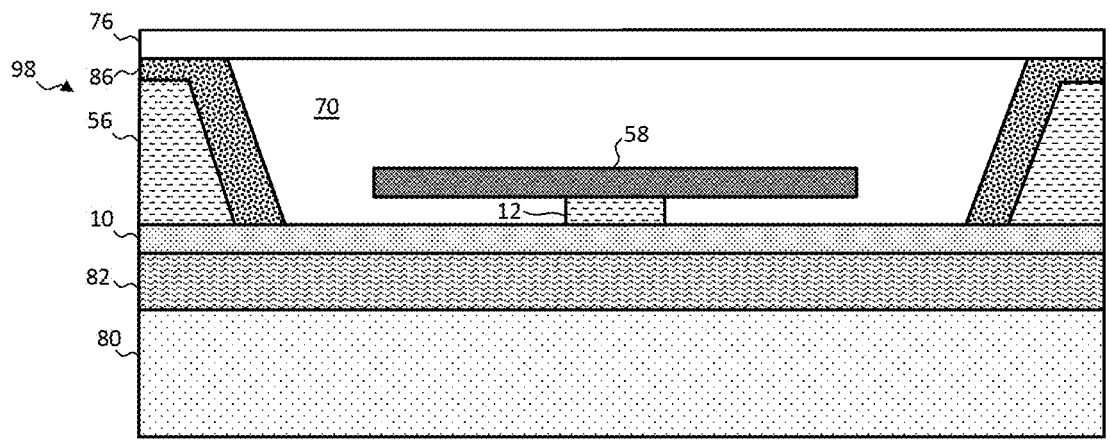

Referring next to FIG. 36E, a component layer 58 of material (e.g., a layer of semiconductor or piezo-electric material) is blanket deposited and patterned (as shown in FIG. 36F) and can be further processed to form component 30. An etch-stop layer 86, for example a dielectric, is deposited (as shown in FIG. 36G) and patterned (as shown in FIG. 36H), exposing patterned substrate 10 and only a portion of post layer 57, using photolithographic methods. The exposed portion of post layer 57 is then etched to form substrate post 12 on cavity floor 72 between component 30 and substrate surface 11 of patterned substrate 10 (as shown in FIG. 36I). At any point after component material is deposited, component electrodes 61 (shown in FIG. 22B) can be formed on component 30. As shown in FIG. 36J, a cap 76 can then be disposed over (e.g., laminated or micro-transfer printed to) cavity walls 74 to encapsulate module 98.

Figure 36K:
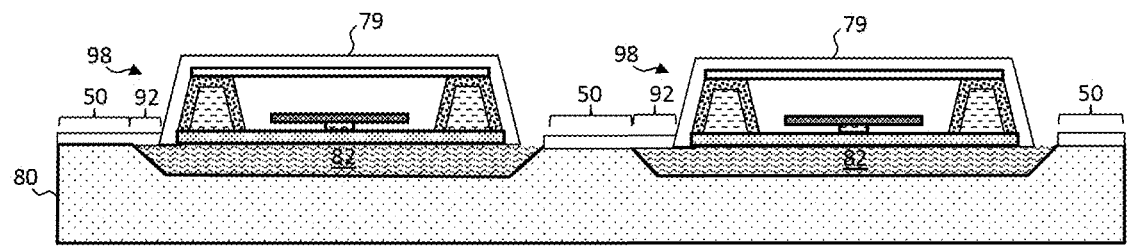
Figure 36L:
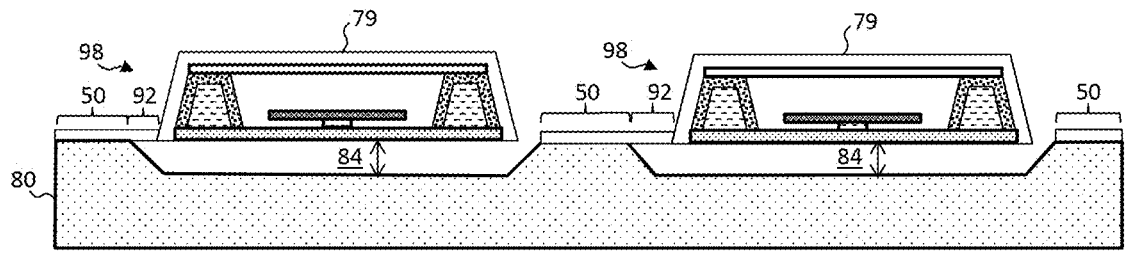

FIGS. 36K and 36L are less detailed than FIGS. 35A-35J and show two modules 98 on a module source wafer 80. Each module 98 is disposed entirely over a sacrificial portion 82 and the modules 98 are attached to anchors 50 by module tethers 92 (as shown in FIG. 36K) (e.g., module tethers 92 are each at least a portion of a module tether 92). As shown in FIG. 36L, sacrificial portions 82 are etched to form gaps 84 (indicated by a double-ended arrow) over which each module 98 is suspended. Sacrificial portions 82 can be anisotropically etchable portions of module source wafer 80 or a layer of material that is differentially etchable from module source wafer 80 and patterned substrate 10. Modules 98 are attached to anchors 50 only with module tethers 92. An encapsulation layer 79 encapsulates the module 98 and forms module tethers 92. Encapsulation layer 79 can be, for example, an oxide or nitride such as silicon dioxide or silicon nitride. Encapsulation layer 79 can be, for example, a polymer. Thus, referring still to FIG. 36L, modules 98 are ready to be micro-transfer printed by a micro-transfer printing stamp 20.

Figure 37A:
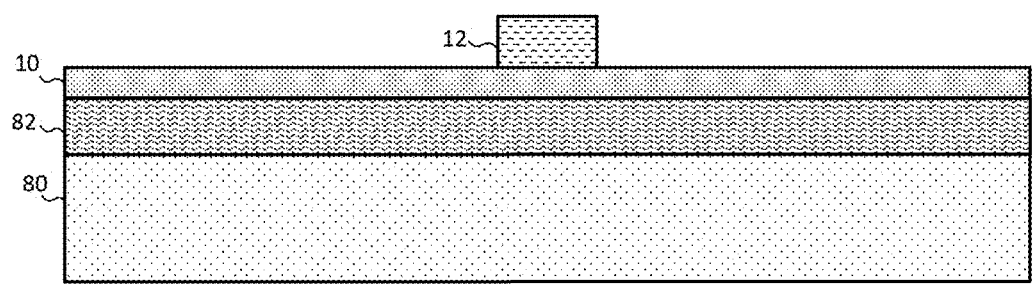
FIGS. 37A-37C are successive cross sections of structures formed during a method according to illustrative embodiments of the present disclosure.
Figure 37B:
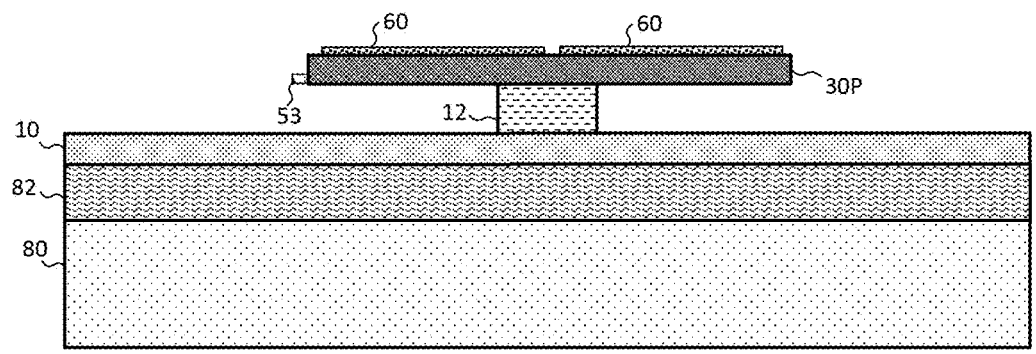
Figure 37C:
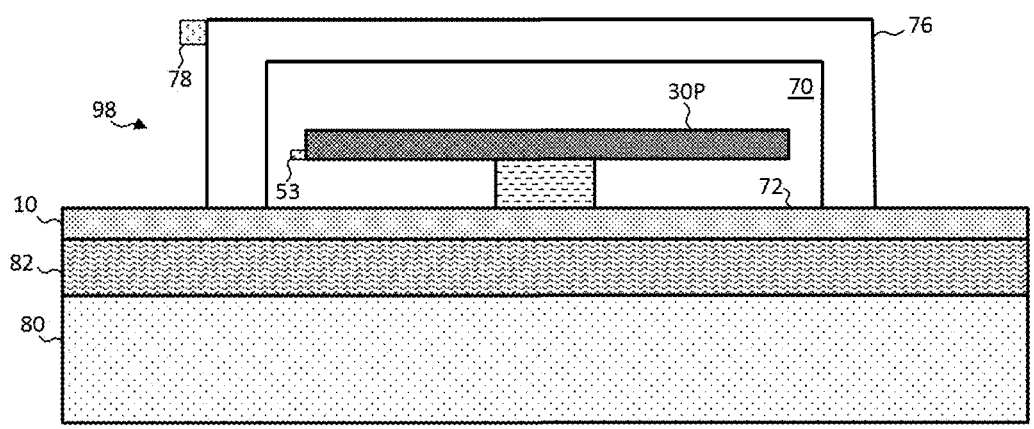
Figure 38:
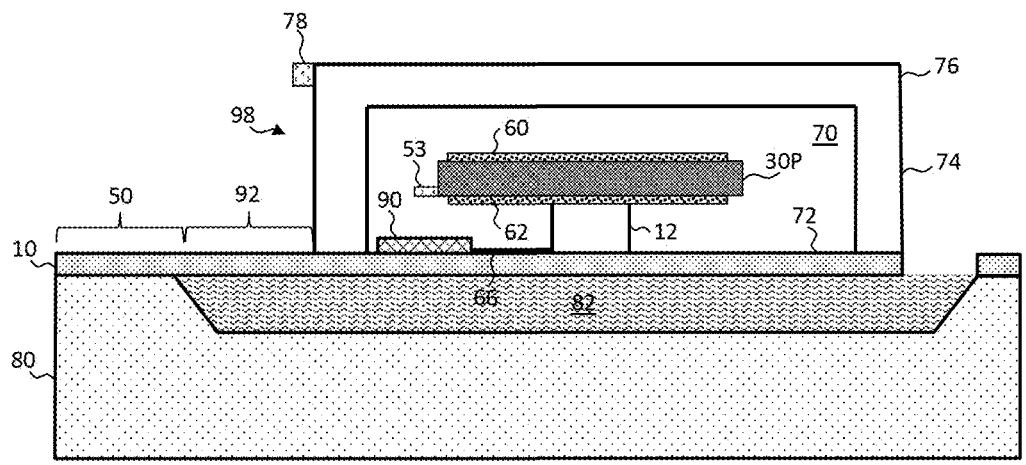
FIG. 38 is a cross section of a micro-transfer printable module according to illustrative embodiments of the present disclosure.
Figure 39A:
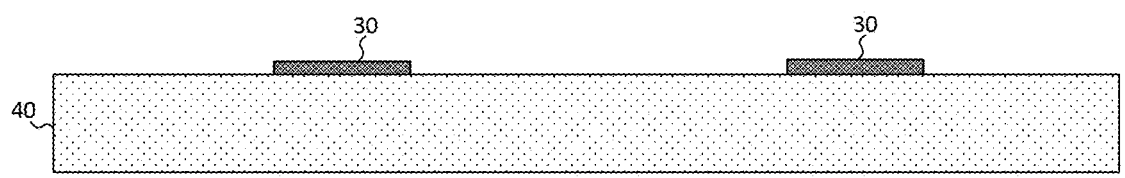
FIGS. 39A-39H are successive cross sections of structures formed during a method according to illustrative embodiments of the present disclosure.
Figure 39B:
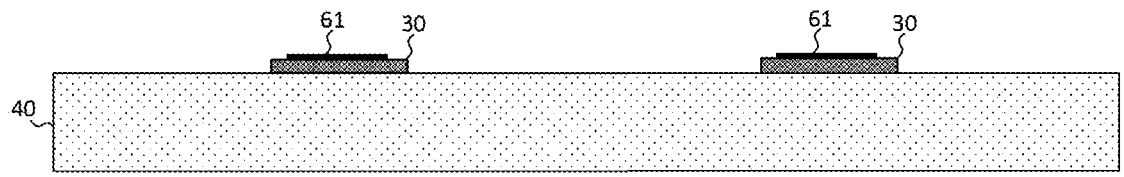
Figure 39C:
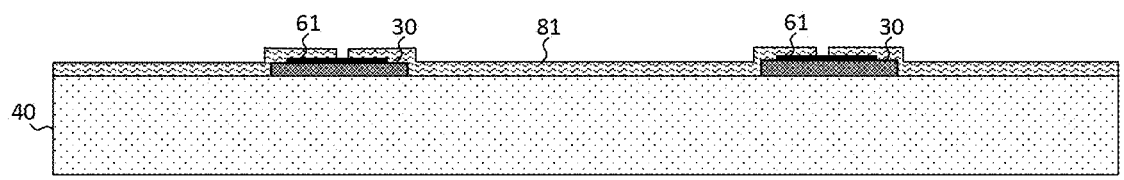
Figure 39D:
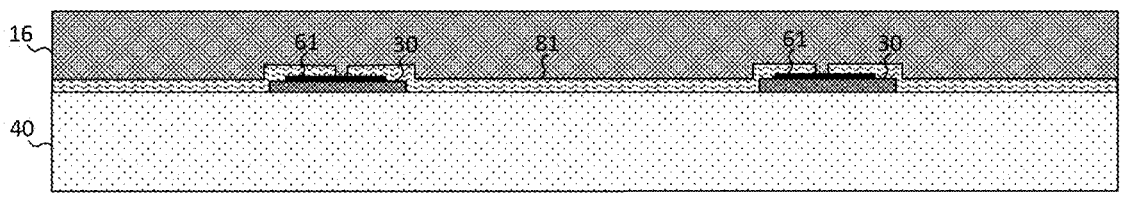
Figure 39E:
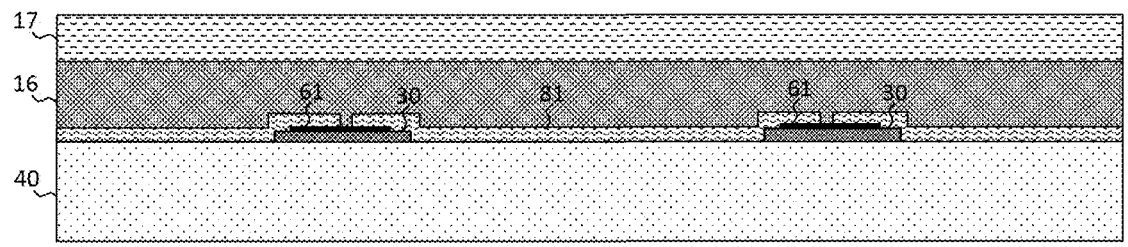
Figure 39F:
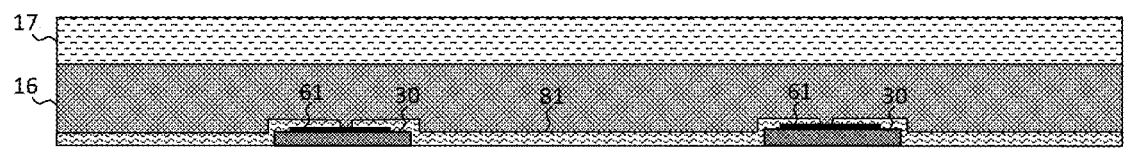
Figure 39G:
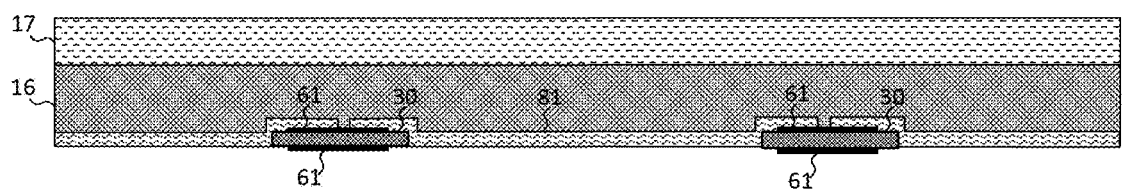
Figure 39H:
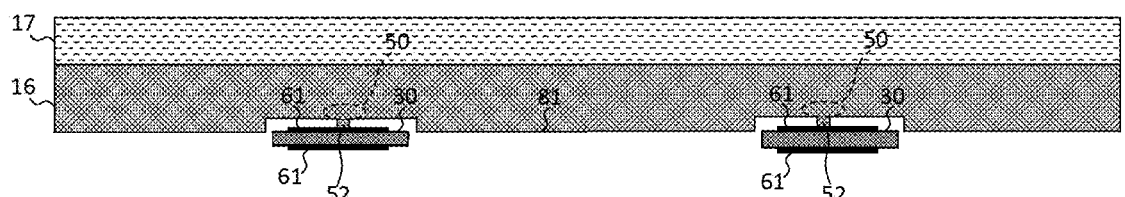

According to some embodiments and with reference to FIGS. 37A-37C, methods of constructing modules 98 can comprise providing a module source substrate 80 with a patterned sacrificial portion 82 on which a patterned substrate 10 is provided and a substrate post 12 disposed (shown in FIG. 37A). Referring to FIG. 37B, a component 30 with (or without) component electrodes 61 (e.g., component top electrodes 60) and a separated or broken (e.g., fractured) component tether 53 is micro-transfer printed onto substrate post 12. Additional processing can be provided to electrically connect component electrodes 61 (e.g., component top electrodes 60 or component bottom electrodes 62, or both) to substrate electrodes 66 (not shown in FIG. 37B, see FIGS. 22A, 22B for example). As shown in FIG. 37C, a cap 76 is provided over component 30 to provide cavity 70, for example by micro-transfer printing cap 76 with separated or broken (e.g., fractured) cap tether 78 to patterned substrate 10. FIG. 38 is a less detailed cross section of module structure 98 in FIG. 37C provided on a module source wafer 80 with sacrificial portions 82 laterally separated by anchors 50 connected to modules 98 with module tethers 92. FIG. 38 also illustrates a substrate circuit 90 formed on or in substrate 10 and electrically connected to component 30 through substrate electrodes 66. Fractured cap tether 78 can be present, for example if cap 76 is micro-transfer printed to substrate 10 (as shown in FIG. 38) or is not present, for example, if cap 76 is formed on substrate 10. Once sacrificial portions 82 are etched, module 98 can be micro-transfer printed, for example with a viscoelastic stamp 20.

In some embodiments, referring to FIGS. 39A-39H, components 30 can be provided on a component source wafer 40 (shown in FIG. 39A), optional structures such as component electrodes 61 (shown in FIG. 39B) or substrate posts 12 (not shown) formed on components 30, a patterned sacrificial layer 81 disposed over components 30 (shown in FIG. 39C), a layer of adhesive 16 provided on sacrificial layer 81 (shown in FIG. 39D) to adhere a carrier substrate 17 to sacrificial layer 81 (shown in FIG. 39E), component source substrate 40 removed to expose component 30 and at least a portion of sacrificial layer 81 (shown in FIG. 39F), for example by laser lift-off or grinding. Optional structures such as component electrodes 61 (shown in FIG. 39G) can be formed on components 30 and at least a portion of sacrificial layer 81 removed (shown in FIG. 39H) to prepare component 30 for micro-transfer printing. Component electrodes 61 can be component top electrodes 60 or component bottom electrodes 62 or both. In some embodiments, sacrificial layer 81 is etched to form a component tether 52 attaching component 30 to an anchor 50 of the layer of adhesive 16, and component 30 micro-transfer printed. Component 30 can comprise a semiconductor or piezo-electric material. The process described in FIGS. 39A-39H enables the construction of structures on both sides of component 30, for example any one or more of component electrodes 61, dielectric structures, substrate posts 12, component circuits 34, and optical structures.

Figure 41:
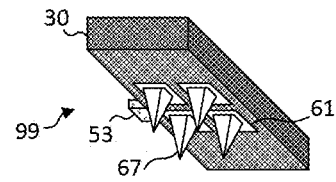
FIG. 41 is a perspective of a component comprising four connection posts located near a center of the component according to illustrative embodiments of the present disclosure.
Figure 42:
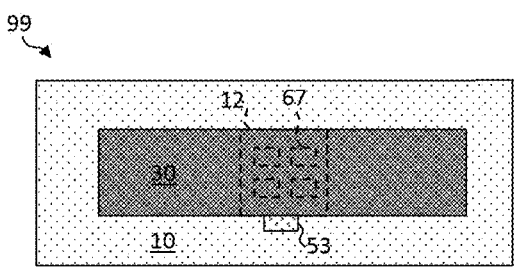
FIG. 42 is a top plan view of a micro-transfer printed component corresponding to FIG. 41 comprising four connection posts located near a center of the component according to illustrative embodiments of the present disclosure.
Figure 43:
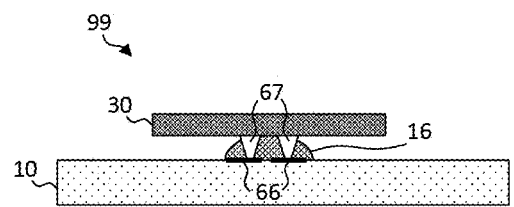
FIG. 43 is a cross section of a component in accordance with the component shown in FIG. 40 or FIG. 41 comprising two or four connection posts located near a center of the component according to illustrative embodiments of the present disclosure.
Figure 44:
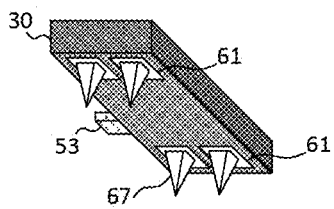
FIG. 44 is a perspective of a micro-transfer printable component having two connection posts located near each end of the component in a length-wise direction according to illustrative embodiments of the present disclosure.
Figure 45:
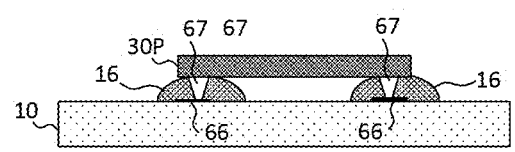
FIG. 45 is a cross section of a component corresponding to FIG. 44 having connection posts embedded in or penetrating substrate electrodes on a patterned substrate according to illustrative embodiments of the present disclosure.
Figure 46A:
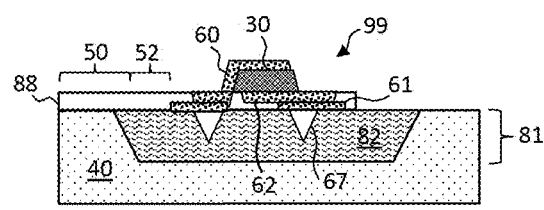
FIGS. 46A-46B are cross sections of micro-transfer printable components with connection posts on a component source wafer according to illustrative embodiments of the present disclosure.
Figure 46B:
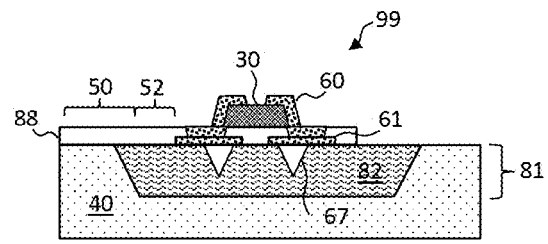
Figure 47:
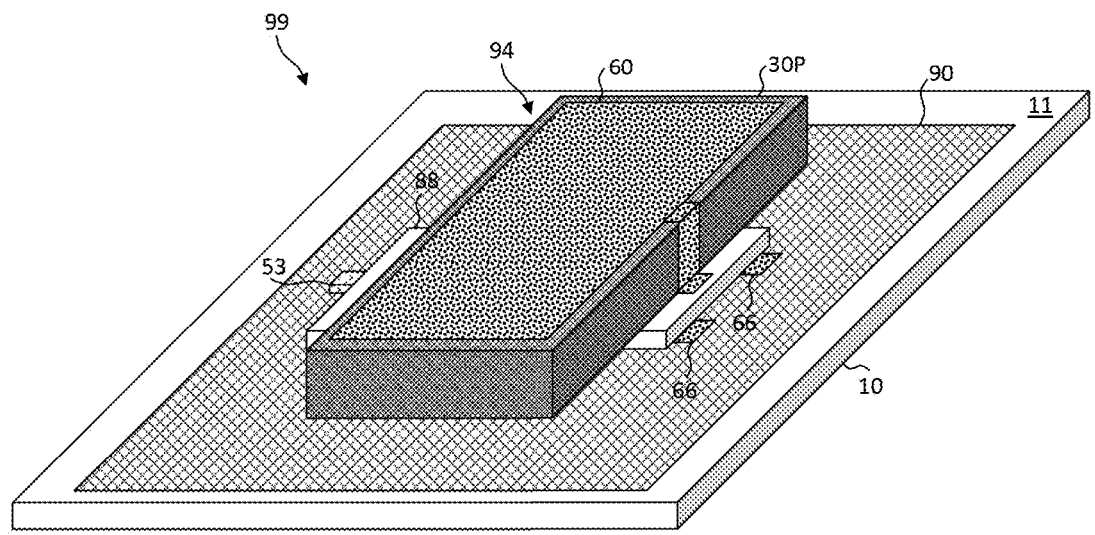
FIG. 47 is a perspective of a micro-transfer printed component in accordance with the component shown in FIG. 40 or FIG. 46A having patterned component top electrodes electrically connected to a substrate circuit on a patterned substrate according to illustrative embodiments of the present disclosure.
Figure 48:
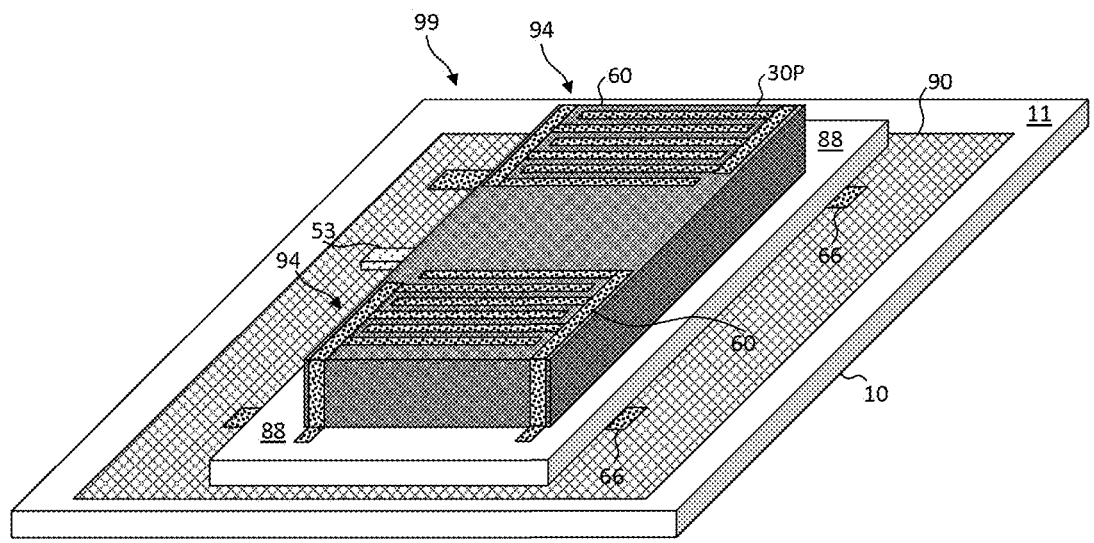
FIG. 48 is a perspective of a micro-transfer printed component in accordance with the component shown in FIG. 44 or 46B having a patterned component top electrode electrically connected to a substrate circuit on a patterned substrate according to illustrative embodiments of the present disclosure.

Referring to FIGS. 40-48, in some embodiments, a printed structure 99 comprises an acoustic wave transducer 94 comprising component 30 and component electrodes 61 disposed on component 30, and connection posts 67 attached (e.g., directly or indirectly) to and extending away from component 30 or layers on component 30. Connection posts 67 can extend away from component bottom side 39 (shown in FIG. 18B) and can be in direct contact with component 30 or one or more layers in contact with component 30. Each component electrode 61 (e.g., either a component top or a component bottom electrode 60, 62, for example as shown in FIG. 22B) is electrically connected to a connection post 67. A connection post 67 is an electrically conductive structure that extends away and protrudes from component 30 or a layer in contact with component 30. A connection post 67 can have a base on a proximal end of connection post 67 that has a larger area than a distal end of connection post 67 so that connection post 67 can have a sharp or pointed distal end or structure able to extend into or penetrate an electrical substrate electrode 66 on a substrate 10 when component 30 is micro-transfer printed to the substrate, for example patterned substrate 10, for example as shown in FIGS. 43 and 45. In some embodiments, patterned substrate 10 is patterned with substrate electrodes 66 disposed on substrate surface 11 of patterned substrate 10, component 30 is disposed on substrate surface 11, and each connection post 67 is in electrical contact with a substrate electrode 66. Substrate electrodes 66 can comprise a layer of solder to facilitate electrical connection between each substrate electrode 66 and connection post 67. Patterned substrate 10 can be a semiconductor substrate and can comprise electronic substrate circuit 90, as shown in FIGS. 47 and 48. Thus, substrate circuit 90 can be electrically connected to component 30 through component electrodes 61, connection posts 67, and substrate electrodes 66 and, in some embodiments, can operate, control, send signals to, or receive signals from component 30. Each bottom component electrode 62 can be electrically connected to one or more connection posts 67.

Figure 40:
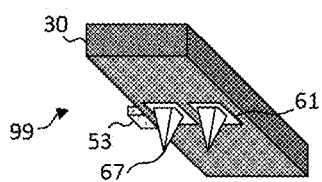
FIG. 40 is a perspective of a component comprising two connection posts located near a center of the component according to illustrative embodiments of the present disclosure.

Referring to the perspectives of FIGS. 40 and 41, component 30 connected to separated or broken (e.g., fractured) component tether 53 has two or more connection posts 67 (shown in FIG. 40) or four or more connection posts 67 (shown in FIG. 41) extending from a component electrode 61 (e.g., a component bottom electrode 62) with a sharp point. In some embodiments (not shown), component 30 can have 3 connection posts 67. Referring to FIG. 42, a plan view illustrates component 30 with four connection posts 67 on a single substrate post 12. Single substrate post 12 is disposed under component 30 and component 30 extends over two edges of single substrate post 12. Referring to the cross section of FIG. 43, component 30 is micro-transfer printed so that connection posts 67 extend into or penetrate (e.g., pierce) electrical substrate electrodes 66 to make an electrical contact between component 30 and substrate electrodes 66. Component 30 can be adhered to patterned substrate 10 with a patterned layer of adhesive 16 that forms a substrate post 12.

As shown in FIGS. 40-43, connection posts 67 are disposed near component center 32 of component 30 (shown in FIGS. 19A-19C), for example no further from component center 32 than one quarter (e.g., one quarter, one fifth, one eighth, one tenth, or one twentieth) of the length of component 30, where component 30 has a length greater than a width over patterned substrate 10, so that the distance between each connection post 67 and component center 32 is no more than one quarter of the length (e.g., no more than one quarter of the length, no more than one fifth of the length, no more than one eighth of the length, no more than one tenth of the length, no more than one twentieth of the length). In some embodiments, each of a plurality of connection posts 67 (e.g., every connection post 67) is closer to component center 32 than an edge of component 30. By disposing connection posts 67 closer to component center 32 of component 30, for example, if component 30 is or comprises a piezo-electric material, the ends of component 30 can vibrate in a direction orthogonal to substrate surface 11 of patterned substrate 10, for example providing bulk acoustic wave resonant modes in component 30 and for example as shown in FIGS. 23A-23C. In other resonant modes, the component 30 vibrates longitudinally, for example becomes longer and shorter in a lengthwise direction. In some embodiments, both vibrational modes are present in component 30 when it is in operation.

As shown in FIGS. 44-45, connection posts 67 are disposed near a length-wise end of component 30, for example farther from component center 32 than one quarter of the length of component 30, where component 30 has a length greater than a width over patterned substrate 10, so that the distance between connection posts 67 and component center 32 is greater than one quarter the length. By disposing connection posts 67 farther from the center of component 30, for example, the center of component 30 can vibrate in a direction parallel to substrate surface 11 of patterned substrate 10 (a longitudinal direction), providing surface acoustic wave resonant modes in component 30.

Referring to FIGS. 43 and 45, component 30 can be adhered to patterned substrate 10 with a layer of patterned and cured adhesive 16 (e.g., forming one or more substrate posts 12). Only a portion of component 30 is adhered to patterned substrate 10 so that, if component 30 is part of an acoustic wave transducer (e.g., used in an acoustic wave filter or sensor), component 30 is free to mechanically vibrate in desired resonant modes and directions. In particular, ends of component 30 are free to oscillate vertically, horizontally, or both, enabling additional and stronger resonant modes. In some embodiments, components 30 are smaller in any one or more of length, width, and thickness than other prior-art devices and therefore can have fewer and stronger resonant modes.

In some embodiments, a layer of adhesive 16 can be deposited and patterned by inkjet printing. In some embodiments, a layer of adhesive 16 is deposited, component 30 is micro-transfer printed onto the layer of adhesive 16, the layer of adhesive 16 is pattern-wise cured, for example at the locations of the connection posts 67, and the remaining adhesive 16 removed, for example by stripping, washing, or etching the uncured adhesive 16, or by etching a support layer and undercutting component 30 as shown in FIGS. 36H and 36I.

Referring to FIGS. 46A and 46B, a micro-transfer printable component 30 with connection posts 67 can be constructed by providing a component source wafer 40 with a sacrificial layer 81 comprising sacrificial portions 82 laterally separated by anchors 50. Sacrificial portions 82 are differentially etchable from anchor 50 or can be an anisotropically etchable material. Depressions (e.g., pits, holes, or pyramidal structures) are etched into sacrificial portions 82, one for each connection post 67. The shape of the etched depression and corresponding connection posts 67 can have planar faces separated by sharp, linear edges and can be a pyramidal shape, for example if sacrificial portion 82 comprises a crystalline structure and is anisotropically etchable (for example comprising a crystalline silicon material). The edges of the forms (and connection posts 67) can be planar, for example if connection post forms are made by etching crystalline materials. A metal layer is deposited over sacrificial portions 82 (for example by evaporation or sputtering) and the depressions and patterned to form a separate electrical conductor for each connection post 67 that extends into sacrificial portion 82, for example using photolithographic methods and materials. A substrate 88, e.g., a dielectric substrate, is deposited and patterned over the electrical conductors, for example by coating, evaporation, or sputtering and photolithographic patterning) so that substrate 88 is disposed between at least portions of component 30 and at least portions of connection posts 67. The dielectric substrate 88 can also form a component tether 52 (or portion thereof) and extend onto or form a part of anchor 50. A component tether 52 can also be constructed using an encapsulation layer or a structure or layer of component 30 for example.

Referring still to FIGS. 46A and 46B, component 30 is formed over dielectric substrate 88, optionally with the use of a seed layer, and is disposed entirely over sacrificial portion 82. A via is formed through dielectric substrate 88 and component electrodes 61 patterned to electrically connect component 30 to connection posts 67 through dielectric substrate 88, with component top electrodes 60 (as shown in FIG. 46A) or component bottom electrodes 62 (as shown in FIG. 46B), or both. Component electrodes 61 can be evaporated and patterned metal traces or wires. Dielectric substrate 88 can be patterned and sacrificial portions 82 etched to suspend component 30 over a sacrificial gap 84 (e.g., as shown in FIG. 30) so that component 30 can be micro-transfer printed, fracturing component tether 52 to form fractured component tether 53, for example micro-transfer printing component 30 onto a patterned layer of adhesive 16 or a drop of adhesive 16 on patterned substrate 10. Adhesive 16 can be disposed in contact with connection posts 67 and optionally in contact with only a portion of component bottom side 39 or dielectric substrate 88, for example limited to the region of connection posts 67, avoiding areas of component bottom side 39 or dielectric substrate 88 distant from connection posts 67. In some embodiments, by micro-transfer printing component 30 with connection posts 67 directly to electrodes 66 on patterned substrate 10, subsequent photolithographic processing can be avoided, improving manufacturing efficiency. Only portions of components 30 are adhered to patterned substrate 10 so that non-adhered component 30 portions can move freely, enabling improved component mechanical resonance. Components 30 with connection posts 67 have been constructed and successfully micro-transfer printed, electrically connected, and operated.

FIG. 47 illustrates an acoustic wave transducer 94 comprising component top electrode 60, component bottom electrode 62 (obscured in FIG. 47), and component 30, where component top electrode 60 and component bottom electrode 61 can form resonant acoustic waves in component 30. Component top electrode 60 extends onto dielectric substrate 88 and is electrically connected to a connection post 67 (obscured in FIG. 47 but as shown in FIG. 46A). FIG. 48 illustrates two acoustic wave transducers 94 comprising component top electrodes 60 and component 30, where electrodes 60 can form surface acoustic waves in component 30. Component top electrodes 60 extend onto dielectric substrate 88 and are electrically connected to connection posts 67 (obscured in FIG. 48 but as shown in FIG. 46B). (Component 30 is a portion of both acoustic wave transducers 94 shown in FIG. 48.) In either case, dielectric substrate 88 can be in contact with substantially all of component bottom side 39 (e.g., as shown in FIG. 17B) or dielectric substrate 88 can be present only in the local region of connection posts 67 (as shown in FIGS. 47, 48, for example under component 30 for less than or equal to one half, one third, one quarter, one fifth, or one eighth of the component 30 length, or is closer to the component center 32 than to an end of component 30) so that component 30 can vibrate more readily and with fewer mechanical constraints. Dielectric substrate 88 can be shaped or structured by photolithographic processes such as etching, for example by undercutting component 30 (shown in FIG. 36I). In some embodiments, both or either bulk or surface acoustic wave resonant modes are present in a component 30 and substrate post 12 configuration. In some embodiments, both or either bulk or surface acoustic wave resonant modes are present in a component 30 and dielectric substrate 88 configuration. Thus, component 30 can be a portion of a surface acoustic wave transducer 94 (e.g., along with one or more component electrodes 61) or a portion of a bulk acoustic wave transducer 94 (e.g., along with one or more component electrodes 61). In some embodiments, a printed or printable structure 99 includes a bulk or surface acoustic wave filter or a bulk or surface acoustic wave sensor that includes an acoustic wave transducer 94 (and optionally a second acoustic wave transducer 94).

In some embodiments, and as shown in FIG. 48, a component 30 can be disposed on two or more substrate posts 12 and can extend over an edge of each substrate post 12.

Figure 49A:
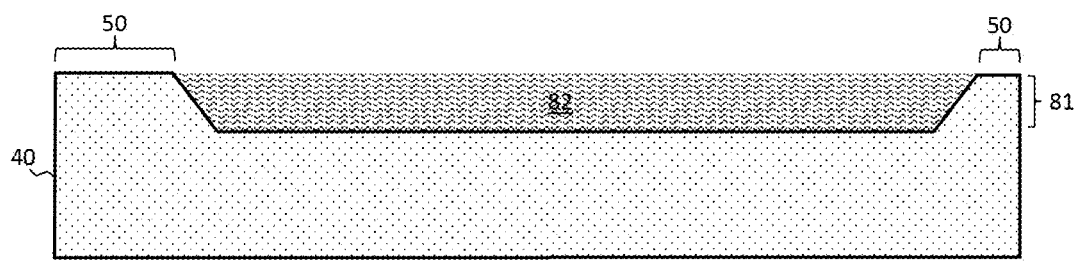
FIGS. 49A-49F are successive cross sections of structures formed during a method of making micro-transfer printable components according to illustrative embodiments of the present disclosure.
Figure 49B:
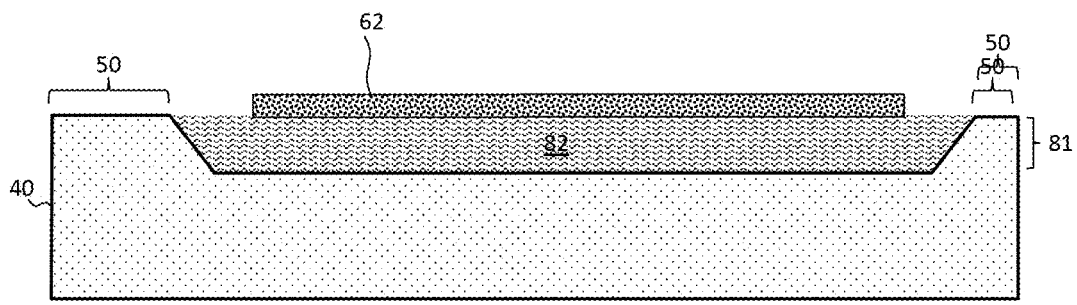
Figure 49C:
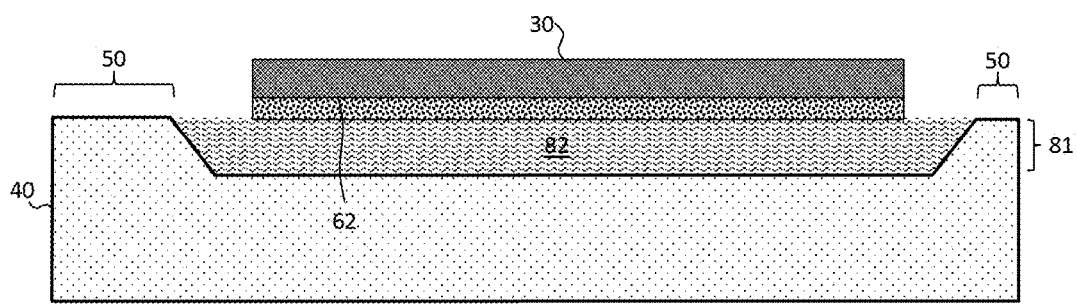
Figure 49D:
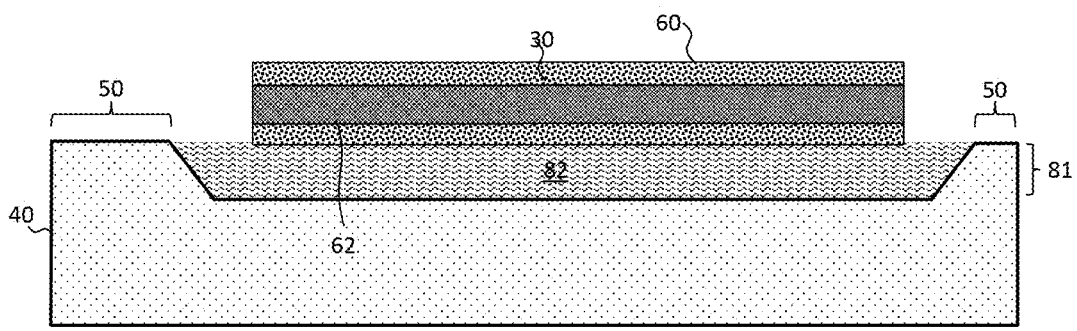
Figure 49E:
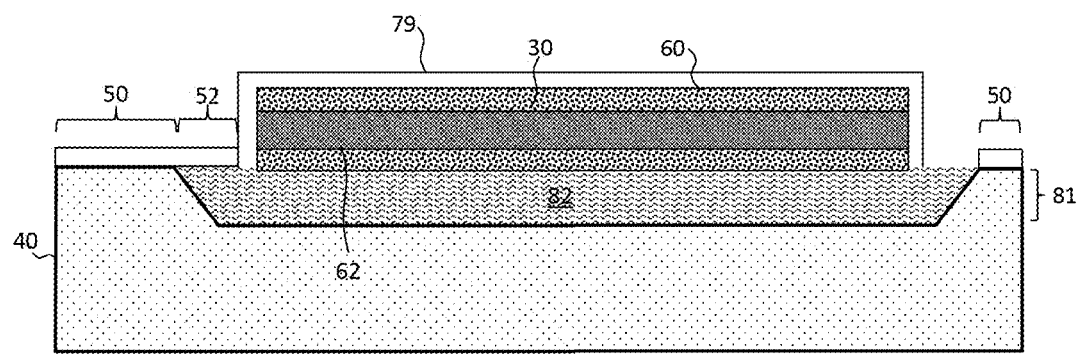
Figure 49F:
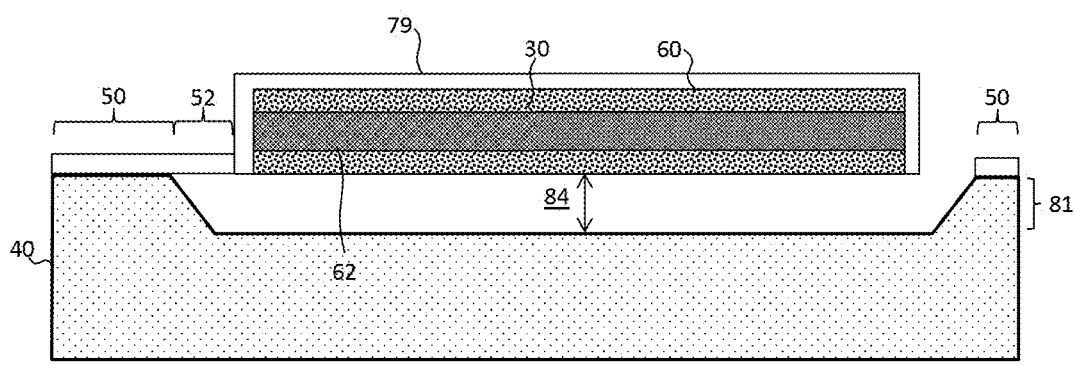

Referring to FIGS. 49A-49F, according to some embodiments, micro-transfer printable components 30 with top and bottom component electrodes 60, 62 can be constructed on a component source wafer 40 by providing component source wafer 40 with a sacrificial layer 81 comprising sacrificial portions 82 adjacent to one or more anchors 50 (shown in FIG. 49A), disposing and patterning component bottom electrode 62 at least partially on or, in some embodiments, completely on sacrificial layer 82 (shown in FIG. 49B), disposing and patterning component 30 on or over component bottom electrode 62 (shown in FIG. 49C), disposing and patterning component top electrode 60 on or over component 30 (shown in FIG. 49D), and disposing and patterning encapsulation layer 79 on or over component top electrode 60 to encapsulate component 30 and form component tethers 52 (shown in FIG. 49E). Sacrificial portion 82 can be etched to form gap 84 and release component 30 from component source substrate 40 so that component 30 (with top and bottom component electrodes 60, 62 and encapsulation layer 79) can be micro-transfer printed (shown in FIG. 49F).

Examples of micro-transfer printing processes suitable for disposing components 30 onto patterned substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety. Examples of micro-transfer printed acoustic wave filter devices are described in U.S. patent application Ser. No. 15/047,250, entitled Micro-Transfer Printed Acoustic Wave Filter Device, the disclosure of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro Assembly Strategies and Devices, which is hereby also incorporated by reference in its entirety. In some embodiments, any one or more of component 30, module 98, printed structure 99 (e.g., including an acoustic wave transducer 94) is a compound micro-assembled structure (e.g., a compound micro-assembled macro-system).

According to various embodiments, component source wafer 40 can be provided with components 30, patterned sacrificial portions 82, component tethers 52, and anchors 50 already formed, or they can be constructed as part of a method in accordance with certain embodiments. Component source wafer 40 and components 30, micro-transfer printing device (e.g., a stamp 20), and patterned substrate 10 can be made separately and at different times or in different temporal orders or locations and provided in various process states.

The spatial distribution of any one or more of components 30, modules 98, and printed or printable structures 99 is a matter of design choice for the end product desired. In some embodiments, all components 30 in an array on a component source wafer 40 are transferred to a transfer device 20. In some embodiments, a subset of components 30 in an array on a component source wafer 40 is transferred. By varying the number and arrangement of stamp posts 22 on transfer stamps 20, the distribution of components 30 on stamp posts 22 of the transfer stamp 20 can be likewise varied, as can the distribution of components 30 on patterned substrate 10.

Because components 30, in certain embodiments, can be made using integrated circuit photolithographic techniques having a relatively high resolution and cost and patterned substrate 10, for example a printed circuit board, can be made using printed circuit board techniques having a relatively low resolution and cost, electrical conductors (e.g., substrate post electrodes 64) and substrate electrodes 66 on patterned substrate 10 can be much larger than electrical contacts or component electrodes 61 on component 30, thereby reducing manufacturing costs. For example, in certain embodiments, micro-transfer printable component 30 has at least one of a width, length, and height from 0.5 μm to 200 μm (e.g., 0.5 to 2 μm, 2 to 5 μm, 5 to 10 μm, 10 to 20 μm, 20 to 50 μm, or 50 to 100 μm, or 100 to 200 μm).

In certain embodiments, patterned substrate 10 is or comprises a member selected from the group consisting of polymer (e.g., plastic, polyimide, PEN, or PET), resin, metal (e.g., metal foil) glass, a semiconductor, and sapphire. In certain embodiments, a patterned substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Components 30, in certain embodiments, can be constructed using foundry fabrication processes used in the art. Layers of materials can be used, including materials such as metals, oxides, nitrides and other materials used in the integrated-circuit art. Each component 30 can be or include a complete semiconductor integrated circuit and can include, for example, any combination of one or more of a transistor, a diode, a light-emitting diode, and a sensor. Components 30 can have different sizes, for example, at least 100 square microns, at least 1,000 square microns, at least 10,000 square microns, at least 100,000 square microns, or at least 1 square mm. Alternatively or additionally, components 30 can be no more than 100 square microns, no more than 1,000 square microns, no more than 10,000 square microns, no more than 100,000 square microns, or no more than 1 square mm, for example. Components 30 can have variable aspect ratios, for example between 1:1 and 10:1 (e.g., 1:1, 2:1, 5:1, or 10:1). Components 30 can be rectangular or can have other shapes, such as polygonal or circular shapes for example.

Various embodiments of structures and methods were described herein. Structures and methods were variously described as transferring components 30, printing components 30, or micro-transferring components 30. Micro-transfer-printing involves using a transfer device (e.g., an elastomeric stamp 20, such as a PDMS stamp 20) to transfer a component 30 using controlled adhesion. For example, an exemplary transfer device can use kinetic or shear-assisted control of adhesion between a transfer device and a component 30. It is contemplated that, in certain embodiments, where a method is described as including micro-transfer-printing a component 30, other analogous embodiments exist using a different transfer method. As used herein, transferring a component 30 (e.g., from a component source substrate or wafer 40 to a destination patterned substrate 10) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a component 30.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact). In some embodiments, a component 30 has connection posts 67 extending therefrom and is disposed "on" a substrate 10 or a substrate post 12 with connection posts 67 disposed between substrate 10 or substrate post 12 and component 30.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

A cross section line
L length
W width
10 substrate/patterned substrate
11 substrate surface
12 substrate post
14 substrate post separation distance
16 adhesive 17 carrier substrate
18 substrate post area
19 substrate post top side
20 transfer device/stamp
22 stamp post
24 stamp component separation distance
26 stamp post area
30 component
30P substrate post component
30S stamp component
32 component center
34 component circuit
36 component area
38 component top side
39 component bottom side
40 component source wafer/substrate
44 dielectric layer
46 simple closed curve
50 anchor
52 component tether
53 broken component tether
56 cavity layer
57 post layer
58 component layer
60 component top electrode
61 component electrode
62 component bottom electrode
64 substrate post electrode
66 substrate electrode
67 connection post
68 solder
69 wire bond
70 cavity
72 cavity floor
74 cavity wall
76 cap
78 broken cap tether
79 encapsulation layer
80 module source wafer
81 sacrificial layer
82 sacrificial portion
84 sacrificial gap
86 etch-stop layer
88 dielectric substrate
90 substrate circuit
92 module tether
94 acoustic wave transducer
98 module structure/module
99 printed structure/printable structure
100 provide component source wafer step
110 provide stamp step
120 provide patterned substrate step
121 provide substrate step
130 move stamp to component source wafer step
140 pick up components from component source wafer with stamp step
150 move stamp to patterned substrate location step
151 move stamp to substrate location step
160 print components to patterned substrate with stamp step
161 print components to substrate with stamp step
170 done step
180 complete step
200 provide patterned substrate with substrate post step
202 provide patterned substrate with substrate post and walls step
206 provide substrate step
210 dispose component step
212 micro-transfer print component from component source wafer step
214 form component step
216 optional form etch mask step
218 form cavity with substrate post and walls step
220 dispose cap step
222 micro-transfer print cap with walls step
224 form walls step
225 micro-transfer print or laminate cap step
226 micro-transfer print module step
227 pick up module with pick-up stamp step
228 transfer module to print stamp step
229 print module with print stamp step
230 optional encapsulate module step
240 optional micro-transfer print module from module substrate step

What is claimed:

1. A printed structure, comprising:
a patterned substrate comprising a substrate surface and a substrate post protruding from the substrate surface, the substrate post comprising a substrate post material that is a dielectric adhesive; and
a printed component having a component top side and a component bottom side opposite the component top side that is non-native to the substrate post,
wherein the component bottom side is disposed on the substrate post and extends over at least one edge of the substrate post so that (i) the substrate post contacts only a portion of a bottom surface of the component, (ii) the component contacts only the substrate post, and (iii) a component center of the component is disposed directly over the substrate post.

2. The printed structure of claim 1, wherein the dielectric adhesive is a cured dielectric adhesive.

3. The printed structure of claim 1, wherein the dielectric adhesive is an uncured dielectric adhesive.

4. The printed structure of claim 1, wherein the dielectric adhesive comprises an organic material, a polymer, a resin, or an epoxy.

5. The printed structure of claim 1, wherein the patterned substrate comprises a plurality of substrate posts disposed as a dielectric adhesive layer defining a pattern of the patterned substrate.

6. The printed structure of claim 1, wherein the component comprises a broken or separated component tether.

7. The printed structure of claim 1, wherein the dielectric adhesive comprises photoresist.

8. The printed structure of claim 1, wherein the substrate post forms a ridge that extends in one direction beyond the component disposed on the substrate post in a direction parallel to the substrate surface, and wherein the component extends over two opposite sides of the substrate post.

9. The printed structure of claim 8, comprising two or more components disposed on the ridge.

10. The printed structure of claim 1, wherein, the substrate post is disposed directly between a center of the component and the substrate surface.

11. The printed structure of claim 1, wherein the component is adhered to the substrate post.

12. The printed structure of claim 1, comprising (i) a wire bonded to a component electrode disposed on the component, (ii) a wire bonded to a substrate post electrode on the substrate post, or (iii) both (i) and (ii).

13. The printed structure of claim 1, wherein the printed structure is a printable module comprising at least a portion of a module tether connected to the patterned substrate.

14. The printed structure of claim 1, wherein the component comprises a piezoelectric material.

15. The printed structure of claim 1, wherein
(i) the component extends over an edge of the substrate post in two dimensions;
(ii) the component extends over two or more sides of the post; or
(iii) the component extends over an edge of substrate post in one dimension or direction and does not extend over an edge of substrate post in a dimension or direction orthogonal to the one dimension or direction.

16. A printed structure, comprising:
a patterned substrate comprising a substrate surface and a substrate post protruding from the substrate surface, the substrate post comprising a substrate post material that is a dielectric adhesive; and
a printed component having a component top side and a component bottom side opposite the component top side and non-native to the substrate post,
wherein the component bottom side is disposed on the substrate post and extending over at least one edge of the substrate post so that the substrate post contacts only a portion of a bottom surface of the component and the component only contacts the substrate post,
wherein
(i) the component extends over an edge of the substrate post in two dimensions;
(ii) the component extends over two or more sides of the post; or
(iii) the component extends over an edge of substrate post in one dimension or direction and does not extend over an edge of substrate post in a dimension or direction orthogonal to the one dimension or direction.

* * * * *